US012648325B2

(12) United States Patent
Deng et al.

(10) Patent No.: US 12,648,325 B2
(45) Date of Patent: Jun. 2, 2026

(54) DISPLAY SUBSTRATE WITH SUB-PIXELS OF DIFFERENT SHAPES AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Jiangtao Deng, Beijing (CN); Yan Huang, Beijing (CN); Chi Yu, Beijing (CN); Biao Liu, Beijing (CN); Jianchang Cai, Beijing (CN); Xiaoqing Shu, Beijing (CN); Yi Zhang, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 150 days.

(21) Appl. No.: 18/260,684

(22) PCT Filed: Aug. 22, 2022

(86) PCT No.: PCT/CN2022/113886
§ 371 (c)(1),
(2) Date: Jul. 7, 2023

(87) PCT Pub. No.: WO2023/025087
PCT Pub. Date: Mar. 2, 2023

(65) Prior Publication Data
US 2024/0244912 A1 Jul. 18, 2024

(30) Foreign Application Priority Data

| | | |
|---|---|---|
| Aug. 23, 2021 | (CN) | 202110971715.1 |
| Jan. 29, 2022 | (WO) | PCT/CN2022/075001 |
| May 13, 2022 | (CN) | 202210531683.8 |

(51) Int. Cl.
| | |
|---|---|
| *H10K 59/35* | (2023.01) |
| *H10K 59/122* | (2023.01) |
| (Continued) | |

(52) U.S. Cl.
CPC ......... *H10K 59/353* (2023.02); *H10K 59/122* (2023.02); *H10K 59/131* (2023.02); *H10K 59/352* (2023.02); *H10K 59/65* (2023.02)

(58) Field of Classification Search
CPC .. H10K 59/353; H10K 59/122; H10K 59/131; H10K 59/352
See application file for complete search history.

(56) References Cited

U.S. PATENT DOCUMENTS

| | | | |
|---|---|---|---|
| 9,711,585 | B2 | 7/2017 | Kim et al. |
| 10,453,901 | B2 | 10/2019 | Kim et al. |
| | (Continued) | | |

FOREIGN PATENT DOCUMENTS

| | | |
|---|---|---|
| CN | 105938704 A | 9/2016 |
| CN | 108010946 A | 5/2018 |
| | (Continued) | |

OTHER PUBLICATIONS

Translation of Chinese Office Action from corresponding Chinese Application No. 202210531683.8, dated Apr. 30, 2025, 31 pages.
(Continued)

*Primary Examiner* — Tracie Y Green
(74) *Attorney, Agent, or Firm* — Westman, Champlin & Koehler, P.A.

(57) ABSTRACT

A display substrate and a display device. The display substrate includes: a first pixel structure including a first sub-pixel and a second sub-pixel; and a pixel defining layer including first openings and second openings, where the first
(Continued)

sub-pixel includes the first opening, and the second sub-pixel includes the second opening. In the first pixel structure, a pattern of an orthographic projection of the first opening of the at least one first sub-pixel on the base substrate has a maximum size in the first direction, a pattern of an orthographic projection of the second opening of the at least one second sub-pixel on the base substrate has a maximum size in the second direction, an angle is formed between the second direction and the first direction, and a ratio of the maximum size of the first opening to the maximum size of the second opening ranges from 0.2 to 2.

19 Claims, 28 Drawing Sheets

(51) Int. Cl.
     *H10K 59/131*      (2023.01)
     *H10K 59/65*       (2023.01)

(56)                    References Cited

U.S. PATENT DOCUMENTS

| | | | |
|---|---|---|---|
| 10,546,904 B2 | 1/2020 | Hou | |
| 10,686,018 B2 | 6/2020 | Kim et al. | |
| 11,335,748 B2 | 5/2022 | Zhang et al. | |
| 11,515,362 B2 | 11/2022 | Yang | |
| 11,587,999 B2 | 2/2023 | Bok et al. | |
| 11,723,242 B2 | 8/2023 | Park et al. | |
| 11,765,943 B2 | 9/2023 | Yang et al. | |
| 11,812,648 B2 | 11/2023 | Hu et al. | |
| 11,874,999 B2 * | 1/2024 | Peng | H10K 59/879 |
| 2014/0306198 A1 | 10/2014 | Im et al. | |
| 2016/0260792 A1 * | 9/2016 | Kim | H10K 59/35 |
| 2019/0033995 A1 | 1/2019 | Teramoto | |
| 2019/0074329 A1 | 3/2019 | Kim et al. | |
| 2019/0165059 A1 | 5/2019 | Hou | |
| 2019/0386078 A1 | 12/2019 | An et al. | |
| 2019/0393275 A1 | 12/2019 | Kim et al. | |
| 2020/0043990 A1 | 2/2020 | Huangfu et al. | |
| 2020/0211443 A1 * | 7/2020 | Zeng | G09G 3/3208 |
| 2020/0212269 A1 | 7/2020 | Akimoto | |
| 2020/0227488 A1 | 7/2020 | Xin et al. | |
| 2020/0394955 A1 | 12/2020 | Lee | |
| 2020/0403048 A1 | 12/2020 | Zhang et al. | |
| 2021/0020664 A1 | 1/2021 | Tan | |
| 2021/0050388 A1 | 2/2021 | Song | |
| 2021/0050389 A1 | 2/2021 | Yang | |
| 2021/0091145 A1 | 3/2021 | Huangfu et al. | |
| 2021/0183984 A1 | 6/2021 | Park et al. | |
| 2021/0184155 A1 | 6/2021 | Chae et al. | |
| 2021/0193769 A1 | 6/2021 | Bok et al. | |
| 2021/0202900 A1 | 7/2021 | Lee | |
| 2021/0265396 A1 | 8/2021 | Kim et al. | |
| 2021/0391396 A1 | 12/2021 | Yang et al. | |
| 2022/0028317 A1 | 1/2022 | Kim et al. | |
| 2022/0069031 A1 | 3/2022 | Yue et al. | |
| 2022/0157895 A1 | 5/2022 | Xu et al. | |
| 2022/0199028 A1 | 6/2022 | Wang et al. | |
| 2022/0199710 A1 | 6/2022 | Xu et al. | |
| 2022/0310710 A1 | 9/2022 | Hu et al. | |
| 2022/0310711 A1 | 9/2022 | Liu et al. | |
| 2022/0319421 A1 | 10/2022 | Qiu et al. | |
| 2022/0328573 A1 | 10/2022 | Hu et al. | |
| 2022/0366848 A1 | 11/2022 | Huang et al. | |
| 2023/0006005 A1 | 1/2023 | Wang et al. | |
| 2023/0053413 A1 | 2/2023 | Liu et al. | |
| 2023/0087603 A1 | 3/2023 | Wang et al. | |
| 2023/0276676 A1 | 8/2023 | Kim et al. | |
| 2023/0329065 A1 * | 10/2023 | Chen | H10K 59/123 |
| 2023/0413605 A1 | 12/2023 | Lou et al. | |
| 2024/0276824 A1 | 8/2024 | Yue et al. | |
| 2024/0349534 A1 | 10/2024 | Chen et al. | |
| 2025/0248218 A1 * | 7/2025 | Yang | H10K 59/1201 |
| 2025/0275388 A1 * | 8/2025 | Ding | H10K 59/00 |

FOREIGN PATENT DOCUMENTS

| | | | |
|---|---|---|---|
| CN | 108538884 A | 9/2018 | |
| CN | 109427855 A | 3/2019 | |
| CN | 109686778 A | 4/2019 | |
| CN | 110137206 A | 8/2019 | |
| CN | 110767699 A | 2/2020 | |
| CN | 111028692 A | 4/2020 | |
| CN | 111048005 A | 4/2020 | |
| CN | 111223908 A | 6/2020 | |
| CN | 111402743 A | 7/2020 | |
| CN | 211150599 U | 7/2020 | |
| CN | 111834425 A | 10/2020 | |
| CN | 111969027 A | 11/2020 | |
| CN | 112002748 A | 11/2020 | |
| CN | 112018147 A | 12/2020 | |
| CN | 112133732 A | 12/2020 | |
| CN | 112313802 A | 2/2021 | |
| CN | 112368840 A | 2/2021 | |
| CN | 112397547 A | 2/2021 | |
| CN | 112562518 A | 3/2021 | |
| CN | 112585761 A | 3/2021 | |
| CN | 112864215 A | 5/2021 | |
| CN | 112928147 A | 6/2021 | |
| CN | 112951878 A | 6/2021 | |
| CN | 112992969 A | 6/2021 | |
| CN | 113013201 A | 6/2021 | |
| CN | 113056828 A | 6/2021 | |
| CN | 113178163 A | 7/2021 | |
| CN | 113196494 A | 7/2021 | |
| CN | 113284928 A | 8/2021 | |
| CN | 113327972 A | 8/2021 | |
| CN | 113674689 A | 11/2021 | |
| CN | 217134376 U | 8/2022 | |
| CN | 217933802 U | 11/2022 | |
| WO | 2017140038 A1 | 8/2017 | |
| WO | 2020001087 A1 | 1/2020 | |
| WO | 2020133885 A1 | 7/2020 | |
| WO | 2021018310 A1 | 2/2021 | |

OTHER PUBLICATIONS

Notice of Allowance and Fees Due (PTOL-85) issued in corresponding U.S. Appl. No. 18/005,770, dated May 15, 2025, 21 pages.
Translation of Chinese Office Action from corresponding Chinese Application No. 202111168170.7, dated Jul. 16, 2025.
Copy and Translation of Indian Office Action for Indian Patent Application No. 202327055180, dated Nov. 12, 2025, 7 pages.
US Notice of Allowances for U.S. Appl. No. 18/263,184, dated Nov. 20, 2025 and Jan. 29, 2026, 36 pages.

* cited by examiner

P1

P1

P1

<u>P1</u>

P1

P1

P1

P1

P1

P1

P1

P1

P1

DISPLAY SUBSTRATE WITH SUB-PIXELS OF DIFFERENT SHAPES AND DISPLAY DEVICE

CROSS REFERENCE TO RELATED APPLICATION(S)

This application is a Section 371 National Stage Application of International Application No. PCT/CN2022/113886, filed on Aug. 22, 2022, entitled "DISPLAY SUBSTRATE AND DISPLAY DEVICE", which published as WIPO Publication No. 2023/025087 A1, on Mar. 2, 2023, which claims priority to Chinese Patent Application No. 202110971715.1, filed on Aug. 23, 2021, Chinese Patent Application No. 202210531683.8, filed on May 13, 2022, and International Application No. PCT/CN2022/075001, filed on Jan. 29, 2022, and the contents of which are incorporated herein by reference in their entireties.

TECHNICAL FIELD

The present disclosure relates to a field of a display technology, and in particular, to a display substrate and a display device.

BACKGROUND

With an increasing demand for a diversified use of a display device and an emergence of a design requirement for a high screen-to-body ratio of the display device, a solution of "under-screen camera" has emerged. In the solution of "under-screen camera", an imaging module such as a camera may be embedded in a display region to reduce a size of a bezel region of the display device, so that the screen-to-body ratio may be increased. At present, in the solution of "under-screen camera", how to ensure a light transmittance and a display effect of a portion of a display substrate corresponding to a position where the imaging module is provided on the basis of increasing the screen-to-body ratio of the display device has become an important subject of concern to R&D personnel.

The above information disclosed in this section is just for the understanding of the background of technical concepts of the present disclosure. Therefore, the above information may contain information that does not constitute a related art.

SUMMARY

In an aspect, a display substrate is provided, the display substrate includes a first display region, and the display substrate includes: a base substrate: a plurality of first pixel structures arranged on the base substrate in an array in a first arrangement direction and a second arrangement direction and located in the first display region, wherein at least one of the first pixel structures includes at least one first sub-pixel and at least one second sub-pixel; and a pixel defining layer on the base substrate, wherein the pixel defining layer includes a plurality of first openings and a plurality of second openings in the first display region, wherein the first sub-pixel includes the first opening, and the second sub-pixel includes the second opening, and wherein in the first pixel structure, a pattern of an orthographic projection of the first opening of the at least one first sub-pixel on the base substrate has a maximum size in the first direction, a pattern of an orthographic projection of the second opening of the at least one second sub-pixel on the base substrate has a maximum size in the second direction, an angle is formed between the second direction and the first direction, and a ratio of the maximum size of the first opening to the maximum size of the second opening ranges from 0.2 to 2.

According to some exemplary embodiments, the angle between the second direction and the first direction ranges from 0° to 160°.

According to some exemplary embodiments, the angle between the second direction and the first direction is less than 90°.

According to some exemplary embodiments, the pattern of the orthographic projection of the first opening on the base substrate is symmetrical with respect to a first axis of symmetry extending in the first direction, and the pattern of the orthographic projection of the first opening on the base substrate is asymmetrical with respect to a straight line extending in the second direction; and/or the pattern of the orthographic projection of the second opening on the base substrate is symmetrical with respect to a second axis of symmetry extending in the second direction, and the pattern of the orthographic projection of the second opening on the base substrate is asymmetrical with respect to a straight line extending in the first direction.

According to some exemplary embodiments, at least one of the first pixel structures further includes at least one third sub-pixel, the pixel defining layer includes a plurality of third openings in the first display region, and the third sub-pixel includes the third opening, and a pattern of an orthographic projection of the third opening on the base substrate has a first size in the first direction and a second size in the second direction, and a ratio of the second size of the third opening to the first size of the third opening ranges from 0.8 to 1.2.

According to some exemplary embodiments, at least one of the first pixel structures includes at least two second sub-pixels; and in the first pixel structure, an angle is formed between the directions in which the patterns of the orthographic projections of the second openings of the at least two second sub-pixels on the base substrate have the maximum size.

According to some exemplary embodiments, at least two of the pattern of the orthographic projection of the first opening on the base substrate, the pattern of the orthographic projection of the second opening on the base substrate, and the pattern of the orthographic projection of the third opening on the base substrate have different shapes from each other, and at least part of each of the pattern of the orthographic projection of the first opening on the base substrate, the pattern of the orthographic projection of the second opening on the base substrate and the pattern of the orthographic projection of the third opening on the base substrate includes a curved side.

According to some exemplary embodiments, the pattern of the orthographic projection of the third opening on the base substrate is symmetrical with respect to a third axis of symmetry extending in the first direction, and the pattern of the orthographic projection of the third opening on the base substrate is symmetrical with respect to a fourth axis of symmetry extending in the second direction.

According to some exemplary embodiments, a ratio of a pitch of the first openings in the first arrangement direction to a pitch of the second openings in the first arrangement direction ranges from 0.8 to 1.2; and/or a ratio of the pitch of the second openings in the first arrangement direction to a pitch of the third openings in the first arrangement direction ranges from 0.8 to 1.2; and/or a ratio of the pitch of the third openings in the first arrangement direction to the pitch of the first openings in the first arrangement direction ranges from 0.8 to 1.2.

According to some exemplary embodiments, at least one of the first pixel structures includes at least two first sub-pixels and at least two third sub-pixels, and in the first pixel structure, the patterns of the orthographic projections of the first openings of two first sub-pixels on the base substrate have a first center and a third center, respectively, the patterns of the orthographic projections of the third openings of two third sub-pixels on the base substrate have a second center and a fourth center, respectively, and the first center, the second center, the third center and the fourth center are connected in sequence to form a first quadrilateral, and at least two sides of the first quadrilateral have different lengths from each other.

According to some exemplary embodiments, in the first pixel structure, a line connecting centers of the patterns of the orthographic projections of the first openings of two first sub-pixels on the base substrate does not pass through a center of the pattern of the orthographical projection of the second opening of the second sub-pixel on the base substrate.

According to some exemplary embodiments, in the first pixel structure, a line connecting centers of the patterns of the orthographic projections of the third openings of two third sub-pixels on the base substrate passes through a center of the pattern of the orthographic projection of the second opening of the second sub-pixel on the base substrate.

According to some exemplary embodiments, in the first pixel structure, two third sub-pixels are arranged symmetrically with respect to an axis of symmetry extending in one of the second direction and a third direction perpendicular to the second direction, and two first sub-pixels are arranged asymmetrically with respect to a straight line extending in the other of the second direction and the third direction.

According to some exemplary embodiments, the first opening of at least one first sub-pixel includes a body portion and an auxiliary portion, an orthographic projection of the body portion of the first opening on the base substrate is a circle, and an orthographic projection of the auxiliary portion of the first opening on the base substrate protrudes in a protruding direction relative to the circle, and in the first pixel structure, the auxiliary portions of the first openings of two first sub-pixels have a same protruding direction or different protruding directions.

According to some exemplary embodiments, in the first pixel structure, protruding directions of auxiliary portions of the first openings of two first sub-pixels are parallel to the second arrangement direction and opposite to each other: or in the first pixel structure, protruding directions of auxiliary portions of the first openings of two first sub-pixels are parallel to the first arrangement direction and opposite to each other: or in a plurality of first pixel structures, protruding directions of auxiliary portions of the first openings of at least two first sub-pixels are parallel to the second arrangement direction and opposite to each other, and protruding directions of auxiliary portions of the first openings of other first sub-pixels are parallel to the first arrangement direction and opposite to each other.

According to some exemplary embodiments, at least one of the first pixel structures includes at least four second sub-pixels, and in the first pixel structure, the pattern of the orthographic projection of the second opening of at least one second sub-pixel on the base substrate has a maximum size in the second direction, the pattern of the orthographic projection of the second opening of at least one second sub-pixel on the base substrate has a maximum size in a third direction, and a predetermined angle is formed between the second direction and the third direction.

According to some exemplary embodiments, the predetermined angle between the second direction and the third direction ranges from 0° to 150°.

According to some exemplary embodiments, the second direction is substantially perpendicular to the third direction: or the second direction is substantially parallel to the third direction.

According to some exemplary embodiments, a ratio of an area of the orthographic projection of the first opening on the base substrate to an area of the orthographic projection of the second opening on the base substrate ranges from 0.5 to 2.5; and/or a ratio of an area of the orthographic projection of the third opening on the base substrate to the area of the orthographic projection of the second opening on the base substrate ranges from 1 to 8.

According to some exemplary embodiments, at least one of the orthographic projection of the first opening on the base substrate, the orthographic projection of the second opening on the base substrate, or the orthographic projection of the third opening on the base substrate has an elliptical shape.

According to some exemplary embodiments, a pattern of an orthographic projection of a body portion of the first opening on the base substrate has a first center of circle; and for the first opening having the first center, the first center of the first opening is offset by a first offset distance in the second arrangement direction relative to the first center of circle of the body portion of the first opening.

According to some exemplary embodiments, for the first opening having the third center, the third center of the first opening is offset by a second offset distance in the second arrangement direction relative to the first center of circle of the body portion of the first opening.

According to some exemplary embodiments, the first offset distance is substantially equal to the second offset distance.

According to some exemplary embodiments, a line connecting the first center of circle of the first opening and the second center is substantially parallel to the first arrangement direction, a line connecting the first center and the second center forms a first inclination angle with respect to the first arrangement direction, and the first inclination angle is greater than 0° and less than 30°; and/or for the first opening having the third center, a line connecting the first center of circle of the first opening and the fourth center is substantially parallel to the first arrangement direction, a line connecting the third center and the fourth center forms a second inclination angle with respect to the first arrangement direction, and the second inclination angle is greater than 0° and less than 30°.

According to some exemplary embodiments, the orthographic projection of at least one second opening on the base substrate falls within the first quadrilateral and has a fifth center, a separation distance between the fifth center and the second center in the second arrangement direction is not equal to a separation distance between the fifth center and the third center in the second arrangement direction; and/or a separation distance between the fifth center and the first center in the first arrangement direction is not equal to a separation distance between the fifth center and the second center in the first arrangement direction.

According to some exemplary embodiments, in the first pixel structure, the patterns of the orthographic projections of the second openings of four second sub-pixels on the base substrate have a fifth center, a sixth center, a seventh center and an eighth center, respectively, the fifth center, the sixth center, the seventh center and the eighth center are connected in sequence to form a second quadrilateral, and four sides of the second quadrilateral have substantially a same length.

According to some exemplary embodiments, the third opening of at least one third sub-pixel includes a body portion and an auxiliary portion, an orthographic projection of the body portion of the third opening on the base substrate is a circle, and an orthographic projection of the auxiliary portion of the third opening on the base substrate protrudes in a protruding direction relative to the circle; and in the first pixel structure, the auxiliary portions of the third openings of two third sub-pixels have a same protruding direction or different protruding directions.

According to some exemplary embodiments, the display substrate further includes: an anode structure on a side of the pixel defining layer facing the base substrate: a pixel driving circuit layer between the base substrate and the anode structure; and an anode connection hole, wherein the anode structure is connected to the pixel driving circuit through the anode connection hole, wherein an orthographic projection of an auxiliary portion of the first opening on the base substrate protrudes, relative to a circle of a body portion of the first opening, toward an orthographic projection of the anode connection hole of the first sub-pixel where the first opening is located on the base substrate; and/or an orthographic projection of an auxiliary portion of the third opening on the base substrate protrudes, relative to a circle of a body portion of the third opening, toward an orthographic projection of the anode connection hole of the third sub-pixel where the third opening is located on the base substrate.

According to some exemplary embodiments, the auxiliary portion of the first opening has a sharp corner portion on a side facing the anode connection hole of the first sub-pixel; and/or the auxiliary portion of the third opening has a sharp corner portion on a side facing the anode connection hole of the third sub-pixel.

According to some exemplary embodiments, the auxiliary portion of the first opening has a rounded corner portion on the side facing the anode connection hole of the first sub-pixel; and/or the auxiliary portion of the third opening has a rounded corner portion on the side facing the anode connection hole of the third sub-pixel.

According to some exemplary embodiments, a line connecting the first center and the fourth center is substantially parallel to the second arrangement direction; and/or a line connecting the second center and the third center is substantially parallel to the second arrangement direction.

According to some exemplary embodiments, a line connecting the fifth center and the sixth center is substantially parallel to the first arrangement direction; and/or a line connecting the seventh center and the eighth center is substantially parallel to the first arrangement direction; and/or a line connecting the fifth center and the eighth center is substantially parallel to the second arrangement direction; and/or a line connecting the sixth center and the seventh center is substantially parallel to the second arrangement direction.

According to some exemplary embodiments, the pattern of the orthographic projection of the second opening on the base substrate has an elliptical shape.

According to some exemplary embodiments, the orthographic projection of the first opening of at least one first sub-pixel on the base substrate has a shape of a droplet;

and/or the orthographic projection of the third opening of at least one third sub-pixel on the base substrate has a circular shape.

According to some exemplary embodiments, the display substrate further includes a second display region, and the display substrate further includes: a plurality of second pixel structures arranged on the base substrate in an array in the first arrangement direction and the second arrangement direction and located in the second display region, wherein at least one of the second pixel structures includes a fourth sub-pixel and a fifth sub-pixel, wherein the pixel defining layer further includes a plurality of fourth openings and a plurality of fifth openings, the first sub-pixel and the fourth sub-pixel emit light having a same color, and the second sub-pixel and the fifth sub-pixel emit light having a same color: the fourth sub-pixel includes the fourth opening, and the fifth sub-pixel includes the fifth opening; and an area of the orthographic projection of the first opening of the first sub-pixel on the base substrate is less than an area of an orthographic projection of the fourth opening of the fourth sub-pixel on the base substrate, and an area of the orthographic projection of the second opening of the second sub-pixel on the base substrate is less than an area of an orthographic projection of the fifth opening of the fifth sub-pixel on the base substrate.

According to some exemplary embodiments, at least one of the second pixel structures further includes a plurality of sixth sub-pixels, and the third sub-pixel and the sixth sub-pixel emit light having a same color: the pixel defining layer further includes a plurality of sixth openings, and the sixth sub-pixel includes the sixth opening; and an area of the orthographic projection of the third opening of the third sub-pixel on the base substrate is less than an area of the orthographic projection of the sixth opening of the sixth sub-pixel on the base substrate.

According to some exemplary embodiments, in the first pixel structure, a ratio of a minimum separation distance between the first opening and the second opening in the second direction to a minimum separation distance between the second opening and the third opening in the third direction ranges from 1.05 to 3; and/or in the first pixel structure, a ratio of a minimum separation distance between the first opening and the third opening in the second arrangement direction to the minimum separation distance between the first opening and the second opening in the second direction ranges from 1.1 to 5.

In another aspect, a display device including the display substrate described above is provided.

BRIEF DESCRIPTION OF THE DRAWINGS

By referring to accompanying drawings for a detailed description of exemplary embodiments disclosed herein, the features and advantages of the present disclosure will become more apparent, in the drawings.

DETAILED DESCRIPTION OF EMBODIMENTS

Figure 1:
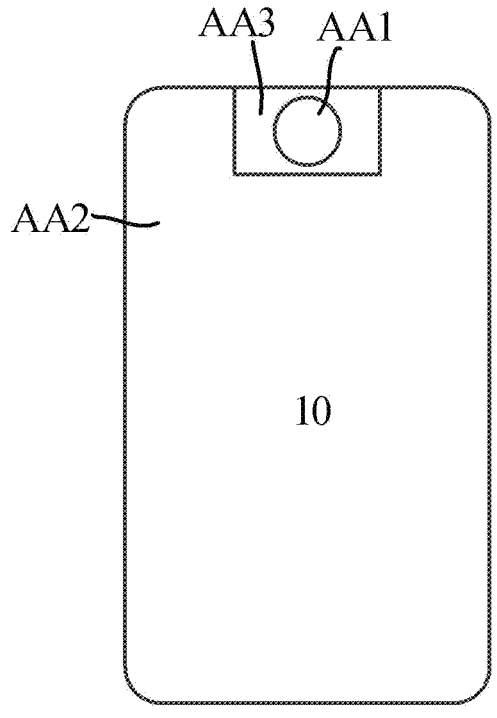
FIG. 1 shows a schematic plan view of a display device according to some exemplary embodiments of the present disclosure, in which a planar structure of a display substrate included in the display device is schematically shown.

In order to make objectives, technical solutions and advantages of the present disclosure clearer, the technical solutions of the embodiments of the present disclosure are clearly and completely described below with reference to the drawings. It is clearly that the described embodiments are just a part rather than all of the embodiments of the present disclosure. Based on the described embodiments of the present disclosure, all additional embodiments obtained by those ordinary skilled in the art without carrying out inventive effort fall within the protection scope of the present disclosure.

It should be noted that, in the drawings, for clarity and/or description purposes, a size and a relative size of elements may be enlarged. Accordingly, the size and the relative size of each element need not to be limited to those shown in the drawings. In the specification and drawings, the same or similar reference numerals indicate the same or similar components.

When an element is described as being "on", "connected to" or "coupled to" another element, that element may be directly on the another element, directly connected to the another element, or directly coupled to the another element, or an intermediate element may be provided. However, when an element is described as being "directly on", "directly connected to" or "directly coupled to" another element, no intermediate element is provided. Other terms and/or expressions used to describe a relationship between elements, such as "between" and "directly between", "adjacent" and "directly adjacent", "on" and "directly on", etc. should be interpreted in a similar manner. In addition, the term "connection" may refer to a physical connection, an electrical connection, a communicative connection, and/or a fluid connection. In addition, X axis, Y axis and Z axis are not limited to three axes of a rectangular coordinate system, and may be interpreted in a broader meaning. For example, the X axis, the Y axis and the Z axis may be perpendicular to each other, or may represent different directions that are not perpendicular to each other. For the objectives of the present disclosure, "at least one selected from X, Y or Z" and "at least one selected from a group consisting of X, Y and Z" may be interpreted as only X, only Y, only Z, or any combination of two or more of X, Y and Z, such as XYZ, XYY, YZ and ZZ. As used herein, the term "and/or" includes any and all combinations of one or more of the listed related items.

It should be noted that although the terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from the teachings of the present disclosure.

For ease of description, spatial relationship terms, such as "upper", "lower", "left", "right", etc. may be used herein to describe a relationship between one element or feature and another element or feature as shown in the figures. It should be understood that the spatial relationship terms are intended to cover other different orientations of a device in use or operation in addition to the orientation described in the figures. For example, if the device in the figures is turned upside down, an element or feature described as "below" or "under" another element or feature will be oriented "above" or "on" the another element or feature.

Herein, the expression "repetitive unit" may mean that at least two or more units are provided in the display substrate and these units are repeated immediately. The repetitive unit may refer to a combination of a plurality of sub-pixels, such as a combination of a plurality of sub-pixels used to display a pixel point, and a plurality of "repetitive units" are repeatedly arranged in an array on a base substrate. For example, one repetitive unit may include at least one pixel, such as two, three, four or more sub-pixels. In addition, here, for ease of description, a repetitive unit in a first display region is referred to as a first repetitive unit, and a repetitive unit in a second display region is referred to as a second repetitive unit. Herein, the expression "repetitive unit" may also be referred to as "pixel structure".

Herein, the expression "pixel density" refers to the number of repetitive units or sub-pixels per unit area. Similarly, the expression "distribution density" refers to the number of components (such as repetitive units, sub-pixels, spacers, etc.) per unit area.

Herein, unless otherwise specified, the expression "opening" refers to an opening of a pixel defining layer in each sub-pixel. The opening exposes at least part of an anode structure of a light emitting device of the sub-pixel, and at least part of a light emitting layer of the light emitting device is also located in the opening, that is, the opening corresponds to a light emitting region of the sub-pixel.

Herein, unless otherwise specified, the expression "center of opening" refers to a geometric center or a centroid of an orthographic projection of the opening on the base substrate. For example, in a case that the opening is a circle, the center of the opening is a center of the circle; in a case that the opening is an ellipse, the center of the opening is a center of the ellipse, that is, an intersection of a major axis and a minor axis of the ellipse: in a case that the opening is a rectangle, the center of the opening is a center of the rectangle, that is, an intersection of two diagonal lines of the rectangle.

Herein, unless otherwise specified, the expression "A and B are located substantially on a same straight line extending parallel to a first arrangement direction" includes the following cases: A and B are located on the same straight line extending parallel to the first arrangement direction: positions of A and B have an error in a direction perpendicular to the first arrangement direction, and the error is less than or equal to +5 microns.

Herein, unless otherwise specified, "a distance between a first opening and a second opening" and similar expressions refers to a distance between a center of the first opening and a center of the second opening, and "a separation distance between the first opening and the second opening" and similar expressions refers to a distance between an edge of the first opening closest to the second opening and an edge of the second opening closest to the first opening.

Embodiments of the present disclosure provide a display substrate including a first display region. The display substrate includes: a base substrate: a plurality of first pixel structures arranged on the base substrate in an array in a first arrangement direction and a second arrangement direction and located in the first display region, where at least one of the first pixel structures includes at least one first sub-pixel and at least one second sub-pixel; and a pixel defining layer on the base substrate, where the pixel defining layer includes a plurality of first openings and a plurality of second openings in the first display region, the first sub-pixel includes the first opening, and the second sub-pixel includes the second opening. In the first pixel structure, a pattern of an orthographic projection of the first opening of at least one first sub-pixel on the base substrate has a maximum size in a first direction, a pattern of an orthographic projection of the second opening of at least one second sub-pixel on the base substrate has a maximum size in a second direction, an angle is formed between the second direction and the first direction, and a ratio of the maximum size of the first opening to the maximum size of the second opening ranges from 0.2 to 2. In the display substrate provided by embodiments of the present disclosure, a diffraction phenomenon in an under-screen imaging region may be reduced or eliminated while ensuring an aperture ratio of a pixel of the under-screen imaging region, which helps to improve a display effect and an imaging effect.

Figure 2:
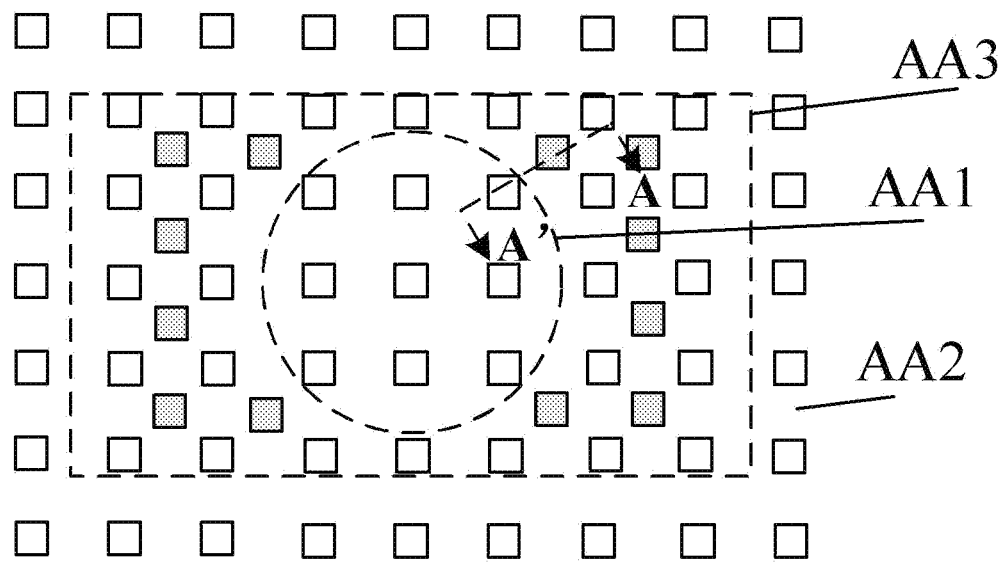
FIG. 2 shows a schematic partial enlarged view of the display substrate shown in FIG. 1.
Figure 3:
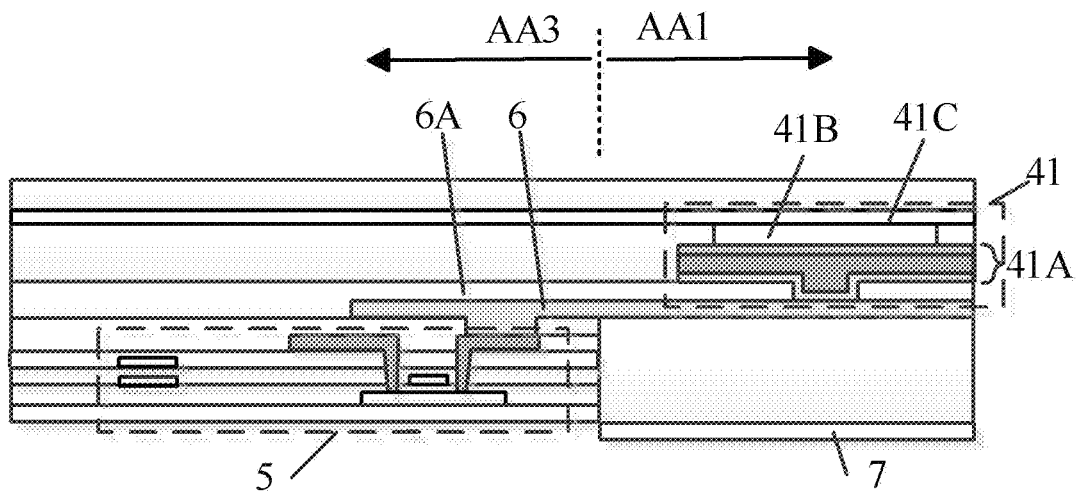
FIG. 3 shows a schematic cross-sectional view of the display substrate in FIG. 2 taken along line A-A'.

FIG. 1 shows a schematic plan view of a display device according to some exemplary embodiments of the present disclosure, in which a planar structure of a display substrate included in the display device is schematically shown. FIG. 2 shows a schematic partial enlarged view of the display substrate shown in FIG. 1. FIG. 3 shows a schematic cross-sectional view of the display substrate in FIG. 2 taken along line A-A'. As shown in FIG. 1, FIG. 2 and FIG. 3, the display device according to embodiments of the present disclosure includes a display substrate 10. A display region of the display substrate 10 includes a first display region AA1, a second display region AA2, and a third display region AA3. For example, the first display region AA1 may be a light-transmitting display region, the second display region AA2 may be a body display region, and the third display region AA3 may be a peripheral display region or a transition display region.

For example, the second display region AA2 is a main display region. The second display region AA2 includes a plurality of sub-pixels arranged in an array, and each sub-pixel includes a light emitting device and a pixel driving circuit for driving the light emitting device. The first display region AA1 may allow light incident from a display side of the display substrate to pass through the display substrate and reach a back side of the display substrate, so as to be used for a normal operation of a sensor and other components on the back side of the display substrate. The first display region AA1 and the third display region AA3 also include a plurality of sub-pixels for display. However, as the pixel driving circuit of the sub-pixel is generally opaque, in order to ensure the light transmittance of the first display region AA1, the pixel driving circuit of the sub-pixel (such as indicated by a box in the first display region AA1 in FIG. 3) in the first display region AA1 may be arranged in the third display region AA3, as shown by a gray box in the third display region AA3.

As shown in FIG. 3, a light emitting device 41 of a sub-pixel in the first display region AA1 includes an anode structure 41A, a cathode structure 41C, and a light emitting structure 41B between the anode structure 41A and the cathode structure 41C. The anode structure 41A is electrically connected to a pixel driving circuit 5 in the third display region AA3 through a transparent wire (such as ITO wire) 6, so that the pixel driving circuit 5 in the third display region AA3 may be used to drive the light emitting device 41 in the first display region AA1. Due to a high light transmittance of the transparent wire 6, a high light transmittance of the first display region AA1 may be ensured. Therefore, a sensor 7 and other components on the back side of the display substrate may receive the light transmitted from the display side of the display substrate through the first display region AA1, so as to perform a normal operation.

For example, the first display region AA1 and the second display region AA2 do not overlap with each other. For example, the second display region AA2 at least partially surrounds (for example, completely surrounds) the first display region AA1.

For a display substrate with an under-screen sensor (for example, an image sensor), in order to ensure a good imaging effect or other effects of the under-screen sensor (for example, image sensor), the light transmittance of the display region corresponding to the under-screen sensor may be greater than that of other display regions of the display substrate.

As shown in FIG. 3, the display substrate 10 may include a base substrate 1. The sensor 7 may be provided on a rear surface of the base substrate 1 in the first display region AA1 (shown as a lower side in FIG. 3, which may be, for example, a side opposite to a light exit direction during display), and the first display region AA1 may meet imaging requirements of the sensor 7 for the light transmittance.

For example, the light transmittance of the first display region AA1 is greater than that of the second display region AA2. The sensor 7 may be, for example, an image sensor or an infrared sensor. The sensor 7 is used to receive light from the display side (an upper side in FIG. 3, which may be, for example, the light exit direction during display, or a direction of human eyes during display) of the display substrate 10, so that operations such as image capturing, distance sensing and light intensity sensing may be performed. The light may pass through, for example, the first display region AA1 and then irradiate on the sensor to be sensed by the sensor.

It should be noted that, in the illustrated embodiments, the first display region AA1 is located at an upper edge of the display substrate. For example, three sides of the first display region AA1 are surrounded by the third display region AA3, and an upper side of the first display region AA1 is aligned with the upper side of the display substrate. However, embodiments of the present disclosure are not limited thereto. In other embodiments, for example, the second display region AA2 or the third display region AA3 may completely surround the first display region AA1. For another example, the first display region AA1 may be located at the upper edge of the display substrate and arranged along an entire width of the display substrate.

For example, the first display region AA1 may have a shape of a circle, an ellipse, a droplet or a rectangle, and the second display region AA2 may have a shape of a circle, an ellipse or a rectangle, but embodiments of the present disclosure are not limited thereto. For another example, the first display region AA1 and the second display region AA2 may both be rectangles, rounded rectangles or have other suitable shapes.

In the display substrates shown in FIG. 1 and FIG. 3, an OLED display technology may be adopted. OLED display substrates have advantages of wide viewing angle, high contrast, fast response, low power consumption, foldability, flexibility, etc., and have been more and more widely used in display products. With the development and in-depth application of the OLED display technology, there are increasingly strong demands for displays with high screen-to-body ratio. In the display substrate shown in FIG. 1 and FIG. 2, a solution of under-screen camera is adopted, in this way, a notch region may be eliminated so as to avoid punching holes in the display screen, therefore, the screen-to-body ratio may be increased, thereby achieving a good visual experience.

In addition, the display substrate may further include a driving circuit layer, a light emitting device layer and an encapsulation layer that are arranged on the base substrate 1. For example, the pixel driving circuit layer, the light emitting device layer and the encapsulation layer are schematically shown in FIG. 3. The pixel driving circuit layer includes a pixel driving circuit structure, and the light emitting device layer includes a light emitting device such as an OLED. The pixel driving circuit structure may control the light emitting device of each sub-pixel to emit light, so as to achieve a display function. The pixel driving circuit structure may include a thin film transistor, a storage capacitor, and various signal lines. The various signal lines may include a gate line, a data line, an ELVDD power line, an ELVSS power line and so on, so as to provide various signals such as a control signal, a data signal and a power supply voltage to the pixel driving circuit in each sub-pixel.

The display substrate provided by embodiments of the present disclosure will be described in detail below through some specific exemplary embodiments.

Figure 4:
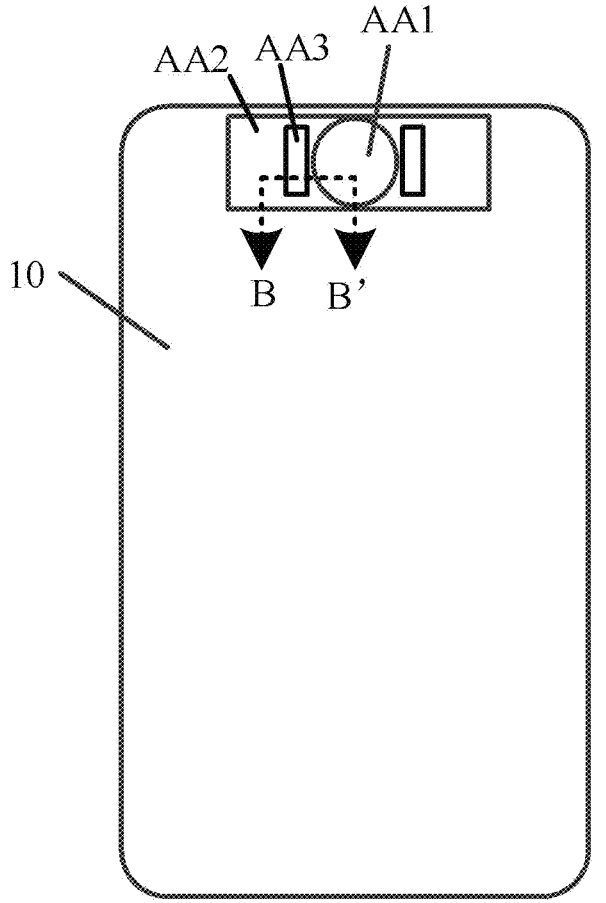
FIG. 4 shows a schematic plan view of a display substrate according to some exemplary embodiments of the present disclosure.
Figure 5:
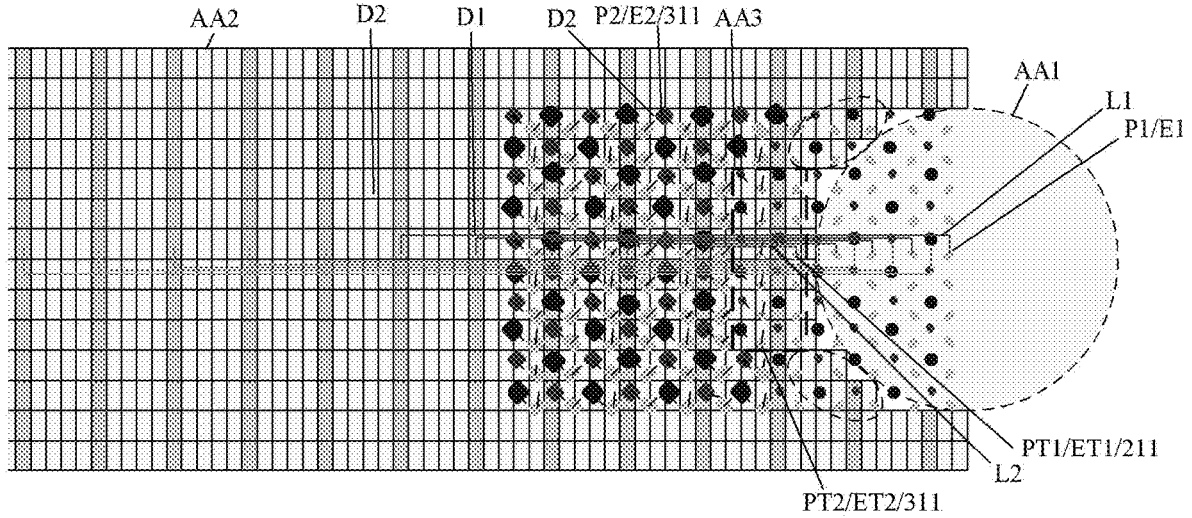
FIG. 5 shows a schematic partial enlarged view of the display substrate in FIG. 4.
Figure 6:
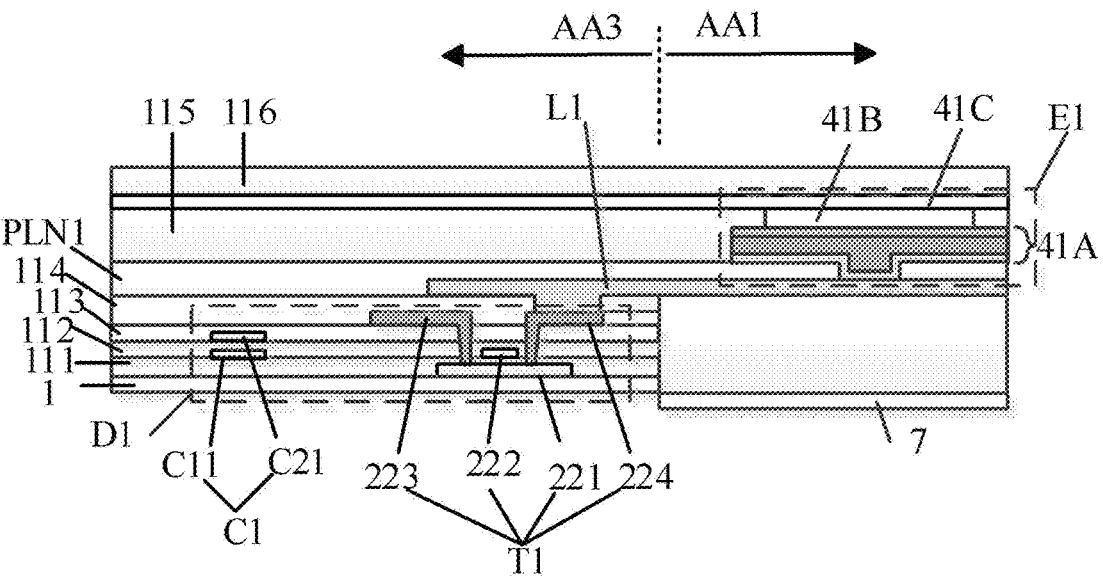
FIG. 6 shows a schematic partial cross-sectional view of the display substrate in FIG. 4 taken along line B-B'.

At least one embodiment of the present disclosure provides a display substrate. FIG. 4 shows a schematic plan view of a display substrate according to some exemplary embodiments of the present disclosure. FIG. 5 shows a schematic partial enlarged view of the display substrate in FIG. 4. FIG. 6 shows a schematic partial cross-sectional view of the display substrate in FIG. 4 taken along line BB'. As shown in FIG. 4 to FIG. 6, the display substrate has a base substrate 1, and the display region of the display substrate includes a first display region AA1, a second display region AA2 and a third display region AA3.

The first display region AA1 includes a plurality of first sub-pixels SP1 on the base substrate 1, and each of the plurality of first sub-pixels SP1 includes a first light emitting device E1. The first display region AA1 is at least partially light-transmitting, that is, the first display region AA1 allows light from the display side of the display substrate to at least partially pass through the display substrate and reach a non-display side of the display substrate, so as to allow an operation of a camera, an infrared sensor or other photo-sensitive devices on the non-display side of the display substrate. Therefore, the first display region AA1 may not only display, but also help a normal operation of the camera, the infrared sensor and other devices, thereby achieving a large-screen and full-screen design of the display substrate.

The second display region AA2 is arranged on at least one side of the first display region AA1, shown as a left side in FIG. 5, and includes a plurality of first pixel driving circuits D1 on the base substrate 1. For a purpose of clarity, FIG. 6 shows a schematic diagram of a partial structure of the display substrate in FIG. 5.

For example, a plurality of first pixel driving circuits D1 are electrically connected to a plurality of first light emitting devices E1 of the plurality of first sub-pixels SP1 through a plurality of first wires L1, respectively, and a plurality of first transition pixel driving circuits are electrically connected to a plurality of first transition light emitting devices ET1 of a plurality of first transition sub-pixels through a plurality of second wires L2, respectively. Therefore, the plurality of first pixel driving circuits D1 in the second display region AA2 may drive the plurality of first light emitting devices E1 of the plurality of first sub-pixels SP1, respectively.

For example, FIG. 6 shows a schematic cross-sectional view of the display substrate in FIG. 4 taken along line B-B', which shows a connection manner between the first light emitting device and the first pixel driving circuit. In some embodiments, as shown in FIG. 6, the first pixel driving circuit D1 includes a thin film transistor T1, a storage capacitor C1 and other structures, and the first pixel driving circuit D1 may be formed as, for example, a 3TIC pixel driving circuit, a 7TIC pixel driving circuit, etc. A specific form of the pixel driving circuit is not limited in embodiments of the present disclosure.

For example, the thin film transistor T1 includes an active layer 221, a gate electrode 222, and source and drain electrodes 223 and 224. The storage capacitor C1 includes a first capacitor plate C11 and a second capacitor plate C12. The active layer 221 is arranged on the base substrate 1, the gate electrode 222 and the first capacitor plate C11 are arranged in a same layer on a side of the active layer 221 away from the base substrate 1, the second capacitor plate C12 is arranged on a side of the gate electrode 222 and the first capacitor plate C11 away from the base substrate 1, and the source and drain electrodes 223 and 224 are arranged on a side of the second capacitor plate C12 away from the base substrate 1.

It should be noted that, in embodiments of the present disclosure, "arranged in a same layer" means that two (or more) functional layers or structural layers are formed in a same layer and with a same material in a stack of the display substrate, that is, in a manufacturing process, the two functional layers or structural layers may be formed from a same material layer, and the required patterns and structures may be formed through a same patterning process.

For example, as shown in FIG. 6, the first light emitting device E1 includes a first electrode 41A, a second electrode 41C, and a light emitting layer 41C between the first electrode 41A and the second electrode 41C. The first electrode 41A may serve as, for example, an anode of the first light emitting device E1, and the second electrode 41C may serve as, for example, a cathode of the first light emitting device E1. The first electrode 41A is connected to the source/drain electrode 224 of the thin film transistor T1 of the first pixel driving circuit D1 through the first wire L1. For example, the first electrode 41A may adopt a single-layer or multi-layer structure, such as a multi-layer structure of Ag/ITO/Ag.

For example, in a direction perpendicular to the base substrate 1, that is, in a vertical direction shown in the figure, a plurality of first wires L1 are arranged between the source/drain electrodes 223/224 and the first electrodes 41A.

For example, as shown in FIG. 6, the display substrate further includes a first gate insulating layer 111 on a side of the active layer 221 away from the base substrate 1, a second gate insulating layer 112 on a side of the gate electrode 222 away from the base substrate 1, an interlayer insulating layer 113 on a side of the second capacitor plate C12 away from the base substrate 1, a planarization layer 114 on a side of the source and drain electrodes 223 and 224 away from the base substrate 1, and a planarization layer PLN1 on a side of the first wire L1 away from the base substrate 1. For example, the planarization layer PLN1 and the planarization layer 114 are made of a same material, e.g., an organic insulating material such as polyimide, epoxy resin, etc.

For example, in some embodiments, as shown in FIG. 6, the display substrate further includes a sensor 7 on the non-display side of the display substrate. An orthographic projection of the sensor 7 on the base substrate 1 overlaps at least partially with the first display region AA1. The sensor 7 is used to receive light from the display side of the display substrate for a normal operation of the sensor 7. For example, the sensor 7 may be a camera, an infrared sensor, or other devices, which may achieve various functions such as taking pictures, face recognition, and infrared sensing, etc. through the first display region AA1.

Figure 7A:
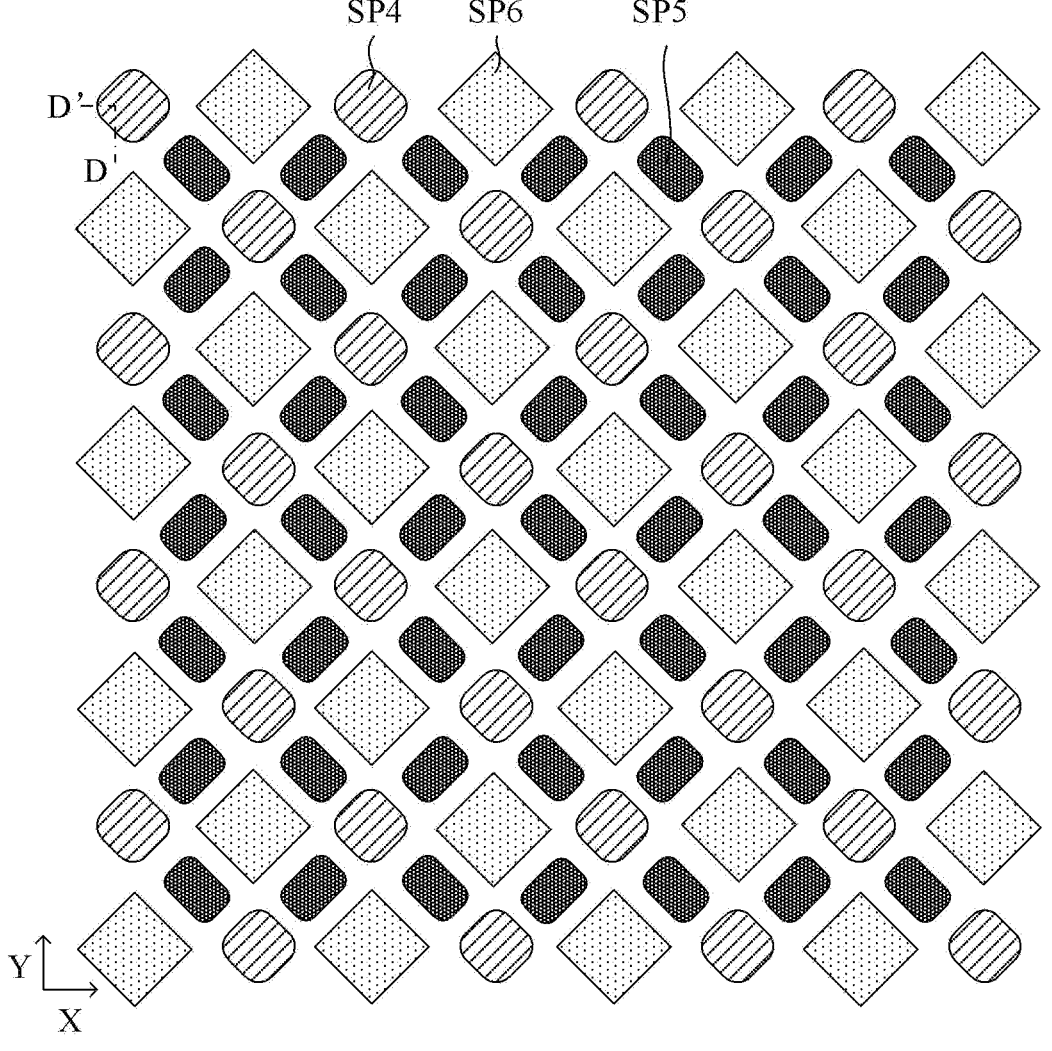
FIG. 7A shows a schematic diagram of a partial structure of a display substrate in a second display region according to some exemplary embodiments of the present disclosure.
Figure 7B:
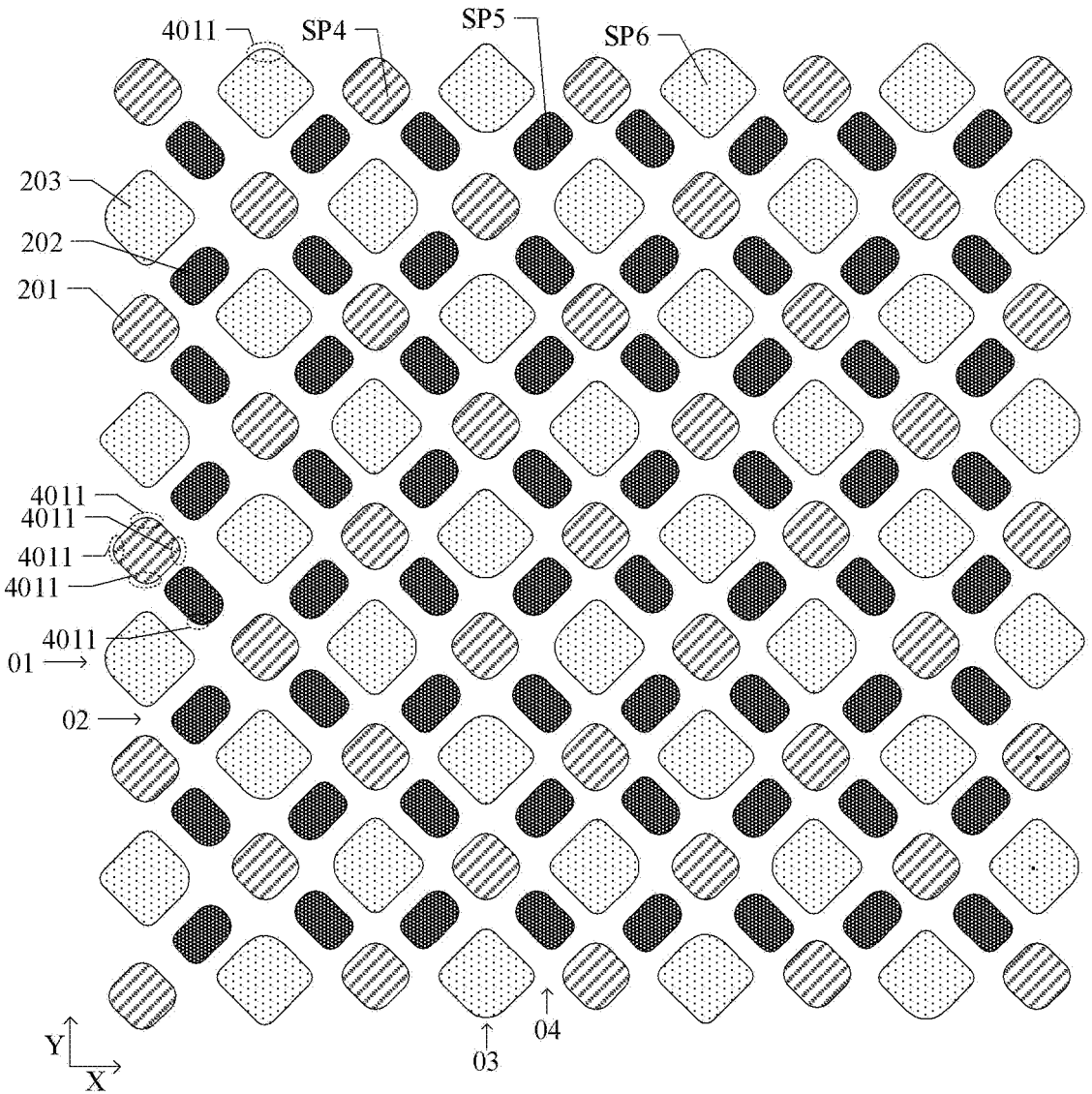
FIG. 7B shows a schematic diagram of a partial structure of a display substrate in a second display region according to other exemplary embodiments of the present disclosure.
Figure 8:
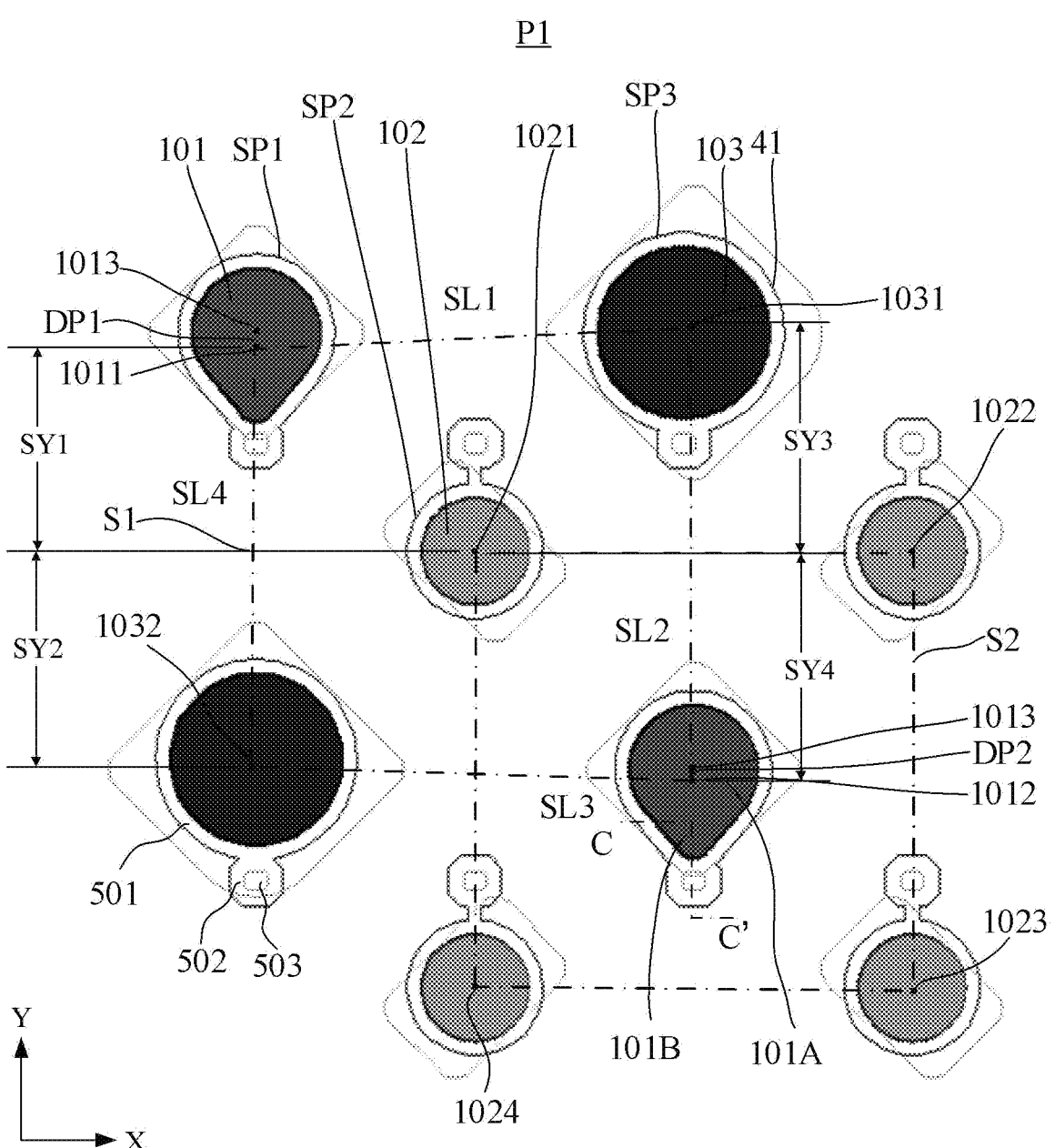
FIG. 8 shows a schematic diagram of a partial structure of a display substrate in a first display region according to some exemplary embodiments of the present disclosure, in which a pixel arrangement structure of a repetitive unit in the first display region is schematically shown.
Figure 9:
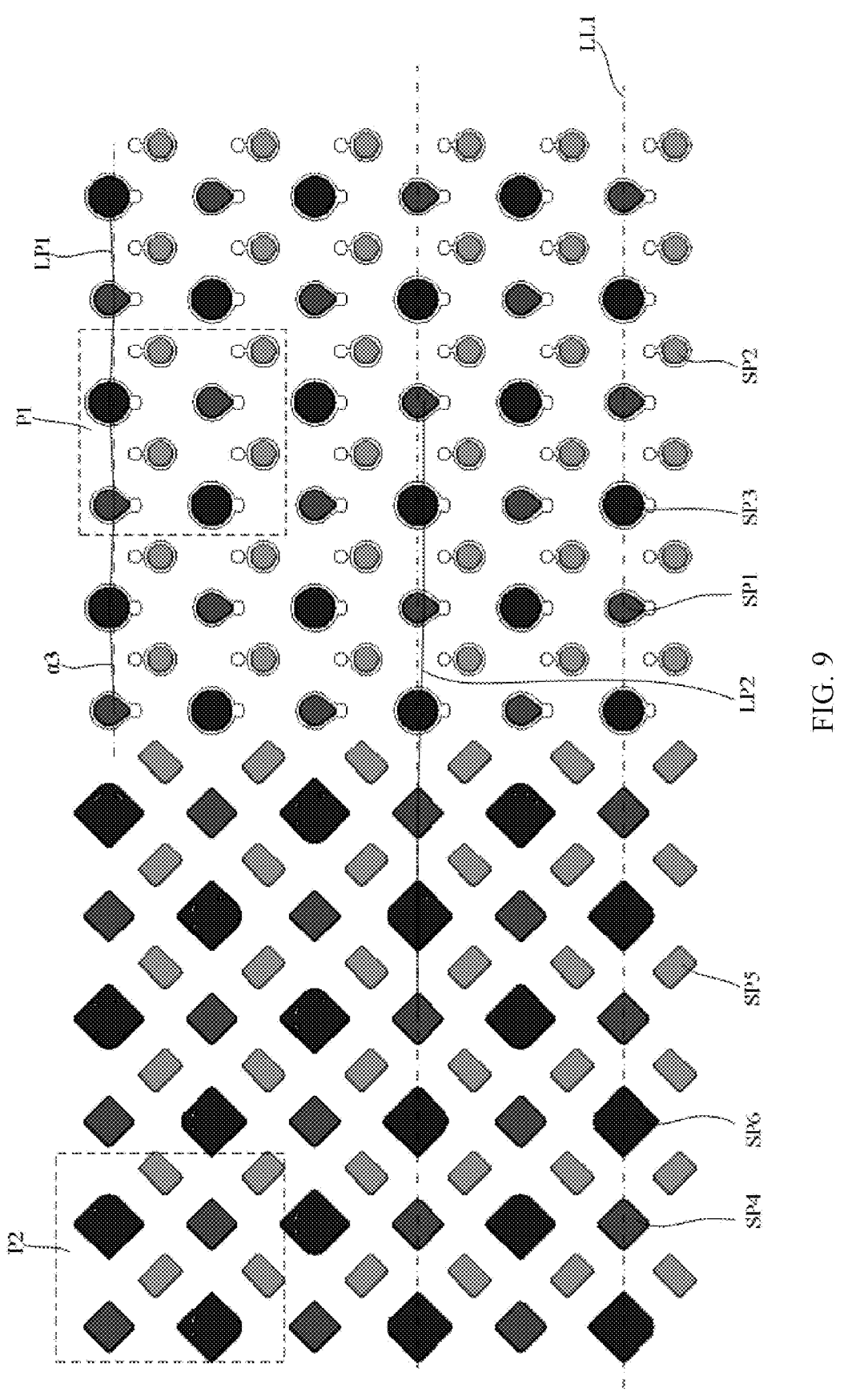
FIG. 9 shows a schematic diagram of a partial structure of a display substrate in a connection region between a first display region and a second display region according to some exemplary embodiments of the present disclosure.

FIG. 7A shows a schematic diagram of a partial structure of a display substrate in a second display region according to some exemplary embodiments of the present disclosure. FIG. 7B shows a schematic diagram of a partial structure of a display substrate in a second display region according to other exemplary embodiments of the present disclosure. FIG. 8 shows a schematic diagram of a partial structure of a display substrate in a first display region according to some exemplary embodiments of the present disclosure, in which a pixel arrangement structure of a repetitive unit in the first display region is schematically shown. FIG. 9 shows a schematic diagram of a partial structure of a display substrate in a connection region between a first display region and a second display region according to some exemplary embodiments of the present disclosure.

Referring to FIG. 7A to FIG. 9, the first display region AA1 includes a plurality of first repetitive units P1 arranged in an array, and the second display region AA2 includes a plurality of second repetitive units P2 arranged in an array. Each of the repetitive units P1 and P2 may include a plurality of sub-pixels. In some embodiments, each first repetitive unit P1 may include at least one first pixel unit, and each first pixel unit may include a plurality of sub-pixels, such as a red sub-pixel, a green sub-pixel and a blue sub-pixel. Similarly, the second repetitive unit P2 may include at least one second pixel unit, and each second pixel unit may also include a plurality of sub-pixels, such as a red sub-pixel, a green sub-pixel and a blue sub-pixel.

It should be noted that the red sub-pixel, the green sub-pixel and the blue sub-pixel are illustrated by way of example in describing embodiments of the present disclosure, but embodiments of the present disclosure are not limited thereto. That is, each repetitive unit may include sub-pixels having at least two different colors, such as a fourth sub-pixel, a fifth sub-pixel and a sixth sub-pixel, and a first color, a second color and a third color are different colors. Herein, for ease of description, the plurality of sub-pixels included in the first pixel unit are respectively referred to as a first sub-pixel, a third sub-pixel and a second sub-pixel, and the plurality of sub-pixels included in the second pixel unit are respectively referred to as a fourth sub-pixel, a sixth sub-pixel and a fifth sub-pixel. For example, the first sub-pixel and the fourth sub-pixel may emit light having the same color, such as red: the third sub-pixel and the sixth sub-pixel may emit light having the same color, such as blue: the second sub-pixel and the fifth sub-pixel may emit light having the same color, such as green.

For example, in some exemplary embodiments of the present disclosure, one first pixel unit includes at least one first sub-pixel (for example, one first sub-pixel is shown in FIG. 8), at least one third sub-pixel (for example, one third sub-pixel is shown in FIG. 8), and at least one second sub-pixel (for example, two second sub-pixels are shown in FIG. 8). For ease of description, the first sub-pixel, the second sub-pixel and the third sub-pixel included in the first pixel unit are denoted by reference numerals SP1, SP2 and SP3, respectively. One second pixel unit includes at least one fourth sub-pixel (for example, one fourth sub-pixel is shown in FIG. 9), at least one sixth sub-pixel (for example, one sixth sub-pixel is shown in FIG. 9), and at least one fifth sub-pixel (for example, two fifth sub-pixels are shown in FIG. 9). For ease of description, the fourth sub-pixel, the fifth sub-pixel and the sixth sub-pixel included in the second pixel unit are denoted by reference numerals SP4, SP5 and SP6, respectively. For example, the first color may be red, the second color may be blue, and the third color may be green.

A sub-pixel may include a light emitting device and a pixel driving circuit for driving the light emitting device to emit light. The light emitting device may include a first electrode, a second electrode, and a light emitting material layer between the first electrode and the second electrode. The pixel driving circuit may include a transistor, a capacitor, and other elements. The pixel driving circuit may receive a signal transmitted by the signal line provided on the display substrate, generate a current for driving the light emitting device, and achieve a purpose of driving the light emitting device to emit light through a connection with the first electrode or the second electrode. For example, the pixel driving circuit is arranged on the base substrate, and the light emitting device is located on a side of the pixel driving circuit away from the base substrate. In some embodiments, the display substrate further includes a pixel defining layer on a side of the first electrode away from the pixel driving circuit. The pixel defining layer includes a plurality of openings, and each sub-pixel corresponds to at least one opening (for example, one opening) of the pixel defining layer. An actual light emitting region or display region of a sub-pixel is substantially equivalent to the opening of the pixel defining layer corresponding to that sub-pixel. In some embodiments, the opening of the pixel defining layer corresponding to each sub-pixel or the actual light emitting region of each sub-pixel has an area less than that of the first electrode, and a projection of the opening of the pixel defining layer corresponding to that sub-pixel or the actual light emitting region of that sub-pixel on the base substrate completely falls within a projection of the first electrode on the base substrate. For ease of illustration, FIG. 7A to FIG. 9 show approximate positions and shapes of the openings of the pixel defining layer corresponding to the sub-pixels to show a distribution of the sub-pixels.

For example, in some embodiments of the present disclosure, an arrangement of sub-pixels in each repetitive unit may refer to an existing pixel arrangement, such as GGRB, RGBG, RGB, etc., which is not limited in embodiments of the present disclosure.

As shown in FIG. 7A to FIG. 9, the first display region AA1 has a first pixel density, and the second display region AA2 has a second pixel density. The second pixel density is not less than the first pixel density, and for example, the second pixel density is greater than the first pixel density. For example, herein, a pixel density may be a ratio of an area of the actual light emitting regions of the sub-pixels in a unit area to that unit area. Alternatively, for example, the pixel density is a ratio of an area of the anode electrodes of the sub-pixels in a unit area to that unit area. Alternatively, for example, the pixel density reflects a ratio of an area of an opaque region or region that has a low transmittance in a unit area to that unit area. This is not limited in embodiments of the present disclosure. In the first display region AA1, a blank region between the plurality of first repetitive units P1 may allow more light to pass through, so as to increase the light transmittance of the region. Therefore, the first display region AA1 has a greater light transmittance than the second display region AA2.

It should be noted that herein, the blank region between the plurality of first repetitive units P1 may be referred to as a light transmitting region.

Referring to FIG. 7A to FIG. 9, the display substrate may include a plurality of openings, and the plurality of openings are respectively located in a plurality of sub-pixels in the first display region AA1 and the second display region AA2 to expose at least part of the anode structures of the corresponding sub-pixels. For ease of description, the opening of the first sub-pixel SP1 in the first display region AA1 is referred to as a first opening, denoted by reference numeral 101: the opening of the second sub-pixel SP2 in the first display region AA1 is referred to as a second opening, denoted by reference numeral 102: the opening of the third sub-pixel SP3 in the first display region AA1 is referred to as a third opening, denoted by reference numeral 103: the opening of the fourth sub-pixel SP4 in the second display region AA2 is referred to as a fourth opening, denoted by reference numeral 201: the opening of the fifth sub-pixel SP5 in the second display region AA2 is referred to as a fifth opening, denoted by reference numeral 202: the opening of the sixth sub-pixel SP6 in the second display region AA2 is referred to as a sixth opening, denoted by reference numeral 203.

As shown in FIG. 7A and FIG. 7B, a plurality of fourth sub-pixels SP4 and a plurality of sixth sub-pixels SP6 are alternately arranged in a first arrangement direction (X direction as shown in FIG. 7A and FIG. 7B) to form a first pixel row 01, and a plurality of fifth sub-pixels SP5 are arranged in the first arrangement direction to form a second pixel row 02. The first pixel row 01 and the second pixel row 02 are alternately arranged in a second arrangement direction (Y direction as shown in FIG. 7A and FIG. 7B) intersecting the first arrangement direction, and staggered from each other in the first arrangement direction. For example, adjacent fourth sub-pixel SP4 and sixth sub-pixel SP6 are arranged in the first arrangement direction. As shown in FIG. 7A and FIG. 7B, a plurality of fourth sub-pixels SP4 and a plurality of sixth sub-pixels SP6 are alternately arranged in the second arrangement direction to form a plurality of first pixel columns 03, and a plurality of fifth sub-pixels SP5 are arranged in an array in the first arrangement direction and the second arrangement direction to form the plurality of second pixel rows 02 and a plurality of second pixel columns 04. The plurality of first pixel columns 03 and the plurality of second pixel columns 04 are alternately arranged in the first arrangement direction and staggered from each other in the second arrangement direction, that is, a second pixel row 02 where a fifth sub-pixel SP5 is located is located between two adjacent first pixel rows 01, and a second pixel column 04 where the fifth sub-pixel SP5 is located is located between two adjacent first pixel columns 03.

For example, the first arrangement direction intersects the second arrangement direction. For example, an angle between the first arrangement direction and the second arrangement direction may range from 80° to 100°. For example, the angle between the first arrangement direction and the second arrangement direction may range from 85° to 95°. For example, the first arrangement direction may be perpendicular to the second arrangement direction, but embodiments of the present disclosure are not limited thereto, and the first arrangement direction may not be perpendicular to the second arrangement direction. In embodiments of the present disclosure, the first arrangement direction and the second arrangement direction may be interchanged.

Referring to FIG. 7A and FIG. 9 in combination, the first repetitive unit P1 may include at least two first pixel units (two first pixel units are shown in FIG. 8). Each first pixel unit includes four sub-pixels, including one first sub-pixel SP1, one third sub-pixel SP3, and two second sub-pixels SP2. In the first repetitive unit P1, a plurality of sub-pixels are arranged in four rows and four columns. In a first row, a first sub-pixel SP1 and a third sub-pixel SP3 are arranged in a first column and a third column, respectively. In a second row, two second sub-pixels SP2 are arranged in a second column and a fourth column, respectively. In a third row, a third sub-pixel SP3 and a first sub-pixel SP1 are arranged in the first column and the third column, respectively. In a fourth row, two second sub-pixels SP2 are arranged in the second column and the fourth column, respectively. That is, in the first display region AA1, the first sub-pixels SP1 and the third sub-pixels SP3 of the plurality of first pixel units are alternately distributed in the first arrangement direction X and the second arrangement direction Y, and the second sub-pixels SP2 of the plurality of first pixel units are arranged in an array in the first arrangement direction X and the second arrangement direction Y.

The second repetitive unit P2 may include at least two second pixel units (two second pixel units are shown in FIG. 7A and FIG. 7B). Each second pixel unit includes four sub-pixels, including one fourth sub-pixel SP4, one sixth sub-pixel SP6, and two fifth sub-pixels SP5. In the second repetitive unit P2, a plurality of sub-pixels are arranged in four rows and four columns. In a first row, a fourth sub-pixel SP4 and a sixth sub-pixel SP6 are arranged in a first column and a third column, respectively. In a second row, two fifth sub-pixels SP5 are arranged in a second column and a fourth column, respectively. In a third row, a sixth sub-pixel SP6 and a fourth sub-pixel SP4 are arranged in the first column and the third column, respectively. In a fourth row, two fifth sub-pixels SP5 are arranged in the second column and the fourth column, respectively. That is, in the second display region AA2, the fourth sub-pixels SP4 and the sixth sub-pixels SP6 of the plurality of second pixel units are alternately distributed in the first arrangement direction X and the second arrangement direction Y, and the fifth sub-pixels SP5 of the plurality of second pixel units are arranged in an array in the first arrangement direction X and the second arrangement direction Y.

In embodiments of the present disclosure, the first sub-pixel, the third sub-pixel and the second sub-pixel are sub-pixels emitting light having different colors, and the fourth sub-pixel, the sixth sub-pixel and the fifth sub-pixel are sub-pixels emitting light having different colors. For example, the first sub-pixel and the fourth sub-pixel being red sub-pixels, the third sub-pixel and the sixth sub-pixel being blue sub-pixels, and the second sub-pixel and the fifth sub-pixel being green sub-pixels are taken as examples for description. However, this does not constitute a limitation to embodiments of the present disclosure.

For example, an area of the opening of at least one blue sub-pixel (the third sub-pixel or the sixth sub-pixel) is greater than an area of the opening of at least one red sub-pixel (the first sub-pixel or the fourth sub-pixel), and an area of the light emitting region of at least one red sub-pixel is greater than an area of the opening of at least one green sub-pixel (the second sub-pixel or the fifth sub-pixel), so as to prolong a service life of the display substrate.

As shown in FIG. 7A and FIG. 7B, an orthographic projection of the fourth opening 201 of the fourth sub-pixel SP4 on the base substrate may have a shape such as rhombus, rounded rhombus, or the like. An orthographic projection of the sixth opening 203 of the sixth sub-pixel SP6 on the base substrate may have a shape such as rhombus, rounded rhombus, or the like. An orthographic projection of the fifth opening 202 of the fifth sub-pixel SP5 on the base substrate may have a shape such as rhombus, rounded rhombus, rectangle, rounded rectangle, octagon, or the like.

For example, as shown in FIG. 7A, the fifth openings 202 of adjacent fifth sub-pixels SP5 may be rounded rectangles symmetrical to each other.

As shown in FIG. 7B, in the second display region AA2, the shape of the opening of at least one sub-pixel may be a pattern including a rounded corner, and the shape of the light emitting region of the sub-pixel may also be a pattern including a rounded corner. For example, the shape of the anode of the sub-pixel may also be a pattern including a rounded corner. The pattern of the opening of the sub-pixel may include four straight sides, at least two adjacent straight sides are connected by a curved segment, and the curved segment forms a rounded corner. However, embodiments of the present disclosure are not limited thereto. The pattern of the opening of the sub-pixel may also include three straight sides, five straight sides or six straight sides, and the number of vertex corners included in the opening may vary accordingly.

For example, an orthographic projection of the opening of the pixel defining layer on the base substrate falls within an orthographic projection of the corresponding light emitting layer on the base substrate, that is, the light emitting layer covers the opening of the pixel defining layer. For example, the area of the light emitting layer is greater than the area of the corresponding opening of the pixel defining layer, that is, in addition to the portion inside the opening of the pixel defining layer, the light emitting layer further includes at least a portion covering a physical structure of the pixel defining layer. The light emitting layer generally covers the physical structure of the pixel defining layer at each boundary of the opening of the pixel defining layer.

For example, the light emitting layers of the fourth sub-pixel SP4 and the sixth sub-pixel SP6 adjacent to each other may or may not overlap on the pixel defining layer. For example, the light emitting layers of the fourth sub-pixel SP4 and the fifth sub-pixel SP5 adjacent to each other may or may not overlap on the pixel defining layer. For example, the light emitting layers of the fifth sub-pixel SP5 and the sixth sub-pixel SP6 adjacent to each other may or may not overlap on the pixel defining layer.

Figure 10:
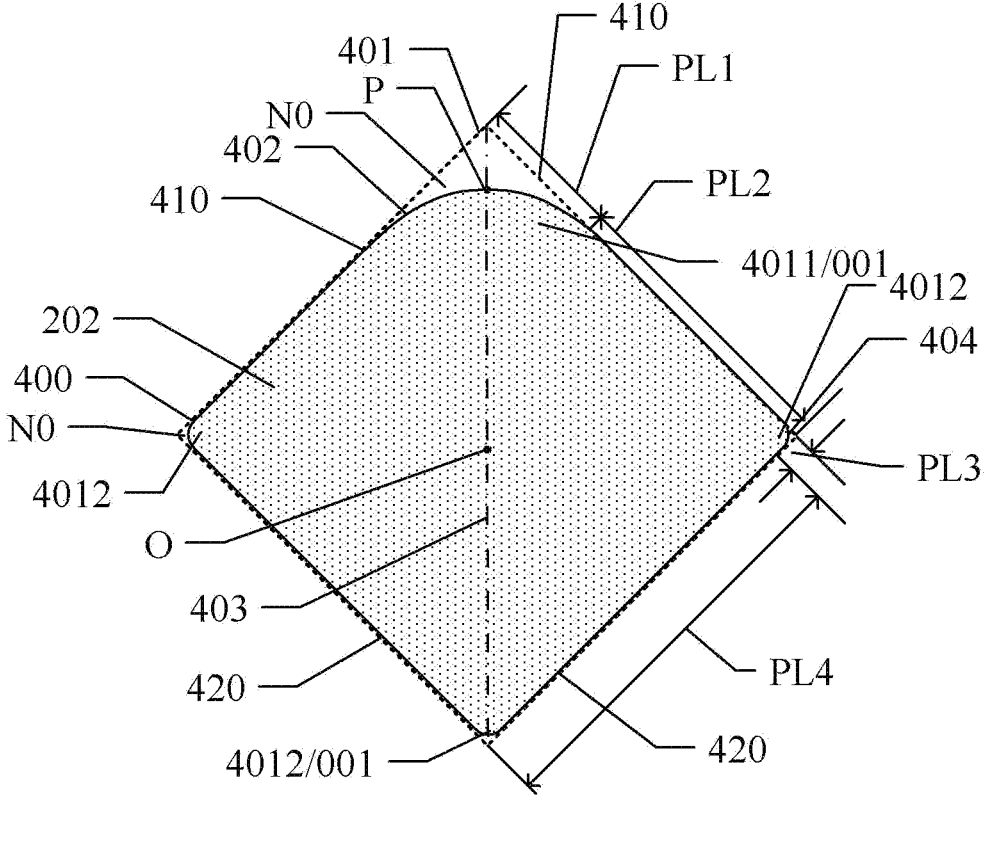
FIG. 10 shows a schematic diagram of a shape of an opening shown in FIG. 7B.

FIG. 10 shows a schematic diagram of a shape of an opening shown in FIG. 7B. As shown in FIG. 7B and FIG. 10, sides or extension lines of these sides of the opening 201, 202, or 203 are connected in sequence to form a polygon 400. A plurality of corner portions of the opening 201, 202, or 203 of at least one sub-pixel may include at least a first corner portion 4011. An area of a non-overlapping region NO of the first corner portion 4011 and a vertex corner 401 of the polygon 400 corresponding to the first corner portion 4011 is greater than an area of a non-overlapping region NO of at least one other corner portion and a vertex corner 401 of the polygon 400 corresponding to the corner portion.

For example, FIG. 10 schematically shows that all vertex corners of the polygon 400 have the non-overlapping regions NO, but embodiments of the present disclosure are not limited thereto, and some of the vertex corners of the polygon may have no non-overlapping region.

For example, as shown in FIG. 7B and FIG. 10, in at least two sub-pixels having different colors (for example, the fourth sub-pixel and the sixth sub-pixel, or the fourth sub-pixel and the fifth sub-pixel, or the sixth sub-pixel and the fifth sub-pixel, or the fourth sub-pixel, the sixth sub-pixel and the fifth sub-pixel), the shape of the opening 201, 202, or 203 may be obtained by cutting off at least one first vertex corner 401 of the polygon 400. For example, a cut line 402 used to cut off the first vertex corner 401 of the polygon 400 may include a line segment with a regular shape, such as a curve or a straight line, or may be a line segment with an irregular shape.

For example, embodiments of the present disclosure schematically show that the polygon 400 is a quadrilateral. For example, the shape of the polygon corresponding to sub-pixels having at least one color may be a rhombus, a rectangle or a square, but embodiments of the present disclosure are not limited thereto. The polygon 400 may also be a triangle, a pentagon or a hexagon, etc., which is not limited in embodiments of the present disclosure. For example, the vertex corners of the polygon may have equal or unequal angles.

As shown in FIG. 7B and FIG. 10, the vertex corners of the opening 202 include the first corner portion 4011, and the first corner portion 4011 is formed by cutting off the first vertex corner 401 between two first sides 410 of the polygon 400. For example, a ratio of a length of a cut portion PL1 of at least one of the two first sides 410 to a length of the first side 410 is in a range of 0.2 to 0.8. A remaining portion PL2 of the first side 410 of the polygon 400 obtained by cutting off the first line segment PL1 forms a side for connecting an opening 202 of the first corner portion 4011. For example, both ends of the first corner portion 4011 are connected to two straight sides of the opening 202, respectively, and at least one of the two straight sides is a remaining straight side obtained by cutting off the first line segment PL1 from the first side 410 of the polygon 400.

For example, at least one first vertex corner 301 may be cut off from the polygon 400 to form at least one first corner portion 4011. For example, the polygon 400 includes a plurality of first vertex corners 401 with equal degrees, and a plurality of first corner portions 4011 formed by cutting off the plurality of first vertex corners 401 have same parameters such as shape and size.

As shown in FIG. 7B and FIG. 10, the ratio of the length of the first line segment PL1 to the length of the first side 410 is in a range of 0.2 to 0.8. For example, the ratio of the length of the first line segment PL1 to the length of the first side 410 is in a range of 0.3 to 0.7; for example, the ratio of the length of the first line segment PL1 to the length of the first side 410 is in a range of 0.4 to 0.6; for example, the ratio of the length of the first line segment PL1 to the length of the first side 410 is 0.5.

For example, as shown in FIG. 7B and FIG. 10, a ratio of the length of the first line segment PL1 to a length of the remaining portion PL2 is in a range of 0.25 to 4. For example, the ratio of the length of the first line segment PL1 to the length of the remaining portion PL2 is in a range of 1 to 3. The ratio of the length of the first line segment PL1 to the length of the remaining portion PL2 is in a range of 0.5 to 2.

For example, as shown in FIG. 7B and FIG. 10, at least two types of sub-pixels having different colors include different numbers of first corner portions 4011. For example, two types of sub-pixels having different colors including different numbers of first corner portions 4011 may mean that: the sub-pixels having the same color include the same number of first corner portions, while in two sub-pixels having different colors, the number of first corner portions in one sub-pixel is different from the number of first corner portions in the other sub-pixel having a different color. For example, two types of sub-pixels 100 having different colors including different numbers of first corner portions 4011 may also mean that: the sub-pixels having the same color include the same number of first corner portions, while the sub-pixels having different colors include different total numbers of first corner portions due to different numbers of sub-pixels having different colors.

For example, as shown in FIG. 7B and FIG. 10, at least two types of sub-pixels having different colors include different numbers of first corner portions 4011, which may help adjust brightness centers in at least part of the display region to obtain a more uniform distribution.

For example, as shown in FIG. 7B, the openings of sub-pixels having a same color have a same area, and the openings of sub-pixels having different colors have different areas.

For example, the opening includes one first corner portion 4011, a geometric center of the opening 202 is located on a side of a midpoint of a line 403, which connecting a vertex of the first vertex corner 301 and a vertex of a vertex corner opposite to the first corner portion 4011, away from the first corner portion 4011. By adjusting the geometric centers of at least some light emitting regions, the brightness centers in at least part of the display region may be adjusted to obtain a more uniform distribution.

For example, as shown in FIG. 7B and FIG. 10, in the display substrate provided by embodiments of the present disclosure, the shapes of some sub-pixels may be adjusted so that in at least two types of sub-pixels having different colors among the fourth sub-pixel, the sixth sub-pixel and the fifth sub-pixel, a distance from the geometric center of the light emitting region of the sub-pixel to an intersection point of extension lines of two straight sides connected to both ends of the first corner portion is different from a distance from the geometric center of the light emitting region of the sub-pixel to an intersection point of two straight sides or their extension lines forming the vertex corner opposite to the first corner portion of the light emitting region, so as to adjust an actual brightness center of each dummy pixel unit to obtain a more uniform distribution of actual brightness centers in the display substrate.

For example, the number of first corner portions 4011 in a sub-pixel having a color is one, and the number of first corner portions 4011 in a sub-pixel having another color is greater than one, and may be, for example, two, three or four. For example, the number of first corner portions 4011 in a sub-pixel having a color may be two, and the number of first corner portions 4011 in a sub-pixel having another color may be three or four. For example, the number of first corner portions 4011 in a sub-pixel having a color may be three, and the number of first corner portions 4011 in a sub-pixel having another color may be four. The number of first corner portions in sub-pixels having different colors is not limited in embodiments of the present disclosure and may be set according to actual product requirements.

For example, as shown in FIG. 7B and FIG. 10, the first corner portion 4011 includes a vertex P, and the vertex P may be on the connecting line 403. A curve (i.e., an outer edge of the first corner portion) is formed by extending two sides connected with two ends of the first corner portion 4011 toward the vertex P, and then the first corner portion 4011 is a rounded chamfer. In this case, the first corner portion 4011 may be in a range of x microns along the outline centered on the vertex P, and a value of x may range from 2 microns to 7 microns. When the first corner portion is a rounded chamfer and the vertex corner opposite to the first corner portion in the shape of the opening is a right angle or an acute angle, a distance from the geometric center O of the opening to the intersection point of the extension lines of the two straight sides connected with the two ends of the first corner portion is greater than a distance from the geometric center O to the intersection point of the extension lines of the two straight sides forming the vertex corner opposite to the first corner portion.

The above-mentioned "rounded chamfer" refers to a vertex corner formed by a curve. The curve may be an arc, or may be an irregular curve such as a curve extracted from an ellipse, a wavy line, and so on. Embodiments of the present disclosure schematically show that the curve has a convex shape with respect to the geometric center O of the opening, but the present disclosure is not limited thereto. The curve may also have a concave shape with respect to the geometric center O of the opening. For example, when the curve is a convex arc, a central angle of the arc may range from 10° to 150°. For example, the central angle of the arc may range from 60° to 120°. For example, the central angle of the arc may be 90°. For example, a curve length of the rounded chamfer included in the first corner portion 4011 may range from 10 microns to 60 microns.

For example, the first corner portion 4011 is a rounded chamfer, a radius of curvature may range from 5 microns to 20 microns.

For example, as shown in FIG. 7B, the opening 201 of the fourth sub-pixel SP4, the opening 202 of the fifth sub-pixel SP5 and the opening 203 of the sixth sub-pixel SP6 all include the first corner portion 4011, and the number of first corner portions 4011 in sub-pixels having different colors varies.

In embodiments of the present disclosure, as an example, the sub-pixels having the same color include the same number of first corner portions having the same shape (including parameters such as length and curvature), while the first corner portions in the sub-pixels having different colors have the same shape, but the present disclosure is not limited to this. The first corner portions in the sub-pixels having different colors may have the same or different shapes.

FIG. 8 shows a schematic diagram of a partial structure of a display substrate in a first display region according to some exemplary embodiments of the present disclosure, in which a repetitive unit is schematically shown. FIG. 9 schematically shows a pixel arrangement structure in a connection region between a first display region and a second display region. It should be noted that, in embodiments of FIG. 9, the pixel arrangement in the first display region AA1 adopts an implementation shown in FIG. 8, and the pixel arrangement in the second display region AA2 adopts an implementation shown in FIG. 7B. However, embodiments of the present disclosure are not limited thereto. The pixel arrangement in the first display region AA1 according to each embodiment of the present disclosure may be used in combination with the pixel arrangement in the second display region AA2 shown in FIG. 7A or FIG. 7B in case of no conflicts.

It should be noted that the sub-pixel in the first display region AA1 may include a first light emitting device. For example, the first light emitting device may include an anode structure, a light emitting material layer and a cathode structure that are stacked. It should be noted that, for the sake of clarity, the anode structure of the first light emitting device is used in related figures (e.g., FIG. 8) to schematically show the first light emitting device. For example, in the first display region AA1, the anode structure of the first light emitting device includes an anode body 501 and an anode connection portion 502. An orthographic projection of the anode body 501 on the base substrate 1 may have a regular shape, such as rectangle, rounded rectangle, etc. The first display region AA1 is further provided with a pixel driving circuit (to be described below) for driving the first light emitting device, and the anode connection portion 502 is electrically connected to the pixel driving circuit of the first light emitting device through an anode connection hole 503.

Each sub-pixel in the first display region AA1 may include a first light emitting device 41. For example, the first light emitting device 41 may include an anode structure, a light emitting material layer and a cathode structure that are stacked. It should be noted that, for the sake of clarity, the anode structure of the first light emitting device 41 is used in FIG. 8 to schematically show the first light emitting device 41. For example, the first display region AA1 includes a plurality of first light emitting devices 41 arranged in an array, and the first light emitting devices 41 are used to emit light.

It should be noted that in FIG. 8 and similar figures below, an innermost pattern represents the opening or the light emitting region of a sub-pixel, and an outline which has a larger area than the pattern of the opening or the light emitting region of the sub-pixel and which substantially surrounds the opening is an outline of the anode structure of the sub-pixel, and an outermost outline is an outline of an opening of a sub-pixel in the second display region having the same color as the sub-pixel and corresponding to the sub-pixel.

Referring to FIG. 8 and FIG. 9, for the first repetitive unit P1 in the first display region AA1, a pattern of an ortho-graphic projection of the first opening 101 of the first sub-pixel SP1 on the base substrate 1 has a shape of a droplet, a pattern of an orthographic projection of the third opening 103 of the third sub-pixel SP3 on the base substrate 1 is a circle, and a pattern of an orthographic projection of the second opening 102 of the second sub-pixel SP2 on the base substrate 1 is a circle.

In one first repetitive unit P1, the patterns of the orthographic projections of the first openings 101 of two first sub-pixels SP1 on the base substrate 1 have a first center 1011 and a third center 1012, respectively, and the patterns of the orthographic projections of the third openings 103 of two third sub-pixels SP3 on the base substrate 1 have a second center 1031 and a fourth center 1032, respectively. The first center 1011, the second center 1031, the third center 1012 and the fourth center 1032 are connected in sequence to form a first quadrilateral S1, and at least two sides of the first quadrilateral S1 have different lengths.

As shown in FIG. 8, the first quadrilateral S1 has four sides SL1, SL2, SL3 and SL4. The side SL1 connects the first center 1011 and the second center 1031, the side SL2 connects the second center 1031 and the third center 1012, the side SL3 connects the third center 1012 and the fourth center 1032, and the side SL4 connects the fourth center 1032 and the first center 1011. For example, the length of the side SL1 is substantially equal to the length of the side SL3, the length of the side SL2 is greater than the length of the side SL1 or the length of the side SL3, and the length of the side SL4 is less than the length of the side SL1 or the length of the side SL3.

For example, the first quadrilateral S1 may be an isosceles trapezoid, or a trapezoid, or an irregular quadrilateral with four sides that are not equal to each other.

Continuing to refer to FIG. 8 and FIG. 9, the first opening 101 of at least one first sub-pixel includes a body portion 101A and an auxiliary portion 101B. An orthographic projection of the body portion 101A of the first opening on the base substrate 1 is a circle. An orthographic projection of the auxiliary portion 101B of the first opening on the base substrate 1 protrudes in the second arrangement direction Y relative to the circle.

A pattern of the orthographic projection of the body portion 101A of the first opening on the base substrate 1 has a first center of circle 1013. For the first opening 101 with the first center 1011, the first center 1011 of the first opening is offset by a first offset distance DP1 in the second arrangement direction Y relative to the first center of circle 1013 of the body portion of the first opening. For the first opening 101 with the third center 1012, the third center 1012 of the first opening is offset by a second offset distance DP2 in the second arrangement direction Y relative to the first center of circle 1013 of the body portion of the first opening.

For example, the first offset distance DP1 is substantially equal to the second offset distance DP2.

For the first opening 101 with the first center 1011, a line connecting the first center of circle 1013 of the first opening 101 and the second center 1031 is substantially parallel to the first arrangement direction X. For the first opening 101 with the third center 1012, a line connecting the first center of circle 1013 of the first opening 101 and the fourth center 1032 is substantially parallel to the first arrangement direction X. Referring to FIG. 8 and FIG. 9, for sub-pixels in a same row, the first center of circle 1013 of the first opening 101 and the center of the second opening 102 (that is, the center of circle of the second opening 102) located in the first display region AA1 and the center of the fourth opening 201 and the center of the fifth opening 202 located in the second display region AA2 are located on a straight line parallel to the first arrangement direction X: the center of the third opening 103 (that is, the center of circle of the third opening 103) located in the first display region AA1 and the center of the sixth opening 203 located in the second display region AA2 are located on a straight line parallel to the first arrangement direction X.

Referring to FIG. 8, the line connecting the first center 1011 and the second center 1031 (i.e., the side SL1) forms a first inclination angle with respect to the first arrangement direction X, and the first inclination angle is greater than 0° and less than 30°. The line connecting the third center 1012 and the fourth center 1032 (i.e., the side SL3) forms a second inclination angle with respect to the first arrangement direction X, and the second inclination angle is greater than 0° and less than 30°. For example, the first inclination angle may be substantially equal to the second inclination angle.

Continuing to refer to FIG. 8, the orthographic projection of at least one second opening 102 on the base substrate 1 falls within the first quadrilateral S1 and has a fifth center 1021. In embodiments shown in FIG. 8, the orthographic projection of the second opening 102 on the base substrate 1 is a circle, and the fifth center 1021 is the center of circle of the second opening 102.

A separation distance (SY1 in FIG. 8) between the fifth center 1021 and the first center 1011 in the second arrangement direction Y is not equal to a separation distance (SY2 in FIG. 8) between the fifth center 1021 and the fourth center 1032 in the second arrangement direction Y. For example, the separation distance SY2 may be greater than the separation distance SY1.

A separation distance (SY3 in FIG. 8) between the fifth center 1021 and the second center 1031 in the second arrangement direction Y is not equal to a separation distance (SY4 in FIG. 8) between the fifth center 1021 and the third center 1012 in the second arrangement direction Y. For example, the separation distance SY4 may be greater than the separation distance SY3.

Continuing to refer to FIG. 8, in one first repetitive unit P1, patterns of orthographic projections of the second openings 102 of the four second sub-pixels on the base substrate 1 have a fifth center 1021, a sixth center 1022, a seventh center 1023, and an eighth center 1024, respectively. The fifth center 1021, the sixth center 1022, the seventh center 1023 and the eighth center 1024 are connected in sequence to form a second quadrilateral S2. The lengths of the four sides of the second quadrilateral S2 are substantially equal to each other. For example, the second quadrilateral S2 is a square.

FIG. 11A to FIG. 15C respectively show schematic diagrams of a partial structure of a display substrate in a first display region according to some exemplary embodiments of the present disclosure, in which a first repetitive unit is schematically shown.

It should be noted that, in embodiments of the present disclosure, a sub-pixel having a certain color is illustrated by way of example in describing a shape, a protruding direction and other characteristics of the opening of the sub-pixel in the first repetitive unit. In case of no conflicts, the shape, the protruding direction and other characteristics of the opening of the sub-pixel in the first repetitive unit may be applied to sub-pixels having other colors, such as the red sub-pixel, the blue sub-pixel and the green sub-pixel. In case of no conflicts, the various technical means described with respect to FIG. 8 and FIG. 11A to FIG. 15C may be freely combined.

It should also be noted that in the following descriptions, features and differences in embodiments that are not described above will be mainly described, and for the same parts of embodiments, reference may be made to the foregoing description of the embodiments.

As shown in FIG. 11A to FIG. 15C, the sub-pixels in the first repetitive unit P1 may be reduced in proportion to the sub-pixels in the second repetitive unit P2 shown in FIG. 7B. For example, an area of the orthographic projection of the first opening 101 on the base substrate 1 is less than an area of the orthographic projection of the fourth opening 201 on the base substrate 1. For example, the area of the orthographic projection of the first opening 101 on the base substrate 1 may be 40% to 80% of the area of the orthographic projection of the fourth opening 201 on the base substrate 1. An area of the orthographic projection of the second opening 102 on the base substrate 1 is less than an area of the orthographic projection of the fifth opening 202 on the base substrate 1. For example, the area of the orthographic projection of the second opening 102 on the base substrate 1 may be 40% to 80% of the area of the orthographic projection of the fifth opening 202 on the base substrate 1. An area of the orthographic projection of the third opening 103 on the base substrate 1 is less than an area of the orthographic projection of the sixth opening 203 on the base substrate 1. For example, the area of the orthographic projection of the third opening 103 on the base substrate 1 may be 40% to 80% of the area of the orthographic projection of the sixth opening 203 on the base substrate 1.

Figure 11A:
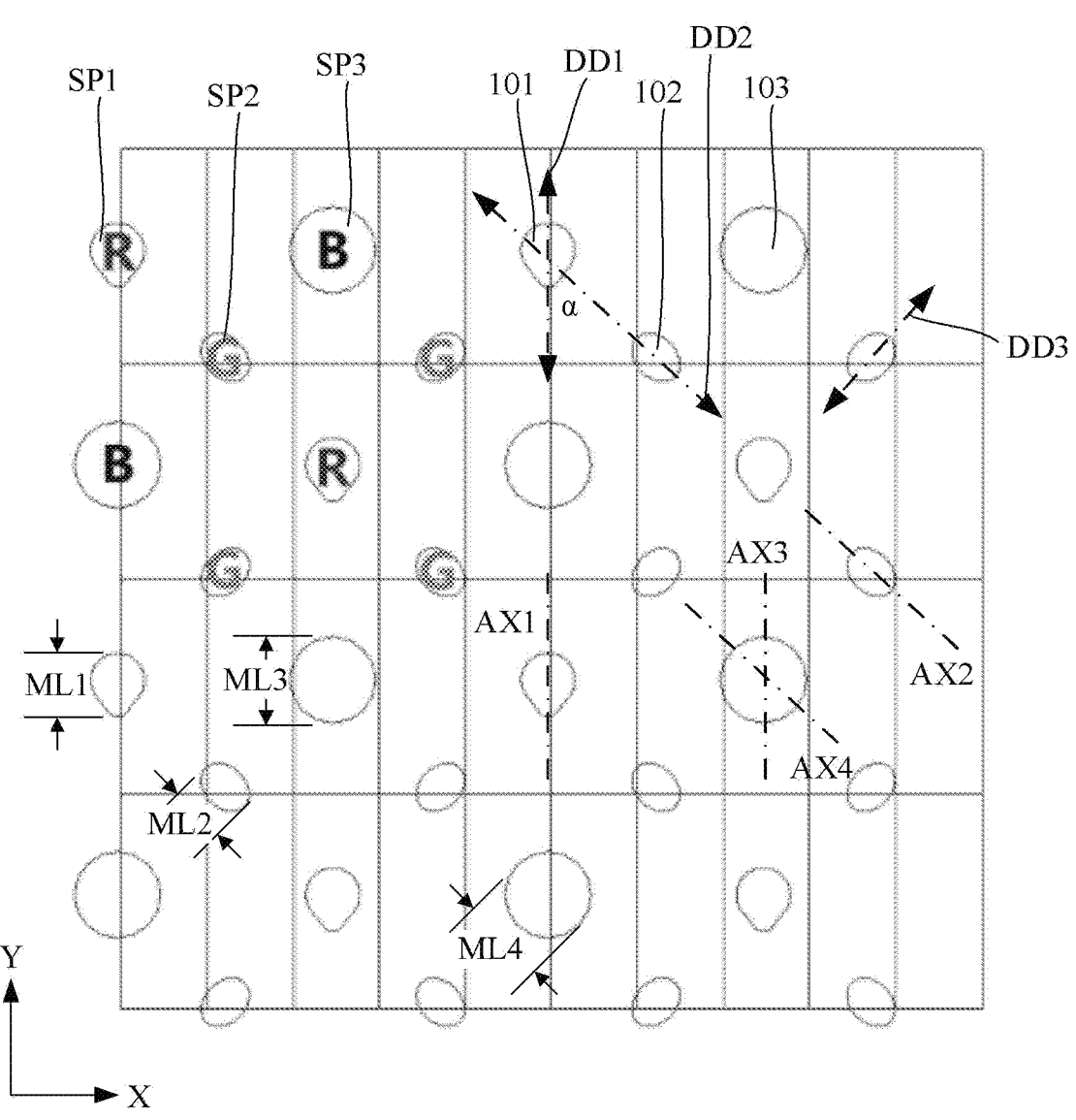
FIG. 11A to FIG. 15C respectively show schematic diagrams of a partial structure of a display substrate in a first display region according to some exemplary embodiments of the present disclosure, in which a first repetitive unit is schematically shown.
Figure 11B:
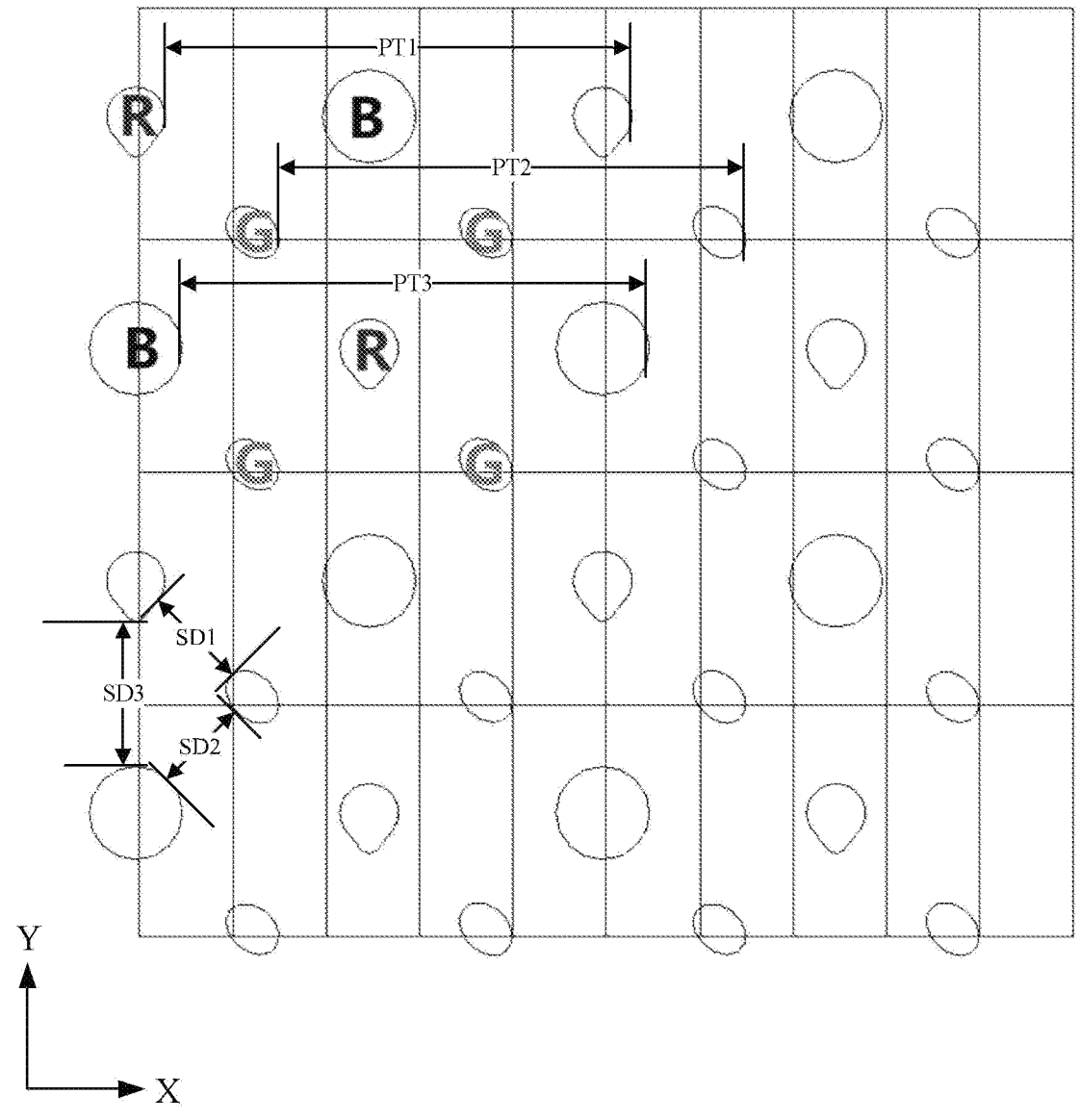
Figure 11C:
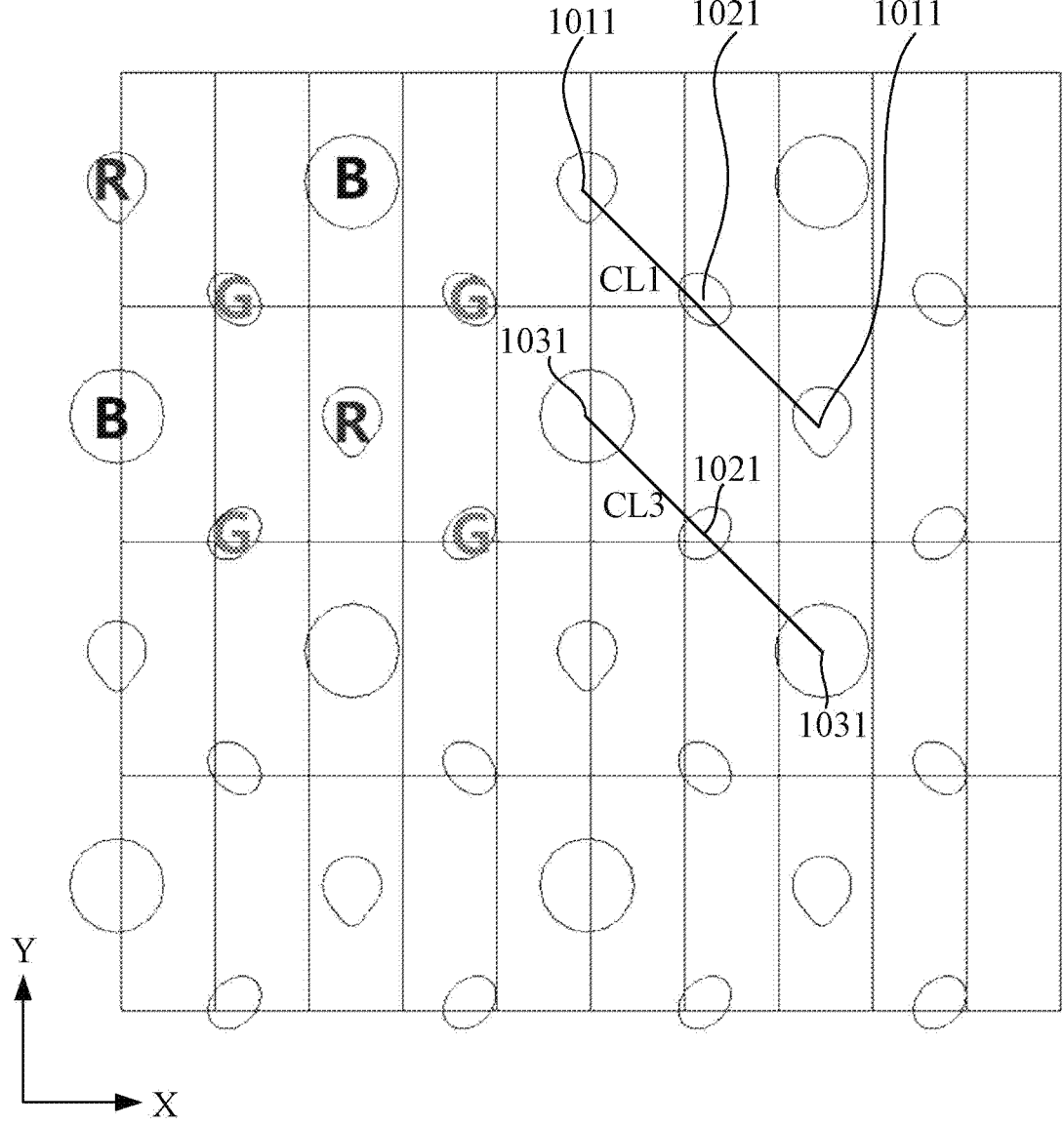

For example, referring to FIG. 11A to FIG. 11C, the orthographic projection of the first opening 101 on the base substrate has a shape of a droplet, the orthographic projection of the second opening 102 on the base substrate has an elliptical shape, and the orthographic projection of the third opening 103 on the base substrate has a circular shape.

Figure 12A:
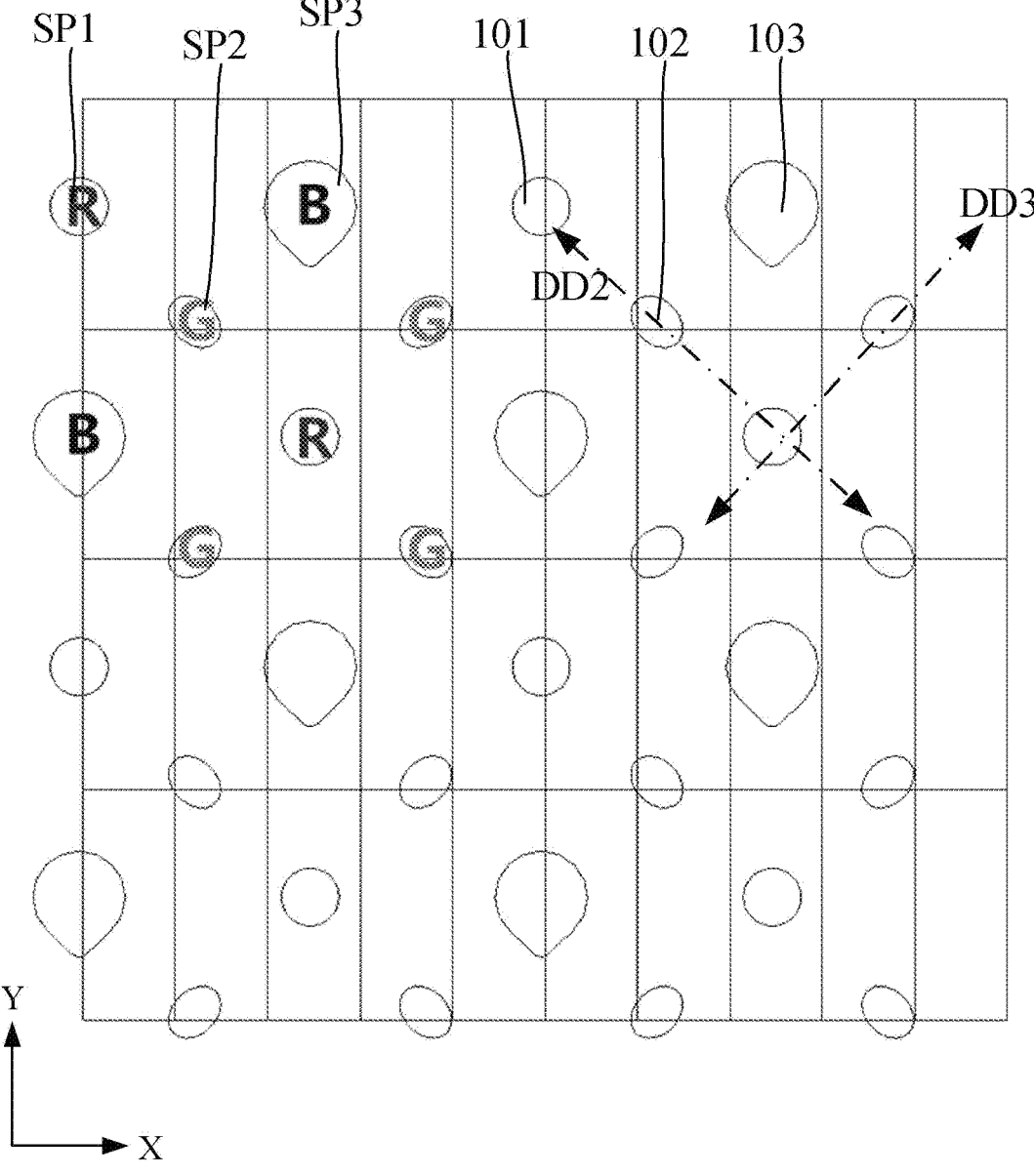
Figure 12B:
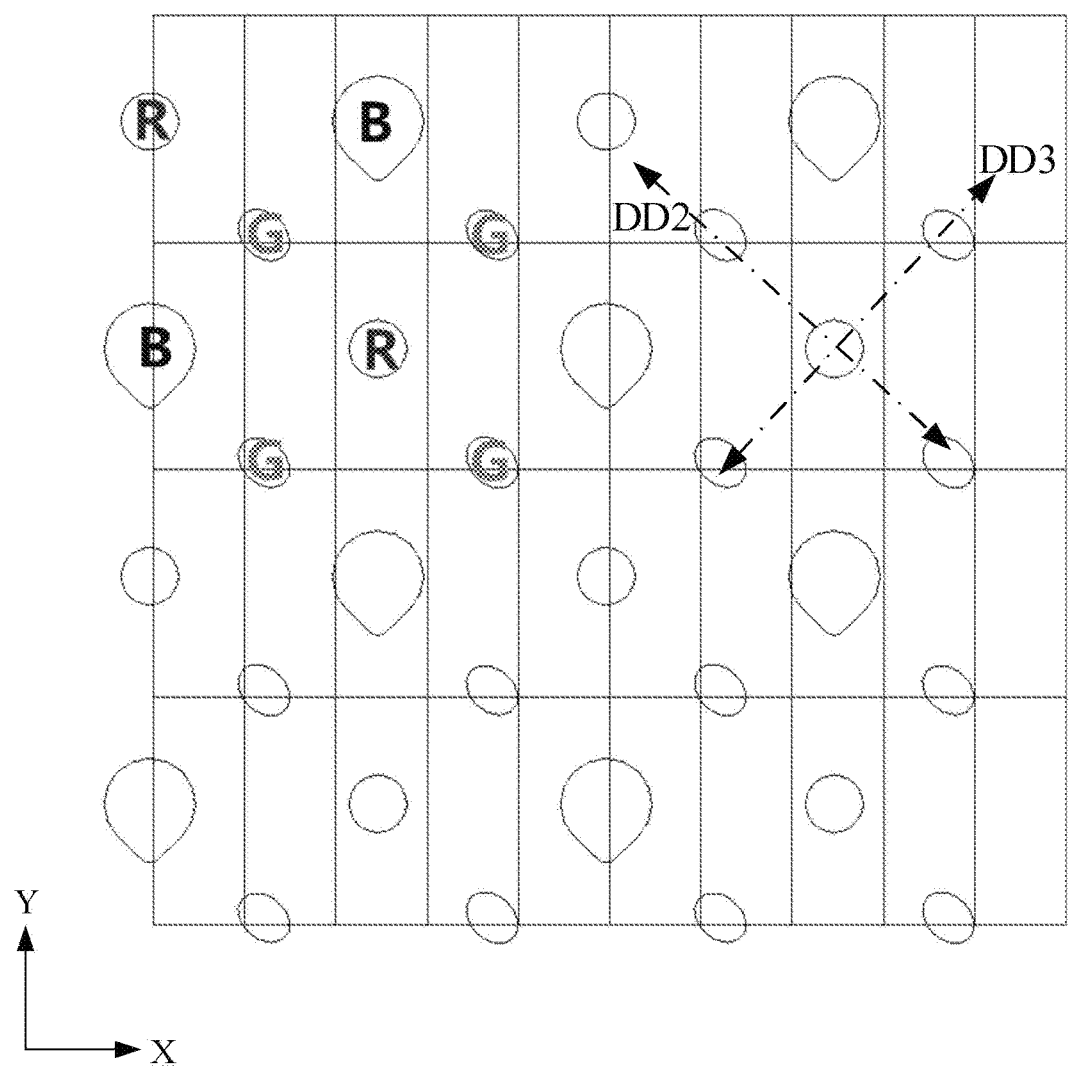
Figure 12C:
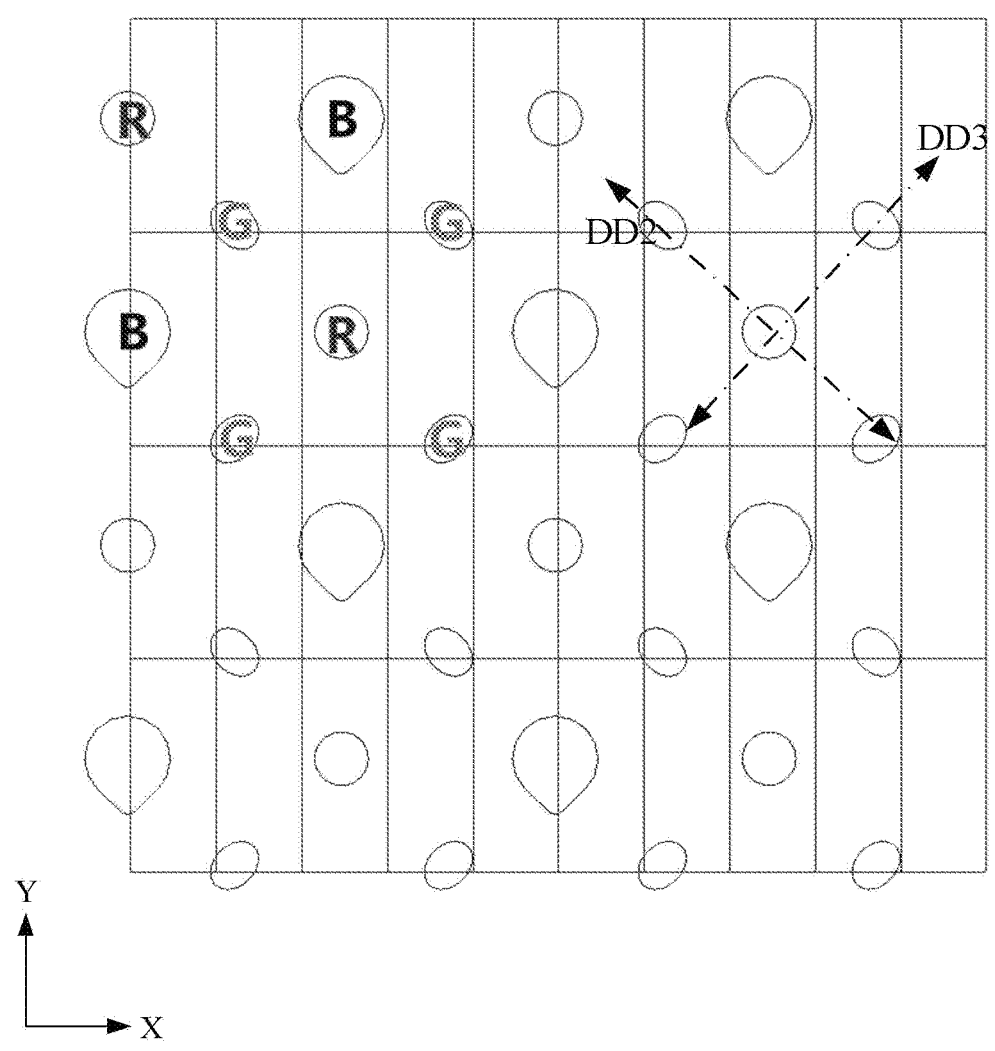

For example, referring to FIG. 12A to FIG. 12C, the orthographic projection of the first opening 101 on the base substrate has a circular shape, the orthographic projection of the second opening 102 on the base substrate has an elliptical shape, and the orthographic projection of the third opening 103 on the base substrate has a shape of a droplet.

Figure 13A:
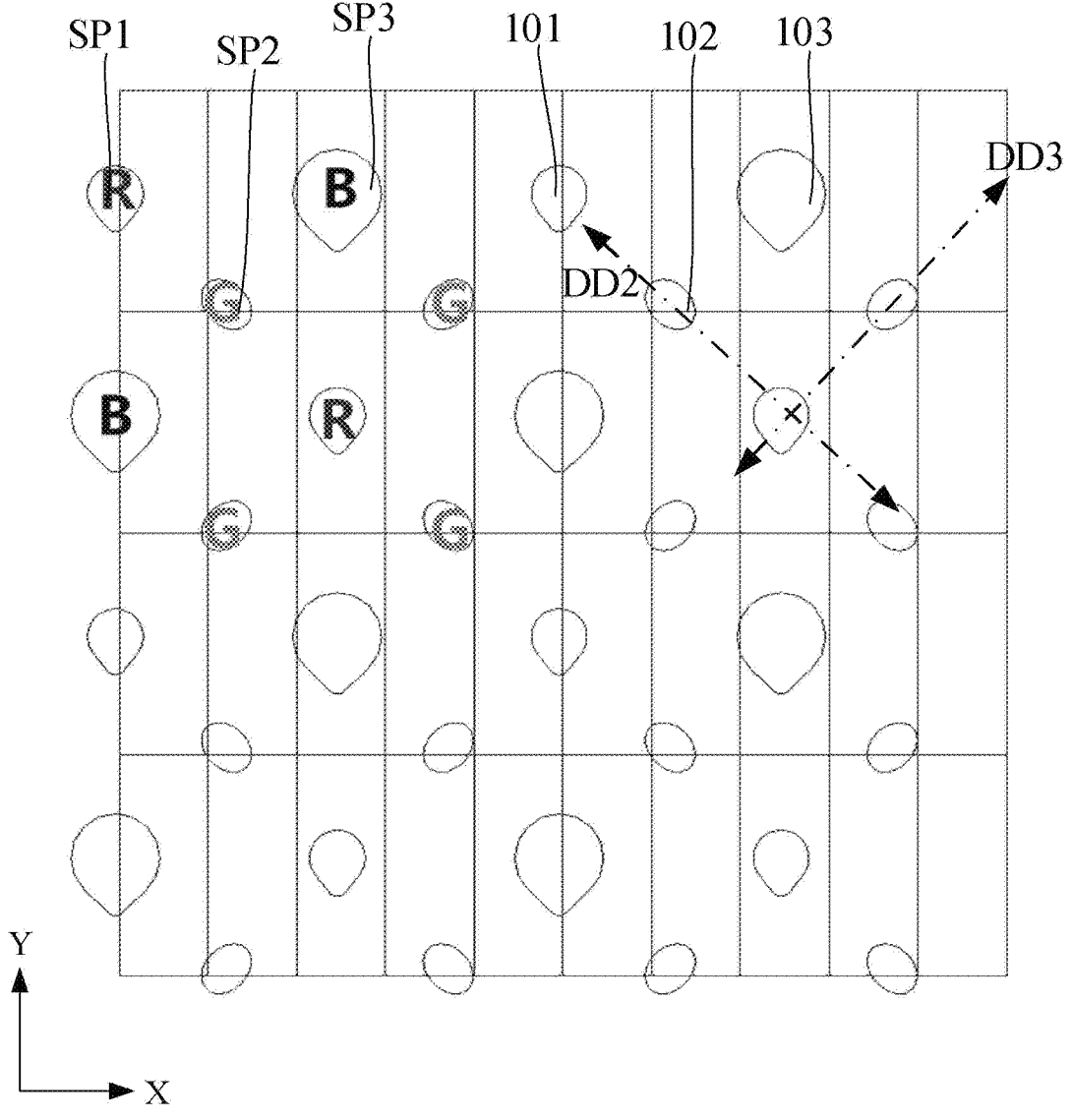
Figure 13B:
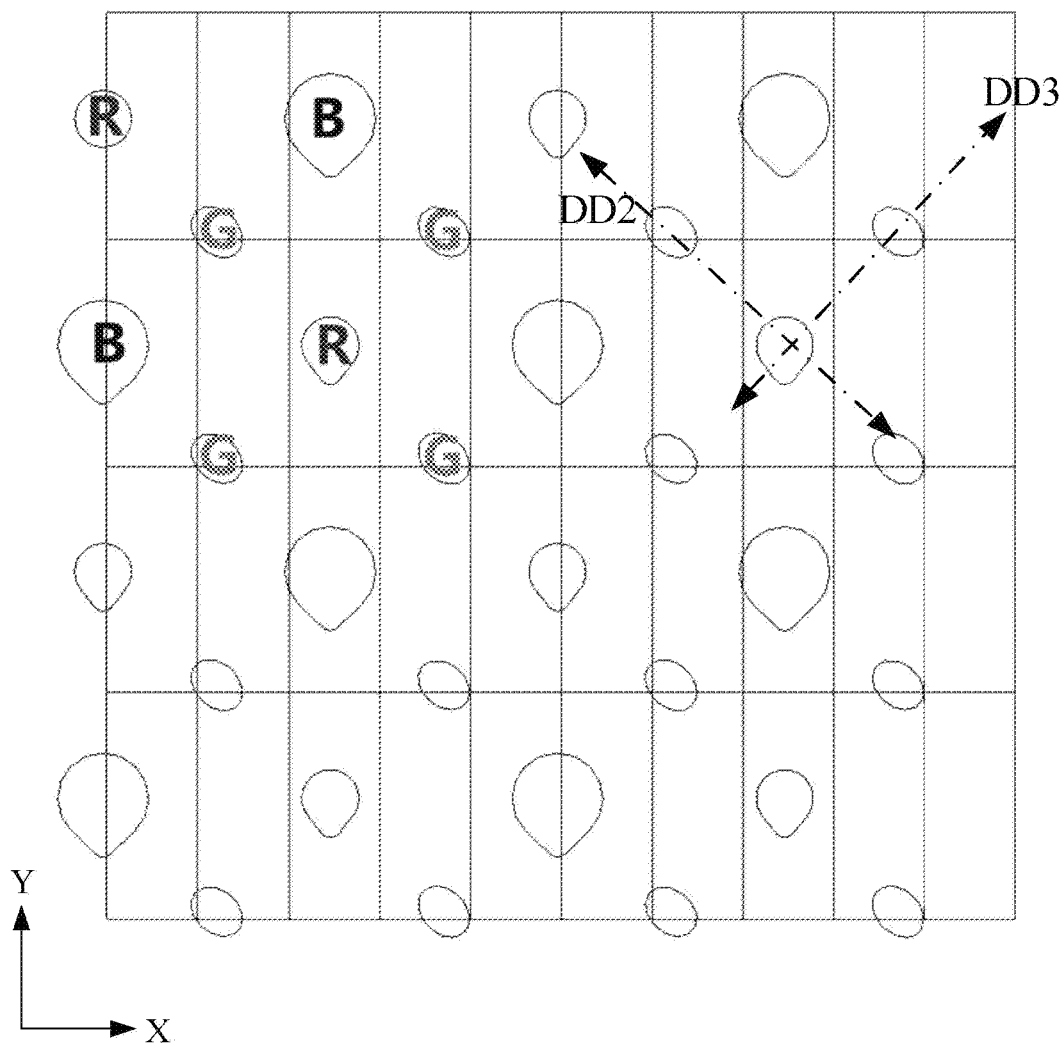
Figure 13C:
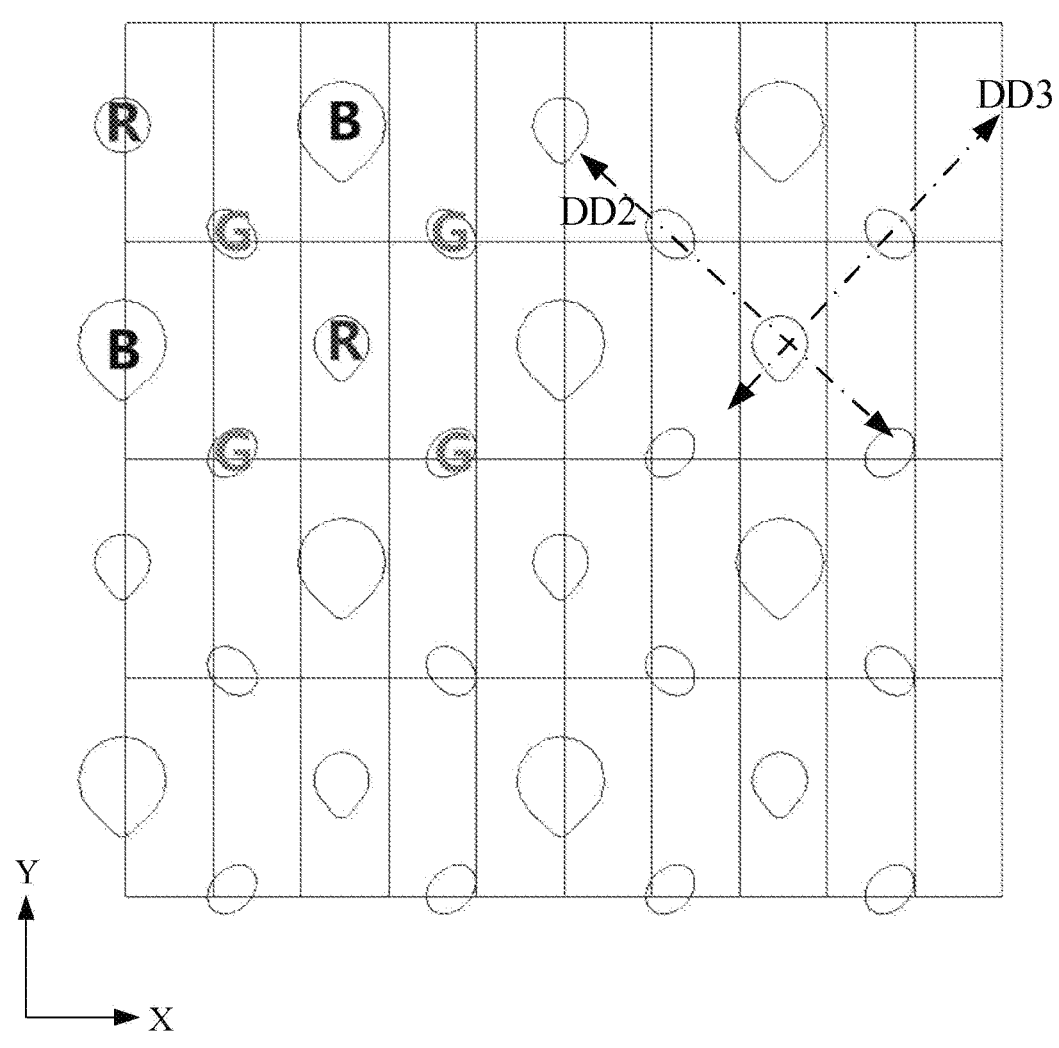

For example, referring to FIG. 13A to FIG. 13C, the orthographic projection of the first opening 101 on the base substrate has a shape of a droplet, the orthographic projection of the second opening 102 on the base substrate has an elliptical shape, and the orthographic projection of the third opening 103 on the base substrate has a shape of a droplet.

Figure 14A:
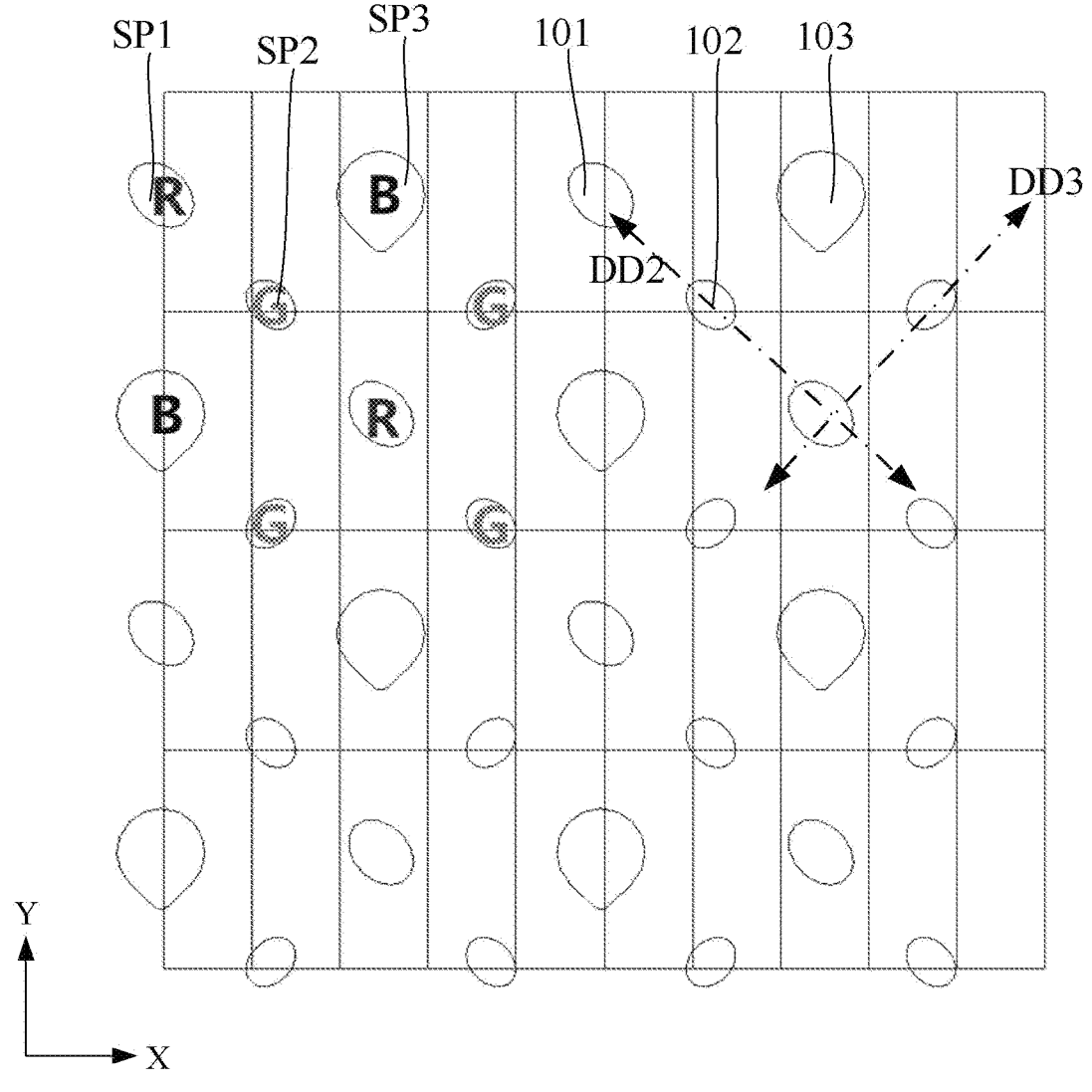
Figure 14B:
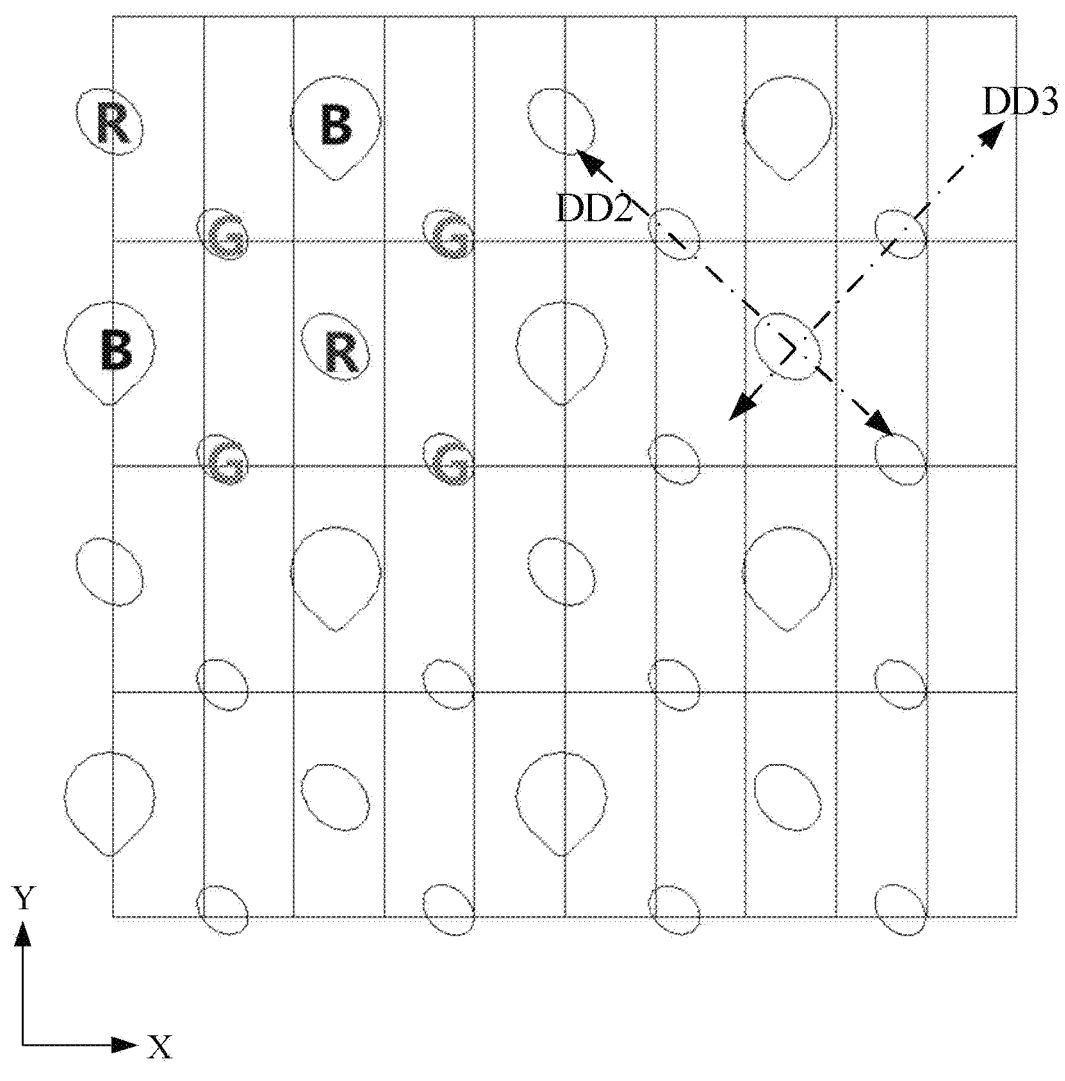
Figure 14C:
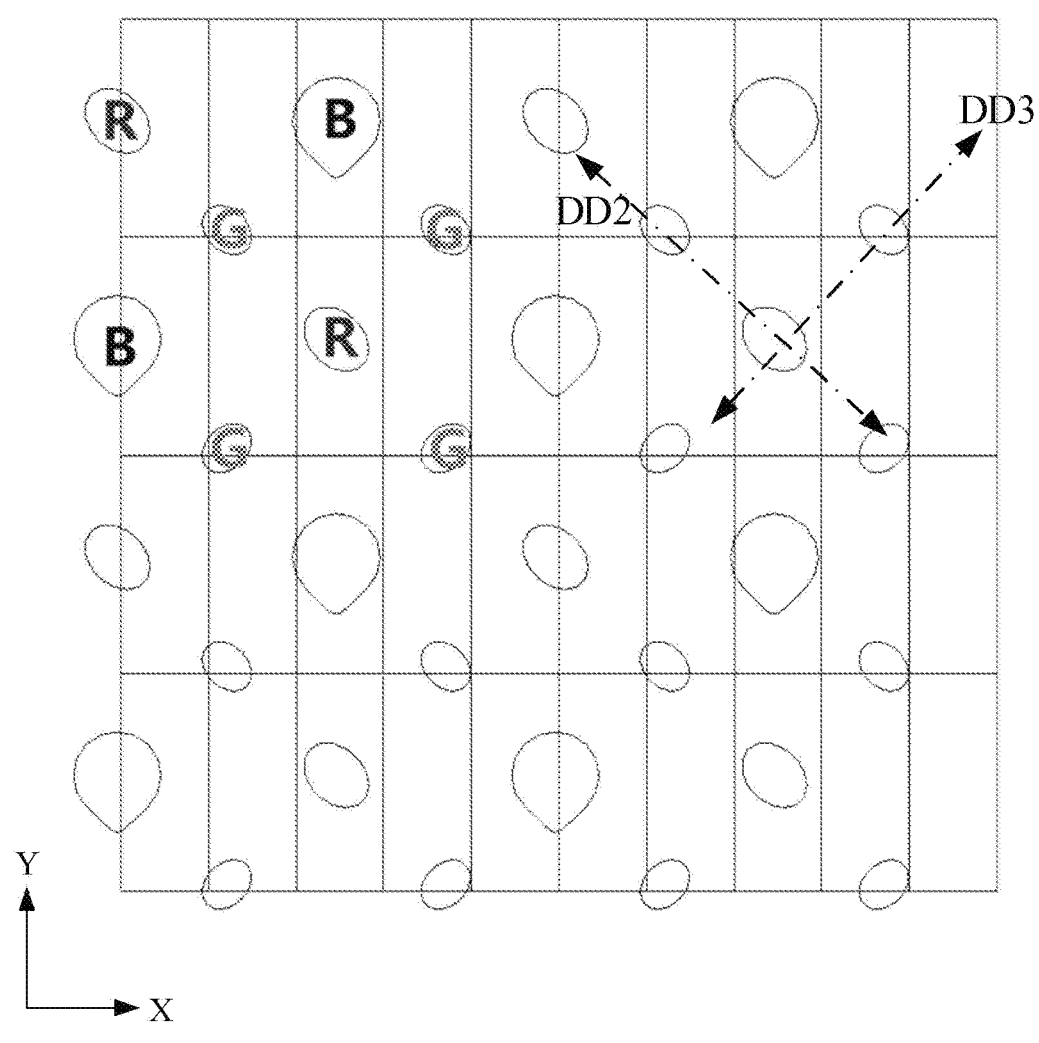

For example, referring to FIG. 14A to FIG. 14C, the orthographic projection of the first opening 101 on the base substrate has an elliptical shape, the orthographic projection of the second opening 102 on the base substrate has an elliptical shape, and the orthographic projection of the third opening 103 on the base substrate has a shape of a droplet.

Figure 15A:
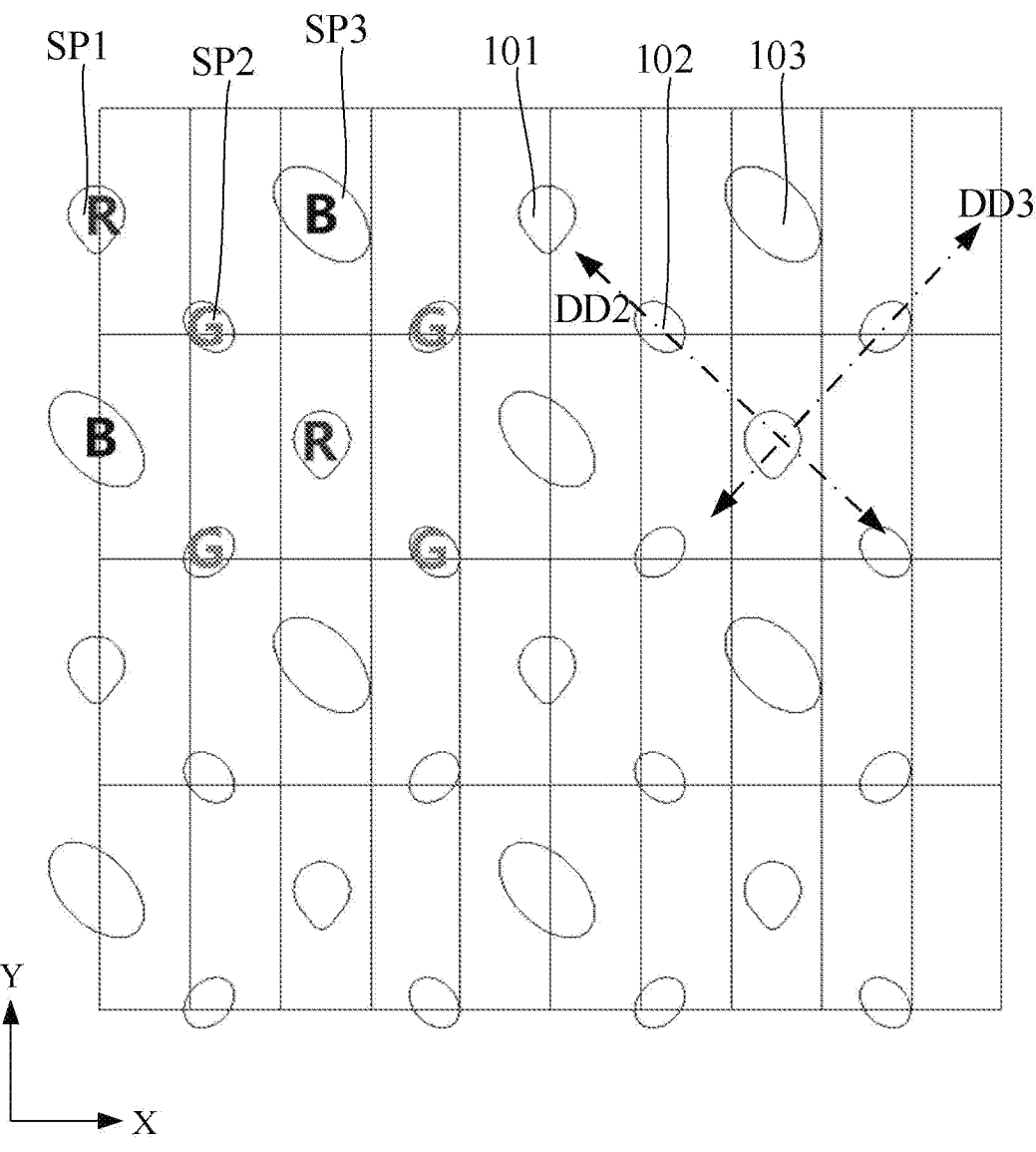
Figure 15B:
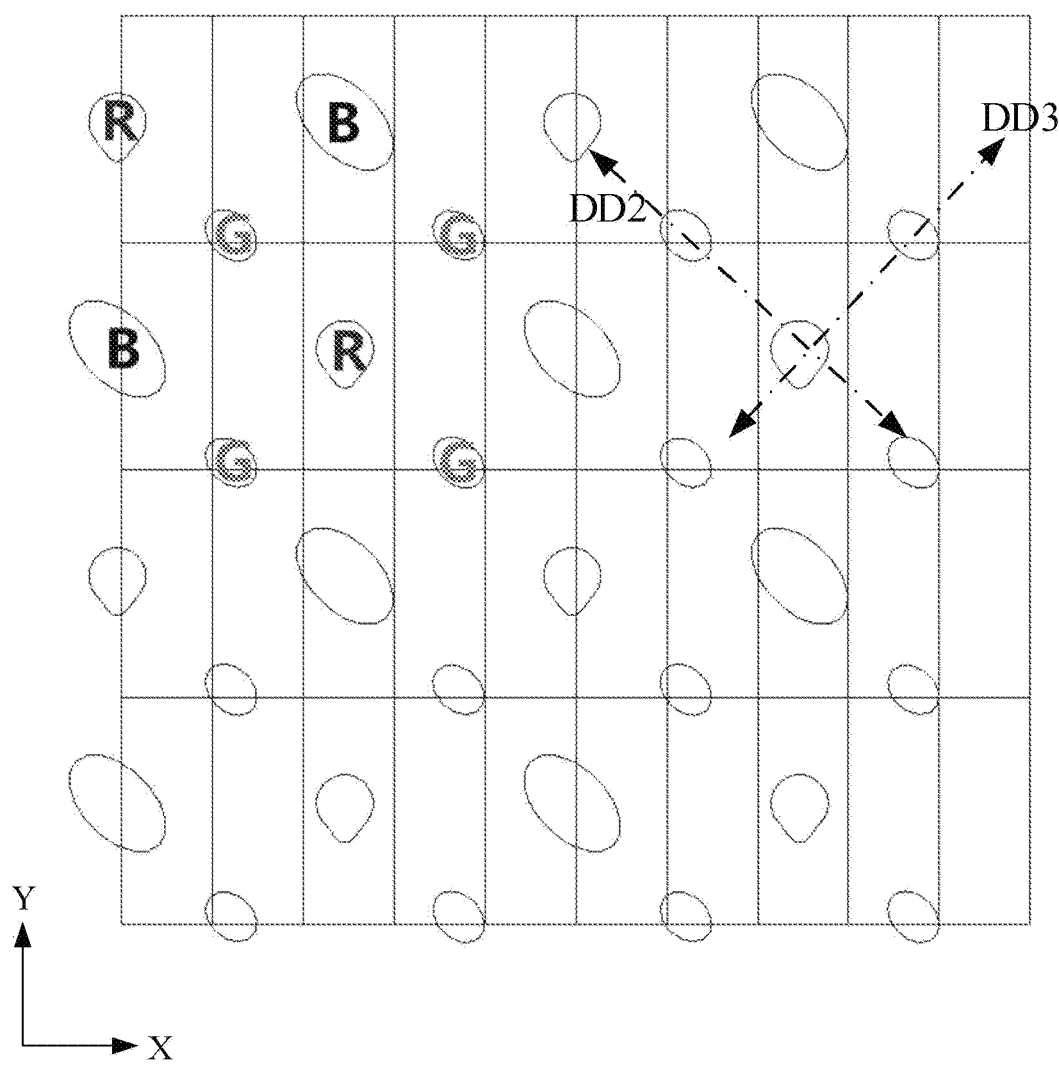
Figure 15C:
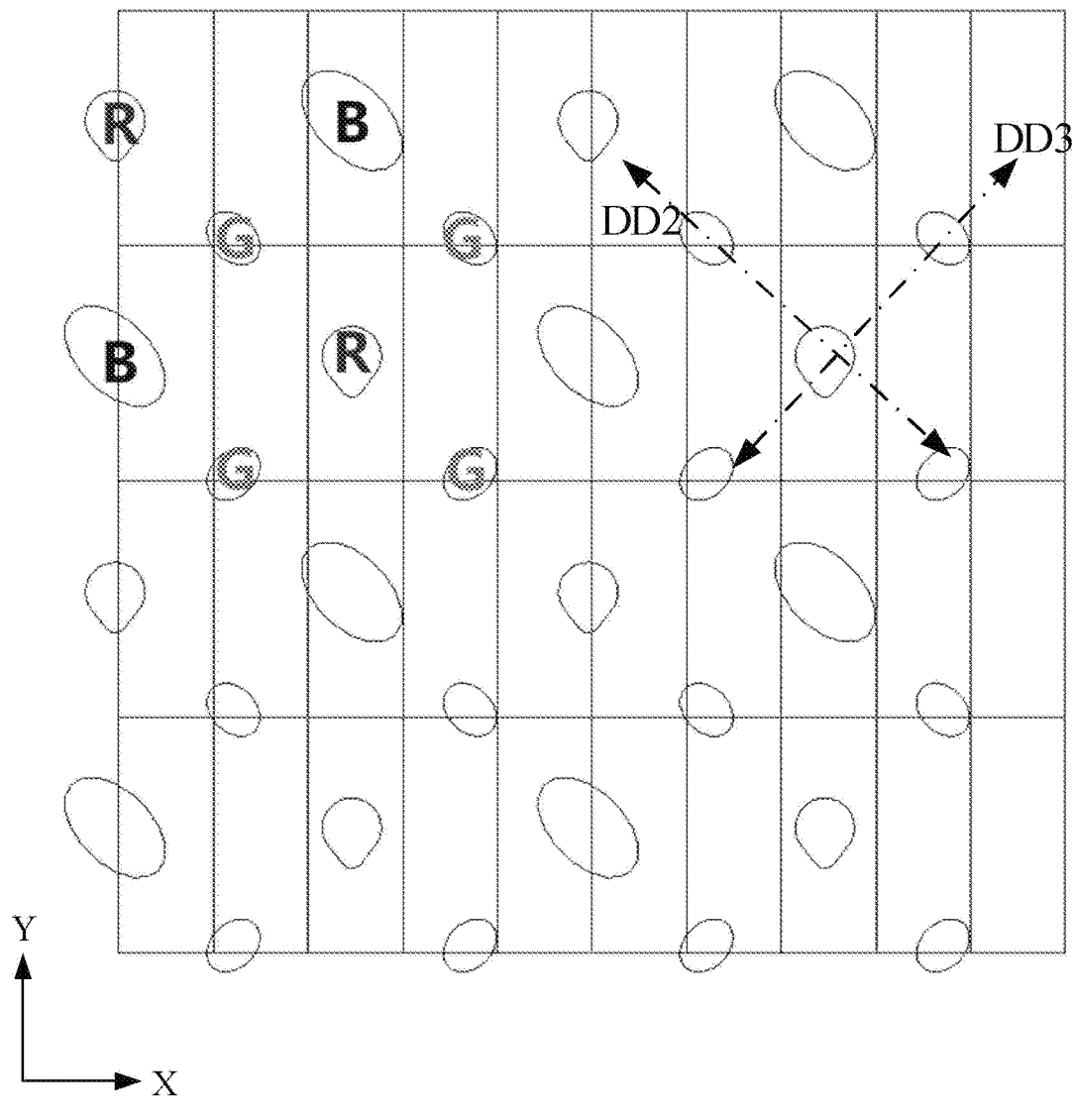

For example, referring to FIG. 15A to FIG. 15C, the orthographic projection of the first opening 101 on the base substrate has a shape of a droplet, the orthographic projection of the second opening 102 on the base substrate has an elliptical shape, and the orthographic projection of the third opening 103 on the base substrate has an elliptical shape.

In embodiments of the present disclosure, at least one of the orthographic projection of the first opening 101 on the base substrate 1, the orthographic projection of the second opening 102 on the base substrate 1, or the orthographic projection of the third opening 103 on the base substrate 1 is an ellipse. Through such arrangement, a diffraction phenomenon in the under-screen imaging region may be reduced or eliminated while ensuring the aperture ratio of the pixel in the under-screen imaging region, which helps to improve the display effect and the imaging effect.

Referring to FIG. 11A to FIG. 15C, in embodiments of the present disclosure, in one first pixel structure (that is, first repetitive unit P1), the pattern of the orthographic projection of the first opening 101 of the at least one first sub-pixel SP1 on the base substrate has a maximum size in the first direction, and the pattern of the orthographic projection of the second opening 102 of the at least one second sub-pixel SP2 on the base substrate has a maximum size in the second direction.

It should be noted that herein, unless otherwise specified, the "maximum size" of the opening means a linear distance between two farthest points on an outline of the opening. For example, in a case of an opening having a shape of a droplet, the "maximum size" of the opening means the linear distance between a vertex of a protruding portion of the shape of a droplet and a point opposite to the vertex on the outline of the opening: in a case of an opening having an elliptical shape, the "maximum size" of the opening means a linear distance between two opposite points on the outline of the opening along a major axis of the elliptical shape.

Figure 11D:
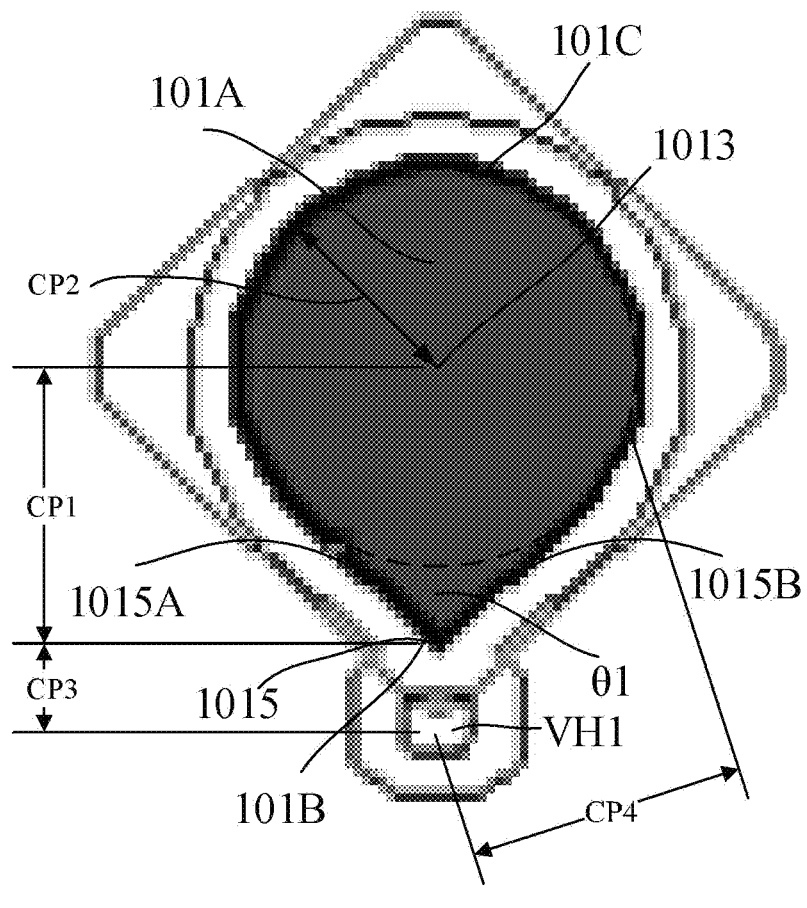

FIG. 11D shows a partial enlarged view of a first opening in FIG. 11A. Referring to FIG. 11A and FIG. 11D, the orthographic projection of the first opening 101 on the base substrate 1 has a shape of a droplet. For example, the first opening 101 of at least one first sub-pixel includes a body portion 101A and an auxiliary portion 101B, an orthographic projection of the body portion 101A of the first opening on the base substrate 1 is a circle, and an orthographic projection of the auxiliary portion 103B of the first opening on the base substrate 1 protrudes in the second arrangement direction Y relative to the circle of the body portion 103A of the first opening.

Referring to FIG. 11D, the orthographic projection of the auxiliary portion 101B of the first opening 101 on the base substrate 1 protrudes, relative to the circle of the body portion 101A of the first opening 101, toward an orthographic projection of an anode connection hole VH1 of the first sub-pixel where the first opening 101 is located on the base substrate 1.

For example, the auxiliary portion 101B of the first opening 101 has a sharp corner portion or a rounded corner portion on a side facing the anode connection hole VH1 of the first sub-pixel. For example, a radius of curvature of the rounded corner portion ranges from 1 micron to 10 microns.

In other words, in embodiments of the present disclosure, the auxiliary portion 101B of the first opening 101 has a first corner portion 1015 on the side facing the anode connection hole VH1 of the first sub-pixel. For example, the first corner portion 1015 may be a sharp corner or a rounded corner.

Referring to FIG. 11D, the orthographic projection of the body portion 101A of the first opening 101 on the base substrate includes a first arc 101C. An orthographic projection of the first corner portion 1015 on the base substrate includes a first side 1015A and a second side 1015B. The first side 1015A and the second side 1015B are respectively connected to the first arc 101C and are tangent to the first arc 101C at corresponding connecting points. An angle 01 formed between the first side 1015A and the second side 1015B ranges from 10° to 170°, for example, 10° to 90°, about 60°, etc.

The line connecting the first center 1011 and the fourth center 1032 is substantially parallel to the second arrangement direction Y; and/or, the line connecting the second center 1012 and the third center 1031 is substantially parallel to the second arrangement direction Y.

For example, referring to FIG. 11A to FIG. 11D, an outline of the pattern of the orthographic projection of the first opening 101 of the first sub-pixel SP1 on the base substrate includes an arc. The pattern of the orthographic projection of the first opening 101 of the first sub-pixel SP1 on the base substrate is axisymmetric in one of the first arrangement direction X and the second arrangement direction Y, and is non-axisymmetric in the other of the first arrangement direction X and the second arrangement direction Y. For example, as shown in FIG. 11A, the pattern of the orthographic projection of the first opening 101 of the first sub-pixel SP1 on the base substrate is axisymmetric in the second arrangement direction Y and non-axisymmetric in the first arrangement direction X.

For example, the outline of the pattern of the orthographic projection of the first opening 101 of the first sub-pixel SP1 on the base substrate includes an arc portion and a non-arc portion, the arc portion has a same center of circle, and a total length of the non-arc portion is less than a total length of the arc portion. For example, as shown in FIG. 11D, the outline of the pattern of the orthographic projection of the first opening 101 of the first sub-pixel SP1 on the base substrate includes an arc portion 101C and a non-arc portion, the arc portion 101C have a same center of circle 1013, and the total length of the non-arc portion is less than the total length of the arc portion 101C. For example, a ratio of the total length of the non-arc portion to the total length of the arc portion 101C ranges from 1 to 3 or from 1 to 4.

FIG. 11A schematically shows the first direction DD1 and the second direction DD2. Referring to FIG. 11A and FIG. 11D, the first opening 101 has a shape of a droplet, and the first direction DD1 is a straight-line direction passing through the vertex of the first corner portion 1015 and the center of circle 1013. The second opening 102 has a shape of an ellipse, and the second direction DD2 is an extending direction of the major axis of the ellipse.

In embodiments of the present disclosure, an angle $\alpha$ is formed between the first direction DD1 and the second direction DD2. For example, the angle $\alpha$ between the first direction DD1 and the second direction DD2 ranges from 0° to 160°.

In some embodiments, the first direction DD1 and the second direction DD2 intersect to form two complementary angles. Unless otherwise specified, the angle $\alpha$ may refer to a smaller one in the two complementary angles. In other words, the angle $\alpha$ between the first direction DD1 and the second direction DD2 is less than 90°. For example, in embodiments shown in FIG. 11A, the angle $\alpha$ between the first direction DD1 and the second direction DD2 may range from 30° to 60°, for example, about 45°.

Referring to FIG. 11A, the maximum size of the pattern of the orthographic projection of the first opening 101 of the at least one first sub-pixel SP1 on the base substrate in the first direction DD1 is denoted by ML1, and the maximum size of the pattern of the orthographic projection of the second opening 102 of the at least one second sub-pixel SP2 on the base substrate in the second direction DD2 is denoted by ML2. In some embodiments, a ratio of the maximum size ML1 of the first opening 101 to the maximum size ML2 of the second opening 102 is in a range of 0.2 to 2. For example, the ratio of ML1 to ML2 is in a range of 0.5 to 2, 0.5 to 1.8, 0.6 to 1.5, 0.7 to 1.5, 0.8 to 1.2, 0.7 to 2, 0.8 to 2, 1.1 to 2, 1.2 to 2, 1.2 to 1.8, 1.3 to 2, 1.4 to 2, 1.5 to 2, 1.3 to 1.8, etc. For another example, the ratio of ML1 to ML2 may be about 1.1, 1.2, 1.3, 1.4, 1.5, 1.6, 1.7, etc. For example, the ratio of the maximum size ML1 of the first opening 101 to the maximum size ML2 of the second opening 102 may be about 1, that is, the maximum size ML1 of the first opening 101 may be substantially equal to the maximum size ML2 of the second opening 102.

Continuing to refer to FIG. 11A to FIG. 15C, the pattern of the orthographic projection of the first opening 101 on the base substrate 1 is symmetrical with respect to a first axis of symmetry AX1 extending in the first direction DD1. The pattern of the orthographic projection of the first opening 101 on the base substrate 1 is asymmetrical with respect to a straight line extending in the second direction DD2. That is, the pattern of the orthographic projection of the first opening 101 on the base substrate 1 is a symmetrical pattern that is only symmetrical with respect to the first axis of symmetry AX1.

The pattern of the orthographic projection of the second opening 102 on the base substrate 1 is symmetrical with respect to a second axis of symmetry AX2 extending in the second direction DD2. Optionally, the pattern of the orthographic projection of the second opening 102 on the base substrate 1 is asymmetrical with respect to a straight line extending in the first direction DD1.

For example, in some embodiments of the present disclosure, the first direction DD1 is substantially parallel to the second arrangement direction Y. A major axis direction of the second opening 102 is inclined relative to the second arrangement direction Y. Therefore, the pattern of the orthographic projection of the second opening 102 on the base substrate 1 is asymmetrical with respect to the straight line extending in the first direction DD1 or the second arrangement direction Y. Through such arrangement, the diffraction in the first display region may be reduced, thereby improving the imaging effect of the under-screen camera.

Continuing to refer to FIG. 11A to FIG. 11C, the pattern of the orthographic projection of the third opening 103 on the base substrate 1 has a first size ML3 in the first direction DD1 and a second size ML4 in the second direction DD2. A ratio of the second size ML4 of the third opening to the first size ML3 of the third opening ranges from 0.8 to 1.2. For example, the second size ML4 of the third opening is substantially equal to the first size ML3 of the third opening.

For example, in embodiments shown in FIG. 11A to FIG. 11C, the third opening 103 has a circular shape, so that the maximum sizes of the third opening 103 in various directions (including the first direction DD1, the second direction DD2, the first arrangement direction X and the second arrangement direction Y) are a diameter of the circle.

In some embodiments of the present disclosure, at least one first pixel structure P1 includes at least two second sub-pixels SP2. For example, one first pixel structure P1 includes four second sub-pixels SP2.

In one first pixel structure P1, an angle is formed between the directions in which the patterns of the orthographic projections of the second openings 102 of at least two second sub-pixels on the base substrate have the maximum size ML2. That is, the patterns of the orthographic projections of the second openings 102 of the at least two second sub-pixels on the base substrate have the maximum size ML2 in different directions. Referring to FIG. 11A, in one first pixel structure P1, the pattern of the orthographic projection of the second opening of the second sub-pixel in a second row and a second column on the base substrate 1 and the pattern of the orthographic projection of the second opening of the second sub-pixel in a fourth row and a fourth column on the base substrate 1 have the maximum size ML2 in a direction extending from a lower right corner to an upper left corner, which is denoted as DD2 in FIG. 11A for ease of description. The pattern of the orthographic projection of the second opening of the second sub-pixel in a second row and a fourth column on the base substrate 1 and the pattern of the orthographic projection of the second opening of the second sub-pixel in a fourth row and a second column on the base substrate 1 have the maximum size ML2 in a direction extending from a lower left corner to an upper right corner, which is denoted as DD3 in FIG. 11A for ease of description. Referring to FIG. 11A, an angle is formed between the direction DD2 and the direction DD3. For example, the angle may be about 90°. That is, in some embodiments of the present disclosure, in one first pixel structure P1, the directions (e.g., extending directions of major axes) in which the patterns (e.g., ellipses) of the orthographic projections of the second openings 102 of two second sub-pixels adjacent in the first arrangement direction X on the base substrate 1 have the maximum size ML2 may be different from each other, for example, the two may be substantially perpendicular to each other. In one first pixel structure P1, the directions (e.g., extending directions of major axes) in which the patterns (e.g., ellipses) of the orthographic projections of the second openings 102 of two second sub-pixels adjacent in the second arrangement direction Y on the base substrate 1 have the maximum size ML2 may be different from each other, for example, the two may be substantially perpendicular to each other.

Referring to FIG. 11A to FIG. 15C, at least two of the pattern of the orthographic projection of the first opening 101 on the base substrate 1, the pattern of the orthographic projection of the second opening 102 on the base substrate 1, and the pattern of the orthographic projection of the third opening 103 on the base substrate 1 may have different shapes. For example, the shape of the pattern of the orthographic projection of the first opening 101 on the base substrate 1, the shape of the pattern of the orthographic projection of the second opening 102 on the base substrate 1 and the shape of the pattern of the orthographic projection of the third opening 103 on the base substrate 1 may be different from each other.

In some embodiments, the pattern of the orthographic projection of the first opening 101 on the base substrate 1, the pattern of the orthographic projection of the second opening 102 on the base substrate 1 and the pattern of the orthographic projection of the third opening 103 on the base substrate 1 do not have a same axis of symmetry. For example, each of the pattern of the orthographic projection of the first opening 101 on the base substrate 1, the pattern of the orthographic projection of the second opening 102 on the base substrate 1 and the pattern of the orthographic projection of the third opening 103 on the base substrate 1 has at least one axis of symmetry, and the at least one axis of symmetry of the pattern of the orthographic projection of the first opening 101 on the base substrate 1, the at least one axis of symmetry of the pattern of the orthographic projection of the second opening 102 on the base substrate 1 and the at least one axis of symmetry of the pattern of the orthographic projection of the third opening 103 on the base substrate 1 have different directions. For example, the patterns of the orthographic projections of the first opening 101, the second opening 102 and the third opening 103 in a same row on the base substrate 1 do not have a same axis of symmetry, or the patterns of the orthographic projections of the first opening 101, the second opening 102 and the third opening 103 in a same column on the base substrate 1 do not have a same axis of symmetry.

In some embodiments, two of the pattern of the orthographic projection of the first opening 101 on the base substrate 1, the pattern of the orthographic projection of the second opening 102 on the base substrate 1, and the pattern of the orthographic projection of the third opening 103 on the base substrate 1 have a same axis of symmetry. In other words, the patterns of the orthographic projections of two of the first opening 101, the second opening 102 and the third opening 103 in a same row on the base substrate 1 have a same axis of symmetry, or the patterns of the orthographic projections of two of the first opening 101, the second opening 102 and the third opening 103 in a same column on the base substrate 1 have a same axis of symmetry.

In embodiments of the present disclosure, at least part of each of the pattern of the orthographic projection of the first opening 101 on the base substrate 1, the pattern of the orthographic projection of the second opening 102 on the base substrate 1 and the pattern of the orthographic projection of the third opening 103 on the base substrate 1 includes a curved side. FIG. 17A to FIG. 17D schematically show some examples of the openings with the curved side, respectively. Referring to FIG. 17A to FIG. 17D, in embodiments of the present disclosure, the curved side may include at least one selected from: a concave curved side, a convex curved side, an arc-shaped side, a free curved side, or a wavy-line curved side.

In embodiments of the present disclosure, the pattern of the orthographic projection of the third opening 103 on the base substrate 1 is symmetrical with respect to a third axis of symmetry AX3 extending in the first direction DD1, and the pattern of the orthographic projection of the third opening 103 on the base substrate 1 is symmetrical with respect to a fourth axis of symmetry AX4 extending in the second direction DD2. For example, referring to FIG. 11A to FIG. 11C, the third opening 103 has a circular shape, which may have a plurality of axes of symmetry.

In some embodiments of the present disclosure, the number of axes of symmetry of the third opening 103 is greater than the number of axes of symmetry of the first opening 101 or the number of axes of symmetry of the second opening 102, and the number of axes of symmetry of the second opening 102 is greater than the number of axes of symmetry of the first opening 101. For example, referring to FIG. 11A to FIG. 11C, the orthographic projection of the first opening 101 on the base substrate has a shape of a droplet, and the first opening 101 has one axis of symmetry extending in the first direction DD1: the orthographic projection of the second opening 102 on the base substrate has an elliptical shape, and the second opening 102 has two axes of symmetry extending in the second direction DD2 (i.e., major axis direction of the ellipse) and the third direction DD3 (i.e., minor axis direction of the ellipse): the orthographic projection of the third opening 103 on the base substrate has a circular shape, and the third opening 103 has a plurality of axes of symmetry extending in a plurality of directions.

In embodiments of the present disclosure, a ratio of a pitch PT1 of the first openings 101 in the first arrangement direction X to a pitch PT2 of the second openings 102 in the first arrangement direction X ranges from 0.8 to 1.2. For example, the pitch PT1 of the first openings 101 in the first arrangement direction X is substantially equal to the pitch PT2 of the second openings 102 in the first arrangement direction X.

A ratio of the pitch PT2 of the second openings 102 in the first arrangement direction X to a pitch PT3 of the third openings 103 in the first arrangement direction X ranges from 0.8 to 1.2. For example, the pitch PT2 of the second openings 102 in the first arrangement direction X is substantially equal to the pitch PT3 of the third openings 103 in the first arrangement direction X.

A ratio of the pitch PT3 of the third openings 103 in the first arrangement direction X to the pitch PT1 of the first openings 101 in the first arrangement direction X ranges from 0.8 to 1.2. For example, the pitch PT3 of the third openings 103 in the first arrangement direction X is substantially equal to the pitch PT1 of the first openings 101 in the first arrangement direction X.

In one first pixel structure P1, a ratio of a minimum separation distance SD1 between the first opening 101 and the second opening 102 in the second direction DD2 to a minimum separation distance SD2 between the second opening 102 and the third opening 103 in the third direction DD3 ranges from 1.05 to 3, for example, from 1.1 to 2.8, from 1.2 to 2.6, from 1.4 to 2.5, from 1.1 to 2, from 1.3 to 3, from 1.4 to 2.8, from 1.5 to 3, from 1.5 to 2.8, from 1.5 to 2.5, from 1.5 to 2.

In one first pixel structure P1, a ratio of a minimum separation distance SD3 between the first opening 101 and the third opening 103 in the second arrangement direction Y to the minimum separation distance SD1 between the first opening 101 and the second opening 102 in the second direction DD2 ranges from 1.1 to 5, for example, from 1.15 to 4.8, from 1.2 to 4.6, from 1.5 to 4.5, from 2 to 4, from 1.15 to 5, from 1.2 to 5, from 1.5 to 4, from 2.5 to 4.

In embodiments of the present disclosure, in one first pixel structure, a vertical distance between a line CLI connecting the centers 1011 of the patterns of the orthographic projections of the first openings 101 of two first sub-pixels on the base substrate 1 and the center 1021 of the pattern of the orthographic projection of the second opening 102 of the second sub-pixel on the base substrate is not equal to a vertical distance between a line CL3 connecting the centers 1031 of the patterns of the orthographic projections of the third openings 103 of two third sub-pixels on the base substrate 1 and the center 1021 of the pattern of the orthographic projection of the second opening 102 of the second sub-pixel on the base substrate.

For example, referring to FIG. 11A to FIG. 11C, in one first pixel structure, the line CLI connecting the centers 1011 of the patterns of the orthographic projections of the first openings 101 of two first sub-pixels on the base substrate 1 does not pass through the center 1021 of the pattern of the orthographic projection of the second opening 102 of the second sub-pixel on the base substrate 1. In one first pixel structure, the line CL3 connecting the centers 1031 of the patterns of the orthographic projections of the third openings 103 of two third sub-pixels on the base substrate 1 does not pass through the center 1021 of the pattern of the orthographic projection of the second opening 102 of the second sub-pixel on the base substrate.

In one first pixel structure, two third sub-pixels SP3 are distributed symmetrically with respect to an axis of symmetry extending in one of the second direction DD2 and the third direction DD3. Two first sub-pixels SP1 are distributed asymmetrically with respect to a straight line extending in the other of the second direction DD2 and the third direction DD3.

In embodiments of the present disclosure, at least one of the first sub-pixel SP1, the third sub-pixel SP3, or the second sub-pixel SP2 includes a first-type sub-pixel, a second-type sub-pixel, a third-type sub-pixel, and a fourth-type sub-pixel. For different types of sub-pixels, protruding vertexes of the droplet-shaped openings protrude in different directions relative to body portions of respective circles. For example, the protruding vertexes of the openings in different types of sub-pixels may have different orientations.

For example, various types of sub-pixels have the same shape or the same area. For example, various types of sub-pixels have the same shape and the same area. For example, the numbers of different types of sub-pixels are substantially the same. For example, for the first-type sub-pixel, the second-type sub-pixel, the third-type sub-pixel and the fourth-type sub-pixel, a ratio of the number of one type of any two types of sub-pixels to the number of the other type of any two types of sub-pixels is 0.8 to 1.2. For example, the ratio of the number of the first-type sub-pixels to the number of the second-type sub-pixels is 0.8 to 1.2, and the ratio of the number of the third-type sub-pixels to the number of the fourth-type sub-pixels is 0.8 to 1.2.

In embodiments of the present disclosure, the first opening 101 of at least one first sub-pixel includes a body portion 101A and an auxiliary portion 101B. An orthographic projection of the body portion 101A of the first opening on the base substrate 1 is a circle, and an orthographic projection of the auxiliary portion 101B of the first opening on the base substrate 1 protrudes in a protruding direction relative to the circle. In one first pixel structure P1, the auxiliary portions 101A of the first openings 101 of two first sub-pixels SP1 protrude in the same protruding direction or different protruding directions.

For example, in one first pixel structure P1, the protruding directions of the auxiliary portions 101A of the first openings 101 of two first sub-pixels SP1 are parallel to the second arrangement direction Y and opposite to each other. Alternatively, in one first pixel structure P1, the protruding directions of the auxiliary portions 101A of the first openings 101 of two first sub-pixels SP1 are parallel to the first arrangement direction X and opposite to each other. Alternatively, in a plurality of first pixel structures P1, the protruding directions of the auxiliary portions 101A of the first openings 101 of some first sub-pixels SP1 are parallel to the second arrangement direction Y and opposite to each other, and the protruding directions of the auxiliary portions 101A of the first openings 101 of other first sub-pixels SP1 are parallel to the first arrangement direction X and opposite to each other.

Figure 16:
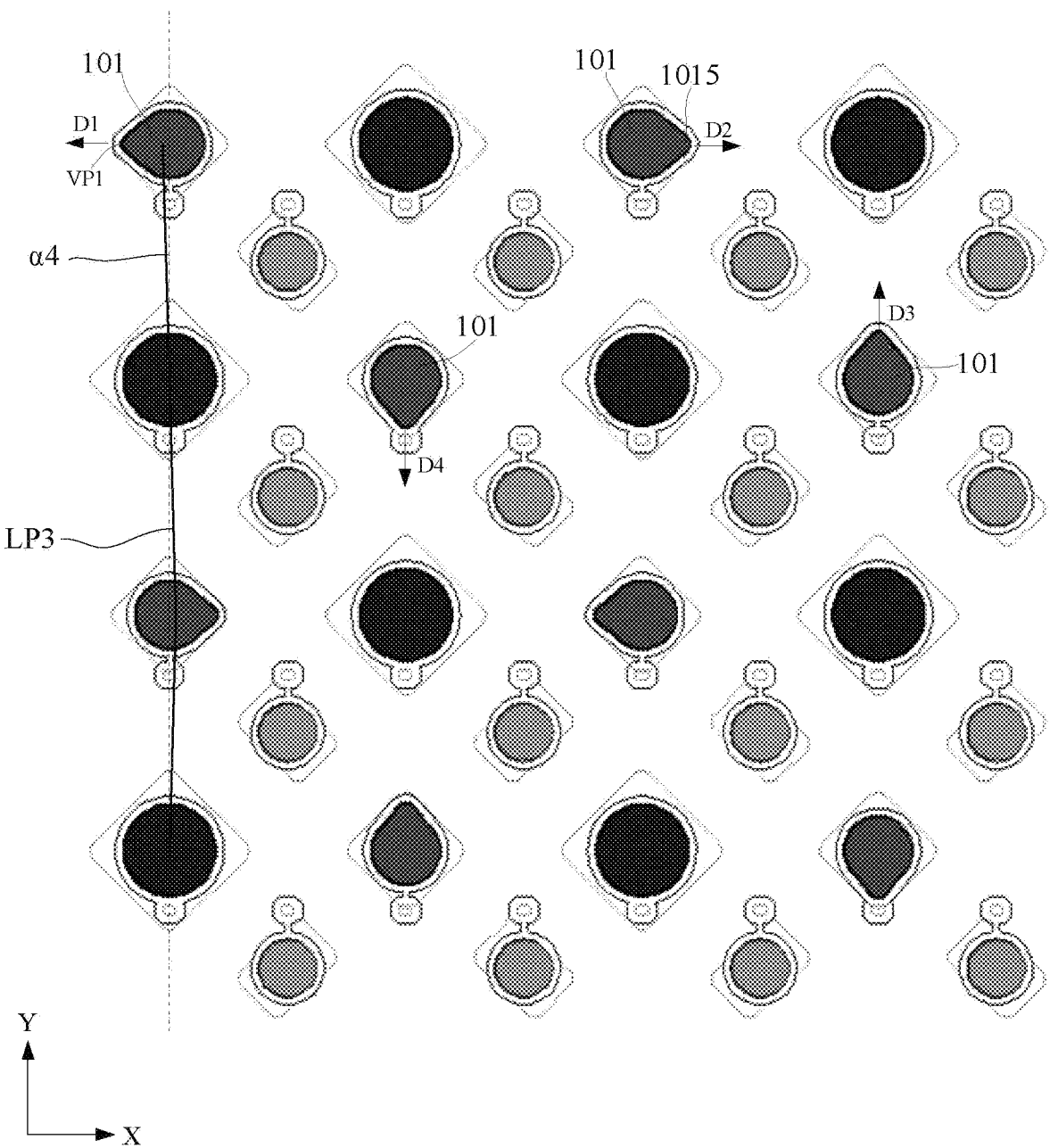
FIG. 16 shows a schematic diagram of a partial structure of a display substrate in a first display region according to some exemplary embodiments of the present disclosure, in which a pixel arrangement structure of a plurality of repetitive units in the first display region is schematically shown.
Figure 17A:
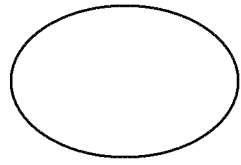
FIG. 17A to FIG. 17D schematically show some examples of an opening having a curved side, respectively.
Figure 17B:
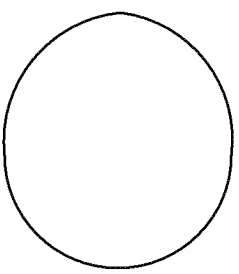
Figure 17C:
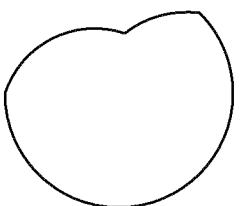
Figure 17D:
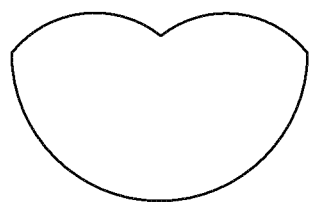

FIG. 16 shows a schematic diagram of a partial structure of a display substrate in a first display region according to some exemplary embodiments of the present disclosure, in which a pixel arrangement structure of a plurality of repetitive units in the first display region is schematically shown.

As shown in FIG. 16, for the first-type sub-pixel, the second-type sub-pixel, the third-type sub-pixel and the fourth-type sub-pixel, the protruding vertexes VP1 of the first openings 101 protrude toward a first protruding direction D1, a second protruding direction D2, a third protruding direction D3 and a fourth protruding direction D4, respectively. For example, in the first opening 101 of the first-type sub-pixel, the protruding vertex VP1 protrudes toward the first protruding direction D1: in the first opening 101 of the second-type sub-pixel, the protruding vertex VP1 protrudes toward the second protruding direction D2: in the first opening 101 of the third-type sub-pixel, the protruding vertex VP1 protrudes toward the third protruding direction D3; and in the first opening 101 of the fourth-type sub-pixel, the protruding vertex VP1 protrudes toward the fourth protruding direction D4.

As shown in FIG. 16, the first protruding direction D1 is opposite to the second protruding direction D2, and the third protruding direction D3 is opposite to the fourth protruding direction D4.

In the display substrate provided by embodiments of the present disclosure, a color shift problem during the display of the display substrate may be alleviated by providing four different types of sub-pixels.

In addition, generally, in a display substrate, for the sub-pixels having different colors, four vertex corners included in the opening have the same shape. Different from such display substrate, the display substrate provided by embodiments of the present disclosure is provided with the above-mentioned four different types of sub-pixels, which may help to reduce the graininess during the display of the display substrate.

In some embodiments of the present disclosure, at least one of the first pixel structures P1 includes at least four second sub-pixels SP2. In one first pixel structure P1, the pattern of the orthographic projection of the second opening 102 of at least one second sub-pixel SP2 on the base substrate 1 has a maximum size in the second direction DD2, and the pattern of the orthographic projection of the second opening 102 of at least one second sub-pixel SP2 on the base substrate 1 has a maximum size in the third direction DD3.

It should be noted that, in embodiments of the present disclosure, a predetermined angle is formed between the second direction DD2 and the third direction DD3. For example, the predetermined angle between the second direction DD2 and the third direction DD3 ranges from 0° to 150°. For example, the second direction DD2 is substantially perpendicular to the third direction DD3; or the second direction DD2 is substantially parallel to the third direction DD3.

Referring to FIG. 11A, in one first pixel structure P1, the patterns of the orthographic projections of the second openings 102 of two second sub-pixels SP2 (for example, the second sub-pixel in the second row and the second column, and the second sub-pixel in the fourth row and the fourth column) on the base substrate 1 have a maximum size in the second direction DD2, and the pattern of the orthographic projection of the second opening 102 of at least one second sub-pixel SP2 (for example, the second sub-pixel in the second row and the fourth column, and the second sub-pixel in the fourth row and the second column) on the base substrate 1 has a maximum size in the third direction DD3. The second direction DD2 is substantially perpendicular to the third direction DD3. In such embodiments, the extending directions of the major axes of the second openings 102 of two second sub-pixels SP2 are substantially perpendicular to the extending directions of the major axes of the second openings 102 of the other two second sub-pixels SP2.

Referring to FIG. 11B, in one first pixel structure P1, the patterns of the orthographic projections of the second openings 102 of two second sub-pixels SP2 (for example, the second sub-pixel in the second row and the second column, and the second sub-pixel in the fourth row and the fourth column) on the base substrate 1 have a maximum size in the second direction DD2, and the pattern of the orthographic projection of the second opening 102 of at least one second sub-pixel SP2 (for example, the second sub-pixel in the second row and the fourth column, and the second sub-pixel in the fourth row and the second column) on the base substrate 1 has a maximum size in the third direction DD3. The second direction DD2 is substantially parallel to the third direction DD3. In such embodiments, in other words, in one first pixel structure P1, the patterns of the orthographic projections of the second openings 102 of the four second sub-pixels SP2 on the base substrate 1 have the maximum size in the same direction. In such embodiments, the extending directions of the major axes of the second openings 102 of two second sub-pixels SP2 are substantially parallel to the extending directions of the major axes of the second openings 102 of the other two second sub-pixels SP2.

Referring to FIG. 11C, in one first pixel structure P1, the patterns of the orthographic projections of the second openings 102 of two second sub-pixels SP2 (for example, the second sub-pixel in the second row and the second column, and the second sub-pixel in the second row and the fourth column) on the base substrate 1 have a maximum size in the second direction DD2, and the pattern of the orthographic projection of the second opening 102 of at least one second sub-pixel SP2 (for example, the second sub-pixel in the fourth row and the second column, and the second sub-pixel in the fourth row and the fourth column) on the base substrate 1 has a maximum size in the third direction DD3. The second direction DD2 is substantially perpendicular to the third direction DD3. In such embodiments, the extending directions of the major axes of the second openings 102 of two second sub-pixels SP2 are substantially perpendicular to the extending directions of the major axes of the second openings 102 of the other two second sub-pixels SP2.

In embodiments shown in FIG. 11A to FIG. 15C, a ratio of the area of the orthographic projection of the first opening 101 on the base substrate 1 to the area of the orthographic projection of the second opening 102 on the base substrate 1 ranges from 0.5 to 2.5, for example, from 0.8 to 2, from 1 to 2, from 1.1 to 1.8, from 1.2 to 1.5, from 1.3 to 2.4, from 1.3 to 2, from 1.4 to 2.4, from 1.4 to 2, from 1.5 to 2.5, from 1.5 to 2.4, from 1.5 to 1.8, from 1.5 to 2, or about 1.5, 1.4, 1.3, 1.2, 1.1, etc.

A ratio of the area of the orthographic projection of the third opening 103 on the base substrate 1 to the area of the orthographic projection of the second opening 102 on the base substrate 1 ranges from 1 to 8, for example, from 1 to 6, from 1.1 to 6, from 1.2 to 5, from 1.5 to 4, from 2 to 4, from 2 to 3, from 1.3 to 6, from 1.4 to 6, from 1.5 to 6, from 1.5 to 3, from 2 to 5, from 2 to 2.5, or about 2.5, 2.4, 2.3, 2.2, 2.1, 2, etc.

Figure 18:
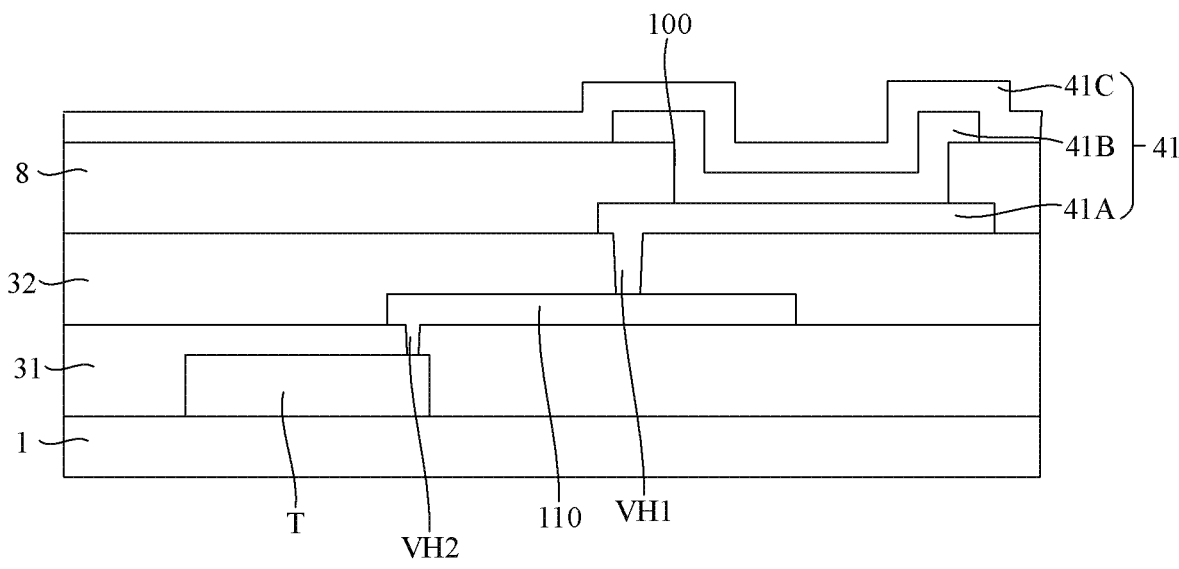
FIG. 18 shows a schematic cross-sectional view taken along line CC' in FIG. 8.

FIG. 18 shows a cross-sectional view taken along line CC' in FIG. 8. Referring to FIG. 18, the display substrate 10 includes a pixel driving circuit layer, an insulating layer 31, a first connection line 110, a planarization layer 32 and a first light emitting device 41 sequentially stacked on the base substrate 1, and the pixel driving circuit layer may include a thin film transistor T. The first light emitting device 41 includes an anode structure 41A, a cathode structure 41C, and a light emitting structure 41B between the anode structure 41A and the cathode structure 41C. The anode structure 41A of the first light emitting device 41 is electrically connected to the first connection line 110 through an anode connection hole VH1 passing through the planarization layer 32. The pixel driving circuit layer may include a semiconductor layer, a first insulating layer, a first gate layer, a second insulating layer, a second gate layer, an interlayer insulating layer, a source/drain metal layer, and so on. In some embodiments, the pixel driving circuit may include seven thin film transistors (for example, a driving transistor, a data writing transistor, a compensation transistor, a reset transistor, a light emission control transistor, etc.), and a storage capacitor. At least one thin film transistor, such as the light emission control transistor, is directly connected to the light emitting device. FIG. 18 merely schematically shows a thin film transistor T (for example, a light emission control transistor). The thin film transistor T includes at least an active layer in the semiconductor layer, a source contact portion, a drain contact portion, a gate electrode in the first gate layer, and a source electrode and a drain electrode in the source/drain metal layer. The first connection line 110 shown in FIG. 18 is electrically connected to, for example, the drain electrode of the light emission control transistor in the source/drain metal layer.

It should be noted that herein, unless otherwise specified, the "via hole" or "connection hole" is used to electrically connect components located in different conductive layers. In embodiments of the present disclosure, the "via hole" or "connection hole" may also take other alternative forms. For example, the via hole or connection hole may be replaced by a "groove" for electrically connecting components located in different conductive layers.

For example, the anode structure 41A may contain a transparent conductive material such as ITO. A specific material of the anode structure 41A is not limited in embodiments of the present disclosure. For example, the cathode structure 41C may be a structure formed on an entire surface of the display substrate 10 (for example, at least completely covering the entire display region), and the cathode structure 41C may contain lithium (Li), aluminum (Al), magnesium (Mg), silver (Ag) and other metal materials. For example, as the cathode structure 41C may be formed as a very thin layer, it has good light transmittance.

Figure 19:
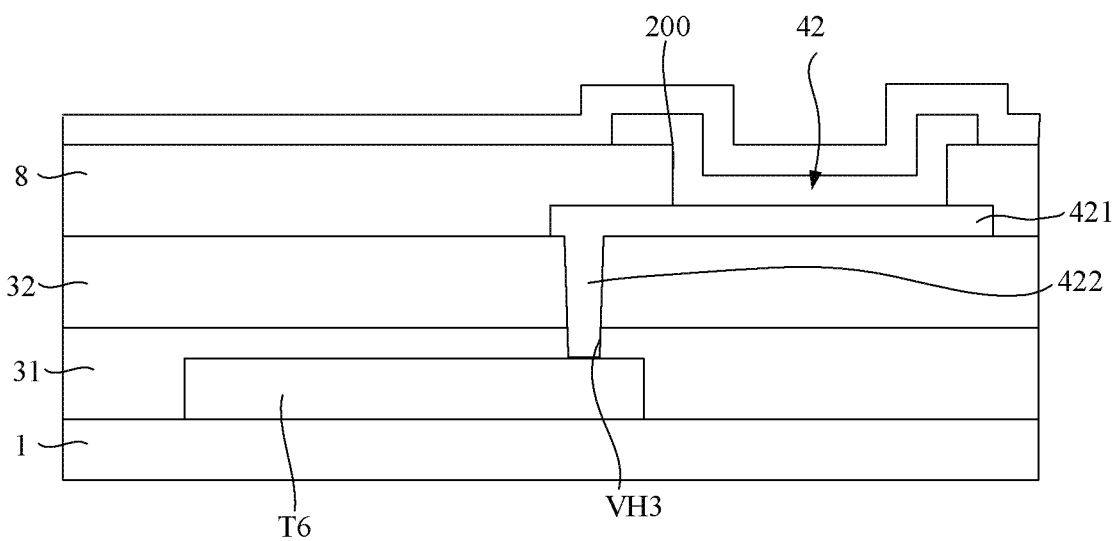
FIG. 19 shows a schematic cross-sectional view taken along line DD' of FIG. 7A.

FIG. 19 shows a schematic cross-sectional view taken along line DD' in FIG. 7A. Referring to FIG. 18 and FIG. 19 in combination, the display substrate 10 may further include a pixel defining layer 8. For example, the pixel defining layer 8 may include a plurality of openings. For example, some openings are located in the first display region AA1, and each opening exposes a part of the anode structure of the first light emitting device 41. Some openings are located in the second display region AA2, and each opening exposes a part of the anode structure of the second light emitting device 42.

The anode structure of the second light emitting device 42 includes an anode body 421 and an anode connection portion 422, and at least part of the anode connection portion 422 has a thickness different from a thickness of the anode body 421.

At a via hole VH3, the anode connection portion 422 of the second light emitting device 42 is connected to a source electrode or a drain electrode of the thin film transistor below (described in more detail below), so at least part of the anode connection portion 422 has a thickness greater than the thickness of the anode body 421.

Figure 20:
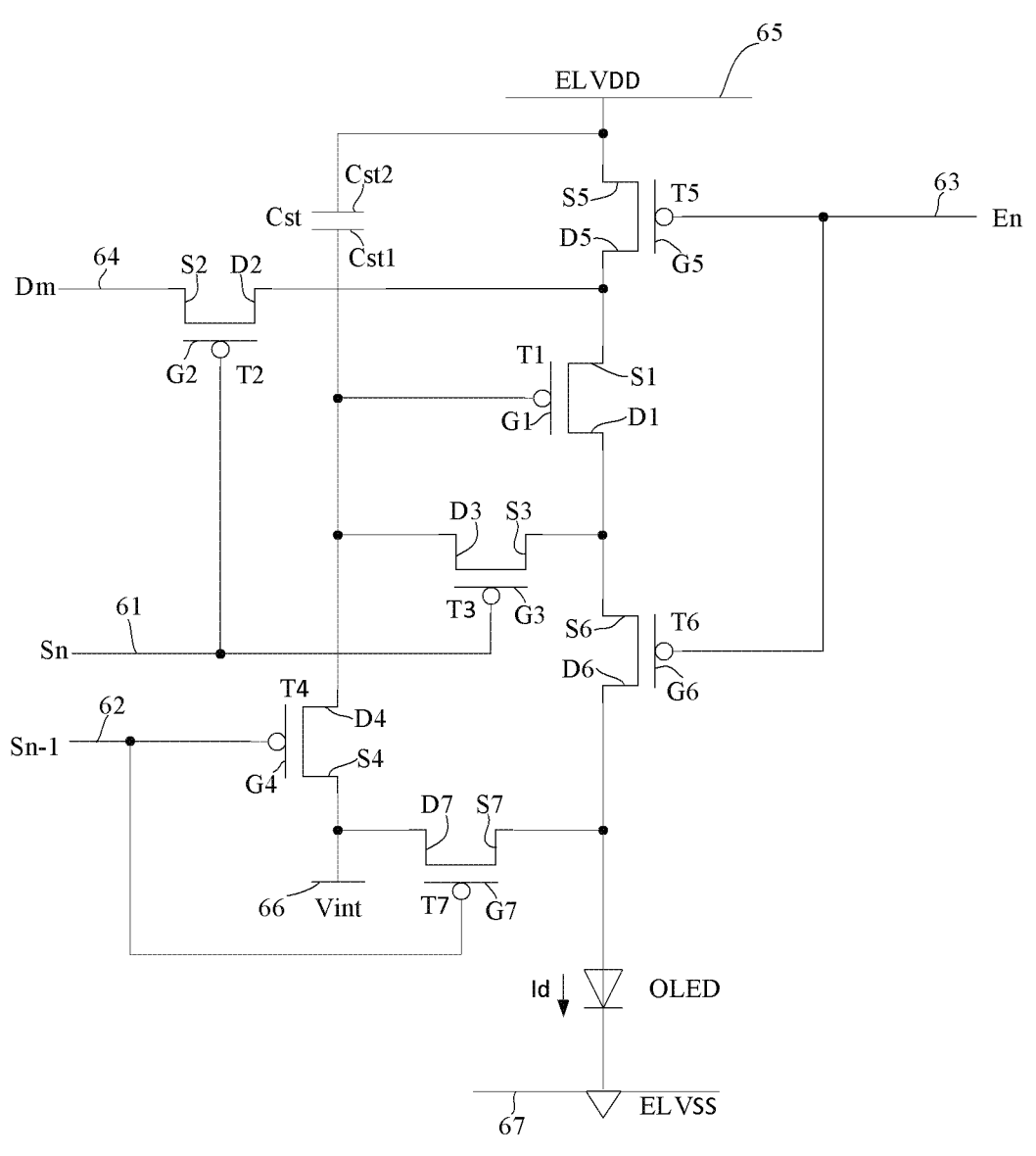
FIG. 20 shows an equivalent circuit diagram of a pixel driving circuit of a display substrate according to some exemplary embodiments of the present disclosure.

FIG. 20 shows an equivalent circuit diagram of a pixel driving circuit of a display substrate according to some exemplary embodiments of the present disclosure.

Hereinafter, a 7T1C pixel driving circuit is illustrated by way of example in describing a structure of the pixel driving circuit in detail. However, embodiments of the present disclosure are not limited to the 7T1C pixel driving circuit. In case of no conflicts, any other known pixel driving circuit structures may be applied to embodiments of the present disclosure.

As shown in FIG. 19 and FIG. 20, the pixel driving circuit may include a plurality of thin film transistors and a storage capacitor Cst. The pixel driving circuit is used to drive an organic light emitting diode (that is, OLED). The plurality of thin film transistors include a first transistor T1, a second transistor T2, a third transistor T3, a fourth transistor T4, a fifth transistor T5, a sixth transistor T6, and a seventh transistor T7. Each transistor includes a gate electrode, a source electrode, and a drain electrode.

The display substrate may further include a plurality of signal lines. For example, the plurality of signal lines include: a scan signal line 61 for transmitting a scan signal Sn, a reset signal line 62 for transmitting a reset control signal RESET (that is, a scan signal for a previous row), a light emission control line 63 for transmitting a light emission control signal En, a data line 64 for transmitting a data signal Dm, a driving voltage line 65 for transmitting a driving voltage VDD, an initialization voltage line 66 for transmitting an initialization voltage Vint, and a power line 67 for transmitting a VSS voltage.

The first transistor T1 has a gate electrode G1 electrically connected to one terminal Cst1 of the storage capacitor Cst, a source electrode S1 electrically connected to the driving voltage line 65 through the fifth transistor T5, and a drain electrode D1 electrically connected to an anode electrode of the OLED through the sixth transistor T6. The first transistor T1 may receive the data signal Dm according to a switching operation of the second transistor T2, so as to supply a driving current Id to the OLED.

The second transistor T2 has a gate electrode G2 electrically connected to the scan signal line 61, a source electrode S2 electrically connected to the data line 64, and a drain electrode D2 electrically connected to the driving voltage line 65 through the fifth transistor T5 and also electrically connected to the source electrode S1 of the first transistor T1. The second transistor T2 may be turned on according to the scan signal Sn transmitted through the scan signal line 61, so that a switching operation is performed to transmit the data signal Dm transmitted to the data line 64 to the source electrode S1 of the first transistor T1.

The third transistor T3 has a gate electrode G3 electrically connected to the scan signal line 61, a source electrode S3 electrically connected to the anode electrode of the OLED via the sixth transistor T6 and also electrically connected to the drain electrode D1 of the first transistor T1, and a drain electrode D3 electrically connected to one terminal Cst1 (that is, a first capacitor electrode) of the storage capacitor Cst, a drain electrode D4 of the fourth transistor T4 and the gate electrode G1 of the first transistor T1. The third transistor T3 may be turned on according to the scan signal Sn transmitted through the scan signal line 61 so as to connect the gate electrode G1 and the drain electrode D1 of the first transistor T1, so that a diode connection of the first transistor T1 is achieved.

The fourth transistor T4 has a gate electrode G4 electrically connected to the reset control signal line 62, a source electrode S4 electrically connected to the initialization voltage line 66, and a drain electrode D4 electrically connected to the terminal Cst1 of the storage capacitor Cst, the drain electrode D3 of the third transistor T3 and the gate electrode G1 of the first transistor T1. The fourth transistor T4 may be turned on according to the reset control signal Sn−1 transmitted through the reset control signal line 62 so as to transmit the initialization voltage Vint to the gate electrode G1 of the first transistor T1, so that an initialization operation is performed to initialize the voltage of the gate electrode G1 of the first transistor T1.

The fifth transistor T5 has a gate electrode G5 electrically connected to the light emission control line 63, a source electrode S5 electrically connected to the driving voltage line 65, and a drain electrode D5 electrically connected to the source electrode S1 of the first transistor T1 and the drain electrode D2 of the second transistor T2.

The sixth transistor T6 has a gate electrode G6 electrically connected to the light emission control line 63, a source electrode S6 electrically connected to the drain electrode D1 of the first transistor D1 and also electrically connected to the source electrode S3 of the third transistor T3, and a drain electrode D6 electrically connected to the anode electrode of the OLED. The fifth transistor T5 and the sixth transistor T6 may be turned on concurrently (for example, simultaneously) according to the light emission control signal En transmitted through the light emission control line 63 so as to transmit the driving voltage ELVDD to the OLED, thereby allowing the driving current Id to flow into the OLED.

The seventh transistor T7 includes a gate electrode G7 connected to the reset control signal line 62, a source electrode S7 connected to the drain electrode D6 of the sixth transistor T6 and the anode electrode of the OLED, and a drain electrode D7 connected to the initialization voltage line 66. The seventh transistor T7 may transmit the reset control signal Sn−1 from the reset control signal line 62 to the gate electrode G7.

The other terminal Cst2 of the storage capacitor Cst is electrically connected to the driving voltage line 65, and the cathode electrode of the OLED is electrically connected to the power line 67 to receive the common voltage ELVSS. Accordingly, the OLED may receive the driving current Id from the first transistor T1 to emit light, so as to display an image.

It should be noted that in FIG. 20, each of the thin film transistors T1, T2, T3, T4, T5, T6 and T7 is a p-channel field effect transistor. However, embodiments of the present disclosure are not limited thereto. At least some of the thin film transistors T1, T2, T3, T4, T5, T6 and T7 may be n-channel field effect transistors.

During operation, in an initialization stage, the reset control signal Sn−1 being at a low level is supplied through the reset control signal line 62. Subsequently, the initialization thin film transistor T4 is turned on based on the reset control signal Sn−1 being at a low level, and the initialization voltage Vint from the initialization voltage line 66 is transmitted to the gate electrode G1 of the driving thin film transistor T1 through the initialization thin film transistor T4. Then, the driving thin film transistor T1 is initialized due to the initialization voltage Vint.

In a data programming stage, the scan signal Sn being at a low level is supplied through the scan signal line 61. Subsequently, the switch thin film transistor T2 and the compensation thin film transistor T3 are turned on based on the scan signal Sn being at a low level. Then, the driving thin film transistor T1 is placed in a diode connection state by the turned-on compensation thin film transistor T3 and is biased in a forward direction.

Subsequently, a compensation voltage Dm+Vth (for example, Vth is a negative value) obtained by subtracting a threshold voltage Vth of the driving thin film transistor T1 from the data signal Dm supplied via the data line 64 is applied to the gate electrode G1 of the driving thin film transistor T1. Then, the driving voltage ELVDD and the compensation voltage Dm+Vth are applied to both terminals of the storage capacitor Cst, so that an electric charge corresponding to a voltage difference between the corresponding terminals is stored in the storage capacitor Cst.

In a light emission stage, the light emission control signal En from the light emission control line 63 changes from being at a high level to being at a low level. Subsequently, in the light emission stage, the first light emission control thin film transistor T5 and the second light emission control thin film transistor T6 are turned on based on the light emission control signal En being at a low level.

Subsequently, a driving current is generated based on a difference between the voltage of the gate electrode G1 of the driving thin film transistor T1 and the driving voltage ELVDD. The driving current Id corresponding to the difference between the driving current and a bypass current is supplied to the OLED through the second light emission control thin film transistor T6.

In the light emission stage, based on a current-voltage relationship of the driving thin film transistor T1, a gate-source voltage of the driving thin film transistor T1 is maintained at (Dm+Vth)−ELVDD due to the storage capacitor Cst. The driving current Id is proportional to (Dm−ELVDD)$^2$. Therefore, the driving current Id may not be affected by a variation of the threshold voltage Vth of the driving thin film transistor T1.

For example, in various embodiments of the present disclosure, the base substrate 1 may be a glass substrate, a quartz substrate, a metal substrate, or a resin substrate, etc., and may be a rigid substrate or a flexible substrate, which is not limited in embodiments of the present disclosure.

Referring back to FIG. 1 and FIG. 2, at least some embodiments of the present disclosure further provide a display device. The display device may include the display substrate as described above and a sensor 7 (for example, a camera).

As described above, the display region of the display substrate includes a first display region AA1 and a second display region AA2, and a pixel density of the first display region AA1 is less than that of the second display region AA2. The sensor 7 is located on a side of the base substrate 1 away from the pixel array, and a photosensitive surface of the sensor 7 faces the display substrate. An orthographic projection of the sensor 7 on the base substrate 1 overlaps with the orthographic projection of the first display region AA1 on the base substrate 1, for example, the orthographic projection of the sensor 7 on the base substrate 1 falls with the orthographic projection of the first display region AA1 on the base substrate 1. In this way, the light passing through the first display region AA1 may be used for imaging, thereby achieving the function of under-screen camera.

The sensor 7 may have a structure known in the art, for example, including a complementary metal oxide semiconductor (CMOS) image sensor or a charge coupled device (CCD) image sensor. The sensor 7 may be electrically connected to an image processor. In addition to the image sensor, the imaging module including the image sensor may further include, for example, a lens assembly, in order to achieve a better imaging effect. The lens assembly and the image sensor may be arranged sequentially along an optical axis of the lens assembly in a direction perpendicular to the base substrate 1.

The display device may include any apparatus or product with a display function. For example, the display device may be a smart phone, a mobile phone, an e-book reader, a personal computer (PC), a laptop PC, a netbook PC, a personal digital assistant (PDA), a portable multimedia player (PMP), a digital audio player, a mobile medical apparatus, a camera, a wearable device (such as a head-mounted device, electronic clothing, electronic bracelet, electronic necklace, electronic accessory, electronic tattoo or smart watch), a television, etc.

Although some embodiments of the general technical concept of the present disclosure have been illustrated and described, it should be understood by those ordinary skilled in the art that these embodiments may be changed without departing from the principle and spirit of the general technical concept of the present disclosure. The scope of the present disclosure is defined by the claims and their equivalents.

What is claimed is:

1. A display substrate comprising a first display region, wherein the display substrate comprises:

a base substrate;

a plurality of first pixel structures arranged on the base substrate in an array in a first arrangement direction and a second arrangement direction and located in the first display region, wherein at least one of the first pixel structures comprises at least one first sub-pixel and at least one second sub-pixel; and a pixel defining layer on the base substrate, wherein the pixel defining layer comprises a plurality of first openings and a plurality of second openings in the first display region, wherein the first sub-pixel comprises the first opening, and the second sub-pixel comprises the second opening, and wherein in the first pixel structure, a pattern of an orthographic projection of the first opening of the at least one first sub-pixel on the base substrate has a maximum size in the first direction, a pattern of an orthographic projection of the second opening of the at least one second sub-pixel on the base substrate has a maximum size in the second direction, an angle is formed between the second direction and the first direction, and a ratio of the maximum size of the first opening to the maximum size of the second opening ranges from 0.2 to 2, wherein the pattern of the orthographic projection of the first opening on the base substrate is symmetrical with respect to a first axis of symmetry extending in the first direction, and the pattern of the orthographic projection of the first opening on the base substrate is asymmetrical with respect to a straight line extending in the second direction; and/or wherein the pattern of the orthographic projection of the second opening on the base substrate is symmetrical with respect to a second axis of symmetry extending in the second direction, and the pattern of the orthographic projection of the second opening on the base substrate is asymmetrical with respect to a straight line extending in the first direction.

2. The display substrate according to claim 1, wherein the angle between the second direction and the first direction ranges from 0° to 160°.

3. The display substrate according to claim 2, wherein the angle between the second direction and the first direction is less than 90°.

4. The display substrate according to claim 1, wherein at least one of the first pixel structures further comprises at least one third sub-pixel, the pixel defining layer comprises a plurality of third openings in the first display region, and the third sub-pixel comprises the third opening, and wherein a pattern of an orthographic projection of the third opening on the base substrate has a first size in the first direction and a second size in the second direction, and a ratio of the second size of the third opening to the first size of the third opening ranges from 0.8 to 1.2.

5. The display substrate according to claim 1, wherein at least one of the first pixel structures comprises at least two second sub-pixels, and wherein in the first pixel structure, an angle is formed between directions in which the patterns of the orthographic projections of the second openings of the at least two second sub-pixels on the base substrate have the maximum size.

6. The display substrate according to claim 4, wherein at least two of the pattern of the orthographic projection of the first opening on the base substrate, the pattern of the orthographic projection of the second opening on the base substrate, and the pattern of the orthographic projection of the third opening on the base substrate have different shapes from each other, and wherein at least part of each of the pattern of the orthographic projection of the first opening on the base substrate, the pattern of the orthographic projection of the second opening on the base substrate and the pattern of the orthographic projection of the third opening on the base substrate comprises a curved side.

7. The display substrate according to claim 6, wherein the pattern of the orthographic projection of the third opening on the base substrate is symmetrical with respect to a third axis of symmetry extending in the first direction, and the pattern of the orthographic projection of the third opening on the base substrate is symmetrical with respect to a fourth axis of symmetry extending in the second direction.

8. The display substrate according to claim 4, wherein a ratio of a pitch of the first openings in the first arrangement direction to a pitch of the second openings in the first arrangement direction ranges from 0.8 to 1.2; and/or wherein a ratio of the pitch of the second openings in the first arrangement direction to a pitch of the third openings in the first arrangement direction ranges from 0.8 to 1.2;

and/or wherein a ratio of the pitch of the third openings in the first arrangement direction to the pitch of the first openings in the first arrangement direction ranges from 0.8 to 1.2.

9. The display substrate according to claim 1, wherein in the first pixel structure, a line connecting centers of the patterns of the orthographic projections of the first openings of two first sub-pixels on the base substrate does not pass through a center of the pattern of the orthographical projection of the second opening of the second sub-pixel on the base substrate.

10. The display substrate according to claim 4, wherein in the first pixel structure, a line connecting centers of the patterns of the orthographic projections of the third openings of two third sub-pixels on the base substrate passes through a center of the pattern of the orthographic projection of the second opening of the second sub-pixel on the base substrate.

11. The display substrate according to claim 4, wherein in the first pixel structure, two third sub-pixels are arranged symmetrically with respect to an axis of symmetry extending in one of the second direction and a third direction perpendicular to the second direction, and two first sub-pixels are arranged asymmetrically with respect to a straight line extending in the other of the second direction and the third direction.

12. The display substrate according to claim 1, wherein the first opening of at least one first sub-pixel comprises a body portion and an auxiliary portion, an orthographic projection of the body portion of the first opening on the base substrate is a circle, and an orthographic projection of the auxiliary portion of the first opening on the base substrate protrudes in a protruding direction relative to the circle, and wherein in the first pixel structure, the auxiliary portions of the first openings of two first sub-pixels have a same protruding direction or different protruding directions.

13. The display substrate according to claim 1, wherein in the first pixel structure, protruding directions of auxiliary portions of the first openings of two first sub-pixels are parallel to the second arrangement direction and opposite to each other; or wherein in the first pixel structure, protruding directions of auxiliary portions of the first openings of two first sub-pixels are parallel to the first arrangement direction and opposite to each other; or wherein in the plurality of first pixel structures, protruding directions of auxiliary portions of the first openings of at least two first sub-pixel are parallel to the second arrangement direction and opposite to each other, and protruding directions of auxiliary portions of the first openings of other first sub-pixels are parallel to the first arrangement direction and opposite to each other.

14. The display substrate according to claim 1, wherein at least one of the first pixel structures comprises at least four second sub-pixels, and wherein in the first pixel structure, the pattern of the orthographic projection of the second opening of at least one second sub-pixel on the base substrate has a maximum size in the second direction, the pattern of the orthographic projection of the second opening of at least one second sub-pixel on the base substrate has a maximum size in a third direction, and a predetermined angle is formed between the second direction and the third direction, and wherein the predetermined angle between the second direction and the third direction ranges from 0° to 150°, and wherein the second direction is substantially perpendicular to the third direction; or wherein the second direction is substantially parallel to the third direction.

15. The display substrate according to claim 4, wherein a ratio of an area of the orthographic projection of the first opening on the base substrate to an area of the orthographic projection of the second opening on the base substrate ranges from 0.5 to 2.5; and/or wherein a ratio of an area of the orthographic projection of the third opening on the base substrate to the area of the orthographic projection of the second opening on the base substrate ranges from 1 to 8.

16. The display substrate according to claim 4, wherein at least one of the orthographic projection of the first opening on the base substrate, the orthographic projection of the second opening on the base substrate, or the orthographic projection of the third opening on the base substrate has an elliptical shape.

17. The display substrate according to claim 4, wherein the display substrate further comprises:

an anode structure on a side of the pixel defining layer facing the base substrate;

a pixel driving circuit layer between the base substrate and the anode structure; and an anode connection hole, wherein the anode structure is connected to the pixel driving circuit through the anode connection hole, wherein an orthographic projection of an auxiliary portion of the first opening on the base substrate protrudes, relative to a circle of a body portion of the first opening, toward an orthographic projection of the anode connection hole of the first sub-pixel where the first opening is located on the base substrate; and/or an orthographic projection of an auxiliary portion of the third opening on the base substrate protrudes, relative to a circle of a body portion of the third opening, toward an orthographic projection of the anode connection hole of the third sub-pixel where the third opening is located on the base substrate, and wherein the auxiliary portion of the first opening has a sharp corner portion on a side facing the anode connection hole of the first sub-pixel; and/or the auxiliary portion of the third opening has a sharp corner portion on a side facing the anode connection hole of the third sub-pixel, wherein the auxiliary portion of the first opening has a rounded corner portion on the side facing the anode connection hole of the first sub-pixel; and/or the auxiliary portion of the third opening has a rounded corner portion on the side facing the anode connection hole of the third sub-pixel.

18. The display substrate according to claim 1, wherein the pattern of the orthographic projection of the second opening on the base substrate has an elliptical shape, wherein the orthographic projection of the first opening of at least one first sub-pixel on the base substrate has a shape of a droplet; and/or wherein an orthographic projection of a third opening of at least one third sub-pixel on the base substrate has a circular shape.

19. A display device, comprising the display substrate according to claim 1.

\* \* \* \* \*